US005652797A

United States Patent [19]

Okamura et al.

[11] Patent Number: 5,652,797

[45] Date of Patent: Jul. 29, 1997

[54] SOUND EFFECT IMPARTING APPARATUS

[75] Inventors: Kazuhisa Okamura; Yoshio Fujita, both of Hamamatsu, Japan

[73] Assignee: Yamaha Corporation, Japan

[21] Appl. No.: 584,987

[22] Filed: Jan. 11, 1996

Related U.S. Application Data

[63] Continuation of Ser. No. 146,733, Oct. 29, 1993, abandoned.

[30] Foreign Application Priority Data

Oct. 30, 1992 [JP] Japan .................................... 4-293548
Mar. 17, 1993 [JP] Japan .................................... 5-057504

[51] Int. Cl.$^6$ ........................................ H03G 3/00

[52] U.S. Cl. ........................ 381/61; 381/119; 381/118; 84/660; 84/625; 84/631

[58] Field of Search ........................ 84/630, 631, 660, 84/625; 381/63, 61, 62, 118, 119

[56] References Cited

U.S. PATENT DOCUMENTS

| | | | |
|---|---|---|---|
| 4,472,993 | 9/1984 | Futamase et al. . | |
| 4,479,240 | 10/1984 | McKinley, Jr. | 381/118 |
| 4,628,789 | 12/1986 | Fujimori | 84/631 |
| 4,864,625 | 9/1989 | Hanzawa et all | 381/61 |
| 4,998,281 | 3/1991 | Sakata | 381/63 |
| 5,195,140 | 3/1993 | Kudo et al. | 84/630 |

OTHER PUBLICATIONS

TX81Z FM Tone Generator, Owner's Manual, Yamaha, 1987.

*Primary Examiner*—Forester W. Isen
*Attorney, Agent, or Firm*—Graham & James LLP

[57] ABSTRACT

A sound effect imparting apparatus, which is employed in the electronic musical instrument in order to impart a variety of sound effects to the musical tones in a variety of manners, is mainly configured by an effect program memory, a sound-effect operation portion, a mixer and a mixing information supply portion. The effect program memory stores a plurality of effect programs, respectively corresponding to a plurality of sound effects to be imparted to musical tone data, in advance. The sound-effect operation portion performs arithmetic operations and/or logical operations on its input data in accordance with the effect programs read from the effect program memory, thus imparting desired sound effects to the musical tone data. The mixer receives the musical tone data, given from an external device, and operation data, outputted from the sound-effect operation portion, representing the musical tone data to which the sound effects have been imparted. Thus, the mixer selects some of the data inputted thereto in accordance with mixing information given from the mixing information supply portion, so that the selected data are mixed together; and consequently, mixed data are supplied to the sound-effect operation portion. On the basis of the mixed data outputted from the mixer, the musical tones to which several kinds of sound effects are imparted can be produced.

22 Claims, 36 Drawing Sheets

27

| ADDRESS | |
|---|---|
| 0 | INPUT DATA ID1 |
| 1 | INPUT DATA ID2 |
| 2 | INPUT DATA ID3 |
| 3 | INPUT DATA ID4 |
| 4 | EXTERNAL INPUT DATA GD1 |
| 5 | EXTERNAL INPUT DATA GD2 |
| 6 | OUTPUT DATA E1OL FROM EF1L |
| 7 | OUTPUT DATA E1OR FROM EF1R |
| 8 | OUTPUT DATA E2OL FROM EF2L |
| 9 | OUTPUT DATA E2OR FROM EF2R |
| 10 | OUTPUT DATA E3O FROM EF3 |
| 11 | OUTPUT DATA E4O FROM EF4 |
| 12 | OUTPUT DATA E5OL FROM EF5L |
| 13 | OUTPUT DATA E5OR FROM EF5R |

FIG.7

63

| ADDRESS | | OUTPUT OF DECODER 61 |
|---|---|---|
| 00HEX | MIXED DATA EM1 FOR EF1 | "000" FOR EF1 |
| 01HEX | OPERATION DATA EX1L FROM EF1L | |
| 02HEX | OPERATION DATA EX1R FROM EF1R | |
| 10HEX | MIXED DATA EM2 FOR EF2 | "001" FOR EF2 |
| 11HEX | OPERATION DATA EX2L FROM EF2L | |
| 12HEX | OPERATION DATA EX2R FROM EF2R | |
| 20HEX | MIXED DATA EM3 FOR EF3 | "010" FOR EF3 |
| 21HEX | OPERATION DATA EX3 FROM EF3 | |
| 30HEX | MIXED DATA EM4 FOR EF4 | "011" FOR EF4 |
| 31HEX | OPERATION DATA EX4 FROM EF4 | |
| 40HEX | MIXED DATA EM5L FOR EF5L | "100" FOR EF5 |
| 41HEX | MIXED DATA EM5R FOR EF5R | |
| 42HEX | OPERATION DATA EX5L FROM EF5L | |
| 43HEX | OPERATION DATA EX5R FROM EF5R | |

FIG.14

| | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| C-SEL | a | | | | | | | | | | | | | | | | | | | |
| C-RAM | C1-W | C1-R | | | | | | | | | | | | | | | | | | |
| T-RAM | | | | | | | | | | | T1-W | | | | | | | T2-W | | |
| I-SEL | | | b | | a | a | | | | | b | a | a | | | | | b | a | a |
| I-RAM | | | I1-W | | I2-W | I3-W | I1-R | I2-R | I2-R | I3-R | I1-W | I2-W | I3-W | I1-R | I2-R | I2-R | I3-R | I1-W | I2-W | I3-W |
| X-SEL | | a | | | | | | c | c | c | | | | | c | c | c | | | |
| YRT | | | | | | | | | | | | | | | | | | | | |
| YRI | | | | | | | H | | | | | | | H | | | | | | |
| Y-SEL | | c | | | | | | b | c | b | | | | | b | c | b | | | |
| B-SEL | | d | | | | | | d | a | a | | | | | d | a | a | | | |
| SUBTRACTER | | | | | | | | | H | | | | | | | H | | | | |
| SHIFT | | | | | | | | | | | | | | | | | | | | |
| DW | | | H | | | | | | | | | | | | | | | | | |
| IX | | | H | | | | | | | | H | | | | | | | H | | |
| GATE | | | | | H | H | | | | | | H | H | | | | | | H | H |
| DELAY RAM | | | | w | R | R | | | | | | R | R | | | | | | R | R |
| ADDRESS REGISTER | | | | 0 | 0 | 1 | | | | | | 0 | 1 | | | | | | 0 | 1 |
| COEFFICIENT REGISTER | | | | | | | | | | | | | | | | | | | | |
| LFO | | | | LF01 | | | | | | | | LF02 | | | | | | | LF03 | |

FIG.36

| | 40 | 41 | 42 | 43 | 44 | 45 | 46 | 47 | 48 | 49 | 50 | 51 | 52 | 53 | 54 | 55 |
|---|---|---|---|---|---|---|---|---|---|---|---|---|---|---|---|---|
| C-SEL | | | | | | | | | | b | | | b | | | |
| C-RAM | | | | | | | | C1-R | | C2-W | C1-R | | C3-W | | C2-R | C3-R |
| T-RAM | | | T3-R | T3-W | T1-R | T3-R | T3-W | | T2-R | | | T3-R | | | | |
| I-SEL | b | | | | | | | | | | | | | | | |
| I-RAM | I1-W | I1-R | | | | | | | | | | | | | | |
| X-SEL | | | b | | | d | | a | b | | a | b | | | | |
| YRT | | | | | H | | | | | | | | | | | |
| YRI | | H | | | | | | | | | | | | | | |
| Y-SEL | | | b | | | a | | e | e | | e | e | | | | |
| B-SEL | | | d | | | b | | d | a | | d | a | | | | |
| SUBTRACTER | | | | | | | | | | | | | | | | |
| SHIFT | | | | | | | | | | | | | | | | |
| DW | | | | | | | | | | | | | | | | |
| IX | | | | | | | | | | | | | | | | |
| GATE | | | | | | | | | | | | | | | | |
| DELAY RAM | | | | | | | | | | | | | | | | |
| ADDRESS REGISTER | | | | | | | | | | | | | | | | |
| COEFFICIENT REGISTER | | | | | | | | K1 | K2 | | K3 | K4 | | | | |
| LFO | LF06 | | | | | | | LF07 | | | | | | | | |

FIG.38

SOUND EFFECT IMPARTING APPARATUS

This is a continuation of application Ser. No. 08/146,733 filed on Oct. 29, 1993 now abandoned.

BACKGROUND OF THE INVENTION

1. Field of the Invention

The present invention relates to a sound effect imparting apparatus which processes audio signals, representing musical tone signals, so as to impart several kinds of sound effects such as a chorus effect and a reverberation effect to musical tones.

2. Prior Art

Accompanied with a recent development in a technology for the digital signal processing, several kinds of digital signal processors (i.e., DSPs) are manufactured. Some of them can effect several kinds of arithmetic operational processes to digital signals inputted thereto by executing a plurality of control programs. Besides, accompanied with a recent progress in manufacturing processes of semiconductor devices, it becomes easy to obtain DSP-type LSI circuits.

In an advanced electronic musical instrument recently developed, one sound effect imparting circuitry which imparts a single sound effect to the musical tone is configured in form of one block (called as an effecter block). A combination of those effecter blocks (i.e., sound effect imparting apparatus) can be equipped in a DSP-type LSI circuit.

The above-mentioned sound effect imparting apparatus has been disclosed in Japanese Patent Publication No.1-19593, which is filed by the present applicant. According to this apparatus, algorithmic structures corresponding to a digital filter and a reverberation sound forming circuit are configured in one sampling period of digital musical tone data in a time-sharing manner under instructions of control programs to be executed. Then, a modulation effect and a reverberation effect are respectively imparted to the musical tone data in a time-sharing manner. The papers of the above publication describe that different sound effects can be imparted to the same musical tone data in parallel.

The above-mentioned sound effect imparting apparatus can respond to five cases: a first case where the modulation effect is only imparted to the musical tone data; a second case where the reverberation effect is only imparted to the musical tone data; a third case where the reverberation effect is imparted to the musical tone data after imparting the modulation effect; a fourth case where the modulation effect is imparted to the musical tone data after imparting the reverberation effect; and a fifth case where the modulation effect and reverberation effect are respectively imparted to the musical tone data in parallel. The above apparatus, however, can merely perform five kinds of sound-effect imparting operations. In short, the conventional apparatus has a drawback in that the number of the sound effects to be imparted to the musical tone data is restricted.

SUMMARY OF THE INVENTION

Accordingly, it is an object of the present invention to provide a sound effect imparting apparatus which is capable of imparting a variety of sound effects to the musical tones in a variety of sound-effect imparting manners.

According to a fundamental configuration of the present invention, the sound effect imparting apparatus comprises a program storing portion, a plurality of program executing portions, a plurality of mixing portions and a mixing control portion. The program storing portion is capable of storing a plurality of programs each corresponding to each of sound effects to be imparted to the musical tone data. Each of the program executing portions executes the programs, read from the program storing portion, sequentially so as to impart a desired sound effect to the musical tone data supplied thereto. Each of the mixing portions is provided to be connected with each of the program executing portions. Hence, each of the mixing portions mixes external musical tone data, given from an external device, with a designated one of plural musical tone data which are respectively outputted from the program executing portions. The mixing control portion designates the musical tone data which is subjected to mixing operation in each of the mixing portions. Thus, the musical tones to which desired sound effects are imparted can be produced on the basis of output data of the mixing portions.

BRIEF DESCRIPTION OF THE DRAWINGS

Further objects and advantages of the present invention will be apparent from the following description, reference being had to the accompanying drawings wherein the preferred embodiment of the present invention is clearly shown.

In the drawings:

FIG. 7 is a storage map of a mixer RAM shown in FIG. 6;

FIG. 14 is a storage map of a temporary RAM 63;

FIGS. 36 to 38 are drawings showing the contents of operational steps of effect programs which are executed when imparting the chorus effect to the musical tone data by the chorus-effect imparting portion shown in FIG. 34.

DESCRIPTION OF THE PREFERRED EMBODIMENT

Figure 1:
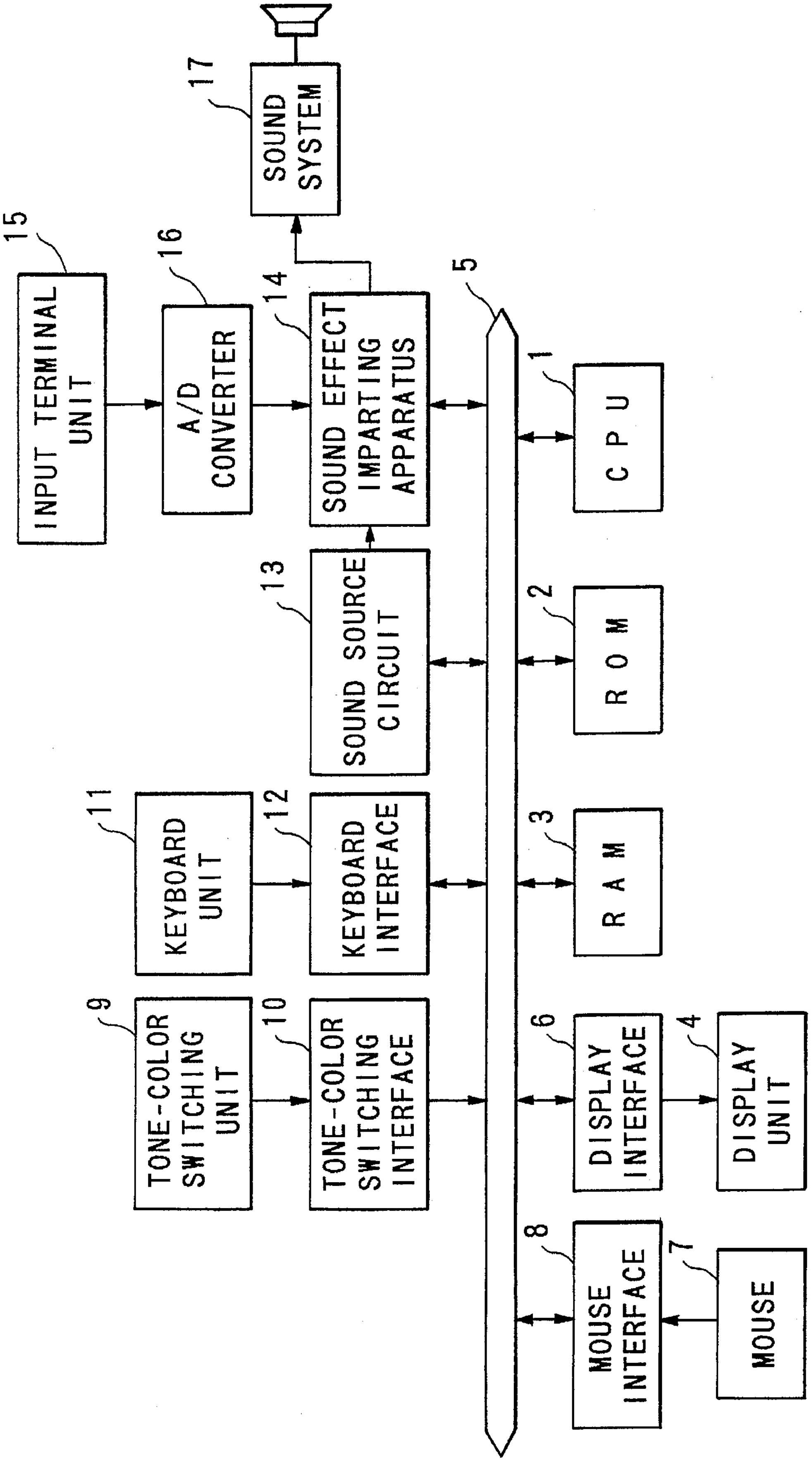
FIG. 1 is a block diagram showing a whole configuration of an electronic musical instrument employing a sound effect imparting apparatus according to an embodiment of the present invention.

Now, an embodiment of the present invention will be described by referring to the drawings.

[A] Whole Configuration of Electronic Musical Instrument

FIG. 1 is a block diagram showing a whole configuration of an electronic musical instrument which employs a sound effect imparting apparatus according to an embodiment of the present invention. In FIG. 1, a numeral 1 denotes a central processing unit (i.e., CPU) which controls several kinds of circuit portions in the electronic musical instrument. A numeral 2 denotes a read-only memory (i.e., ROM) which stores several kinds of control programs to be loaded by the CPU 1 and also stores several kinds of data to be used for the control programs. A numeral 3 denotes a random-access memory (i.e., RAM) in which a tone-color-data storing area, a working buffer and the like are provided. This RAM 3 is coupled with a battery backup system, so that even if the power is down, the data can be retained. Incidentally, detailed configurations of the ROM 2 and RAM 3 will be described later.

A display unit (or visual display terminal) 4 employing a liquid-crystal display screen is capable of visually displaying the contents of data given from the CPU 1 by means of a CPU bus 5 and a display interface 6. Further, a numeral 7 denotes a mouse which is moved around by a performer (i.e., a person who performs the electronic musical instrument) on a flat table by a desired distance in a desired direction. So, the mouse 7 produces mouse data corresponding to the moving distance and moving direction thereof. The mouse data is transferred to the CPU 1 through the CPU bus 5 and a mouse interface 8. Thus, a cursor displayed on the display screen of the display unit 4 is moved in response to the moving distance and moving direction of the mouse 7.

Meanwhile, a numeral 9 denotes a tone-color switching unit providing a plurality of switches corresponding to the tone colors of the piano, guitar, organ and the like. By operating the tone-color switching unit 9, it is possible to select desired one of the tone colors. Data representing an operating state of each of the switches is transferred to the CPU 1 by means of a tone-color switching interface 10 and the CPU bus 5.

In addition, a keyboard unit 11 consists of a plurality of keys. This keyboard unit 11 provides a mechanism which detects key-depression/release events occurred in each of the keys so as to detect a key-depressing velocity and a key-releasing velocity with respect to each of the keys. The keyboard unit 11 produces signals representing the key-depression/release events, key-depressing velocity and key-releasing velocity. A keyboard interface 12 creates key information, representing the tone pitch, key-depressing velocity and the like, on the basis of the signals given from the keyboard unit 11. The key information is transferred to the CPU 1 through the CPU bus 5.

Further, a numeral 13 denotes a sound source circuit providing a plurality of tone-generation channels. This sound source circuit 13 is controlled by musical tone parameters, representing tone color data and the like, which are supplied from the CPU 1 through the CPU bus 5. The sound source circuit 13 is designed such that it is capable of simultaneously producing a plurality of musical tone data responsive to the musical tone parameters. If one musical note is sounded by use of the piano sound and guitar sound, two tone-generation channels independently output two musical tone data respectively representing the piano sound and guitar sound.

Moreover, a numeral 14 denotes a sound effect imparting apparatus which is designed to impart a plurality of sound effects such as the chorus effect and reverberation effect to a plurality of musical tone data outputted from the sound source circuit 13. An input terminal unit 15 provides two input terminals, through which several kinds of musical tone signals given from an external device (not shown) can be entered. An analog-to-digital converter (i.e., A/D converter) 16 converts the analog external-musical-tone signals, given from the external device through the input terminal unit 15, into digital external-musical-tone data, which is supplied to the sound effect imparting apparatus 14. Furthermore, a sound system 17 contains a digital-to-analog converter (i.e., D/A converter) which converts the digital musical tone data, outputted from the sound effect imparting apparatus 14, into the analog musical tone signals. In the sound system 17, a predetermined filtering process and a noise eliminating process are carried out on the analog musical tone signals; and then, the musical tone signals are amplified. Thus, speakers connected with the sound system 17 will produce the corresponding musical tones.

[B] Detailed Configuration of Sound Effect Imparting Apparatus

Figure 2:
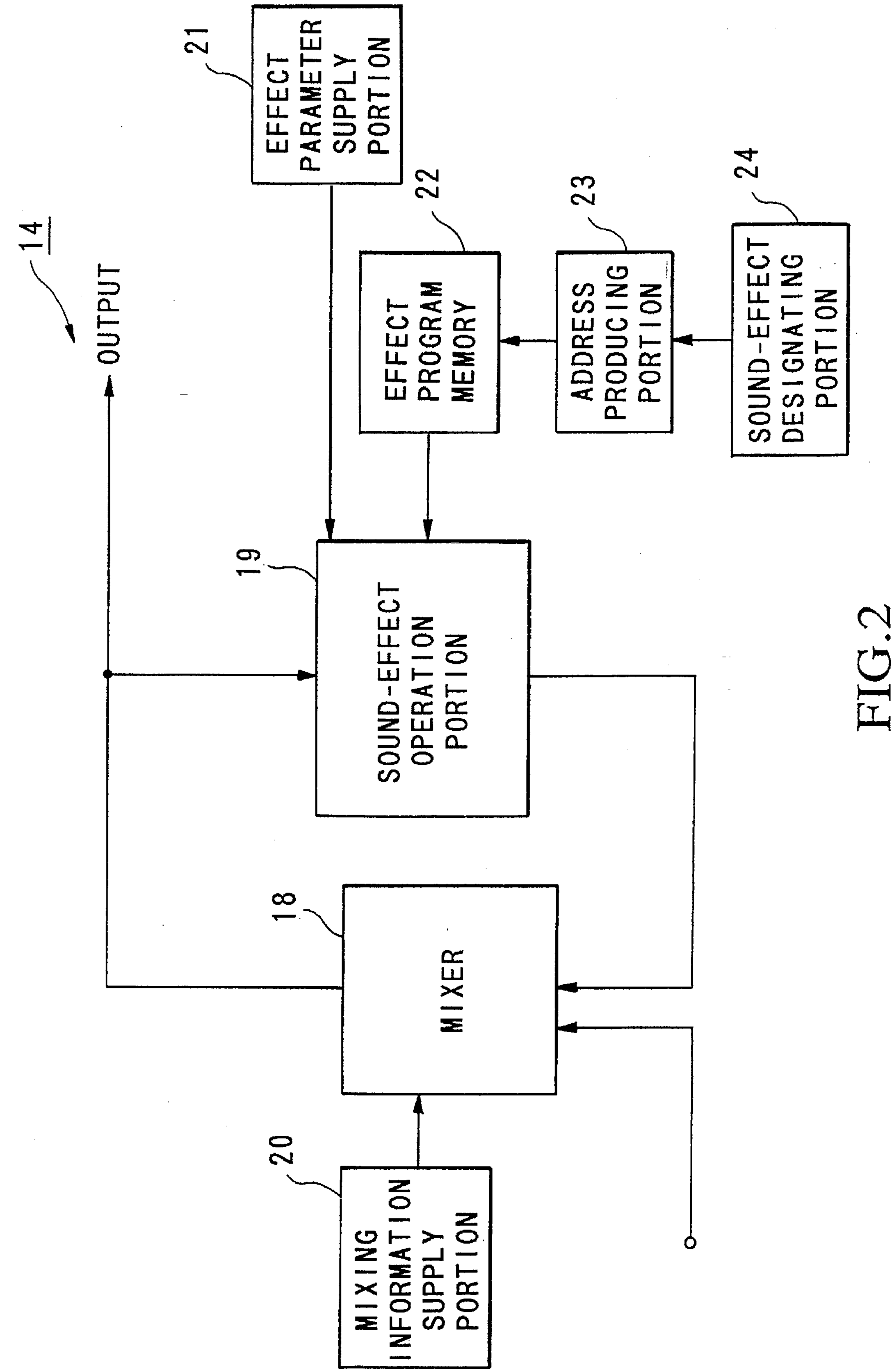
FIG. 2 is a block diagram showing a conceptual configuration of the sound effect imparting apparatus.

FIG. 2 is a block diagram showing a conceptual configuration of the sound effect imparting apparatus 14. In FIG. 2, a mixer 18 receives musical tone data outputted from the sound source circuit 13 shown in FIG. 1 as well as the external musical tone data, outputted from the A/D converter 16, and a plurality of musical tone data outputted from an sound-effect operation portion 19. Herein, the musical tone data is given as serial data, whereas the maximum number of the musical tone data outputted from the sound source circuit 13 is set at four, and the number of the external musical tone data (given as the serial data) outputted from the A/D converter 16 is set at two. The sound-effect operation portion 19 performs arithmetic operations (and/or logical operations) on the input data thereof so as to output the musical tone data to which several kinds of sound effects have been imparted. On the basis of mixing information given from a mixing information supply portion 20, the mixer 18 selects some of the musical tone data supplied thereto so as to mix them together.

Meanwhile, the sound-effect operation portion 19 receives five kinds of effect programs from a effect program memory 22, wherein those effect programs are carried out to impart the sound effects to the musical tone data. Within one sampling period (hereinafter, referred to as 1 DAC cycle) of the D/A converter equipped in the sound system 17 shown in FIG. 1, the sound-effect operation portion 19 performs the effect programs in a time-division manner on a plurality of musical tone data mixed together by the mixer 18 on the basis of effect parameters given from an effect parameter supply portion 21. The above-mentioned five kinds of sound effects are respectively denoted by numerals EF1 to EF5.

As for each of the sound effects EF1, EF2 and EF5, the sound-effect operation portion 19 produces one wet musical tone data with respect to each of left and right channels. Herein, the term "wet musical tone data" represents the musical tone data to which the sound effect has been already imparted. Now, operation data EX1L for a left-channel sound effect EF1L and operation data EX1R for a right-channel sound effect EF1R are produced with respect to the sound effect EF1; operation data EX2L for a left-channel sound effect EF2L and operation data EX2R for a right-channel sound effect EF2R are produced with respect to the sound effect EF2; operation data EX5L for a left-channel sound effect EF5L and operation data EX5R for a right-channel sound effect EF5R are produced with respect to the sound effect EF5. On the other hand, only one channel is preset for each of the sound effects EF3 and EF4, so that the sound-effect operation portion 19 produces one wet musical tone data corresponding to one channel with respect to each of the sound effects EF3 and EF4. More specifically, operation data EX3 is produced with respect to the sound effect EF3, while operation data EX4 is produced with respect to the sound effect EF4. Thus, the sound-effect operation portion 19 produces and outputs a plurality of wet musical tone data corresponding to eight channels in total.

The effect program memory 22 stores the effect programs corresponding to a plurality of sound effects. According to manual operations applied to the mouse 7, a sound-effect designating portion 24 can designate five sound effects within a plurality of sound effects which have been preset in the effect program memory 22. In the effect program memory 22, a certain head address is related to each of the effect programs. So, the sound-effect designating portion 24 can detect the head address in connection with each effect program to be designated. Therefore, five head addresses corresponding to five sound effects designated by the sound-effect designating portion 24 are transferred to an address producing portion 23. On the basis of each head address given from the sound-effect designating portion 24, the address producing portion 23 produces the read addresses for the effect program corresponding to each sound effect designated. Such operation for producing the read addresses is repeatedly carried out with respect to each of five head addresses within 1 DAC cycle. Thus, during 1 DAC cycle, it is possible to produce all of the read addresses for five effect programs corresponding to five sound effects designated. In accordance with the read addresses given from the address producing portion 23, five effect programs are sequentially read from the effect program memory 22; and then, those effect programs are supplied to the sound-effect operation portion 19.

Figure 3:
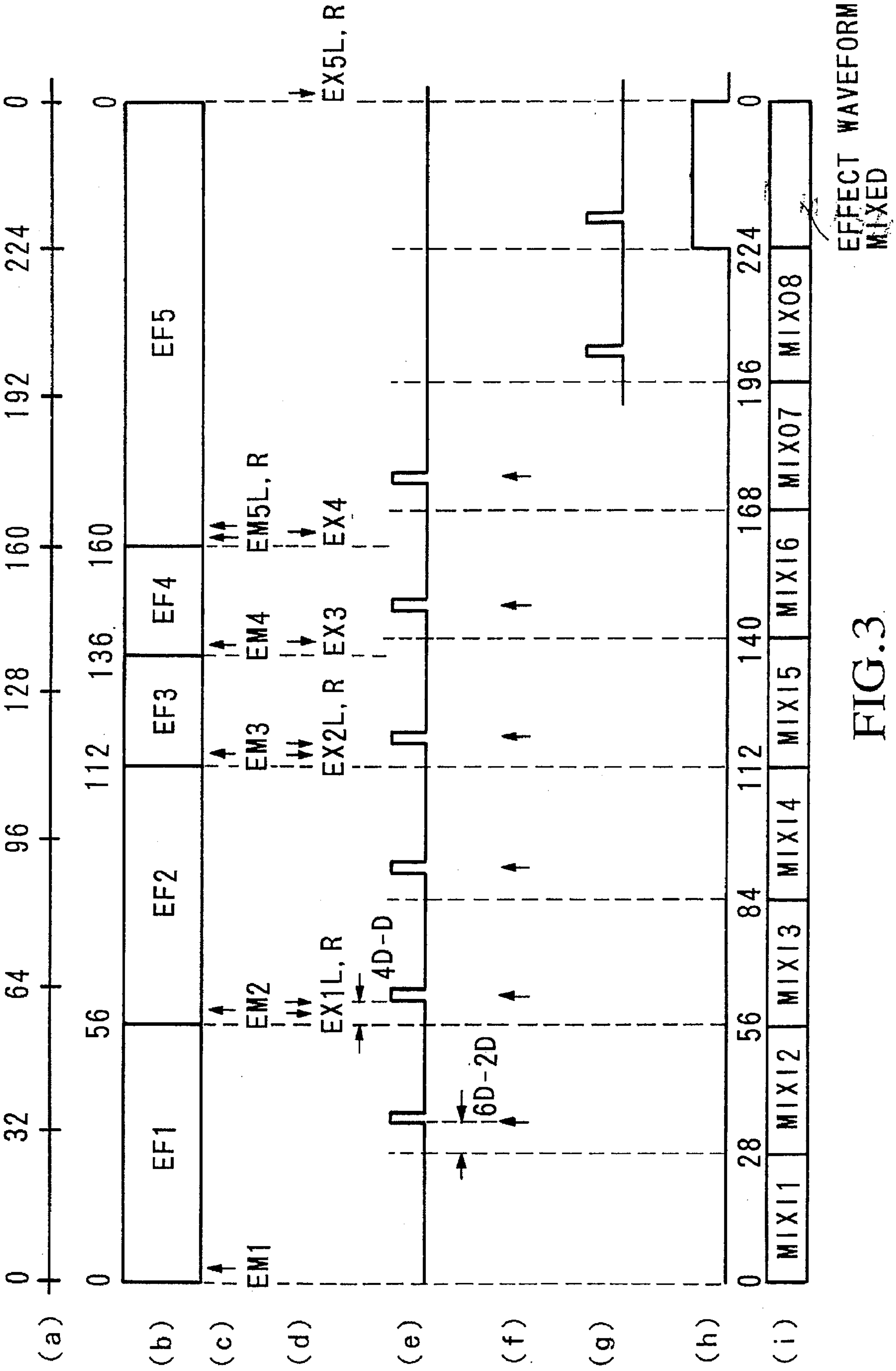
FIG. 3 is a timing chart showing an example of operation timings of the sound effect imparting apparatus.

An example of operating timings of the sound-effect operation portion 19 is shown by FIG. 3(*b*). More precisely, each of those operating timings designates an input timing at which the effect program is inputted into the sound-effect operation portion 19. The details of those timings will be described later. In the present embodiment, 1 DAC cycle is constructed by two hundreds and fifty six operational steps, which are respectively designated by operational step 0 to operational step 255. Incidentally, one operational step corresponds to an operation time in which one control code of the effect program is processed. As described before, the sound-effect operation portion 19 is designed to deal with five sound effects EF1 to EF5 within 1 DAC cycle. Incidentally, the size of the program corresponding to each of five sound effects EF1 to EF5 is fixed. More specifically, fifty six operational steps are carried out with respect to the sound effect EF1; fifty six operational steps are carried out with respect to the sound effect EF2; twenty four operational steps are carried out with respect to the sound effect EF3; twenty four operational steps are carried out with respect to the sound effect EF4; and ninety six operational steps are carried out with respect to the sound effect EF5.

As shown in FIG. 3(*b*), a data processing for the sound effect EF1 is carried out by operational step 0 to operational step 55; a data processing for the sound effect EF2 is carried out by operational step 56 to operational step 111; a data processing for the sound effect EF3 is carried out by operational step 112 to operational step 135; a data processing for the sound effect EF4 is carried out by operational step 136 to operational step 159; and a data processing for the sound effect EF5 is carried out by operational step 160 to operational step 255. All of the above-mentioned data processings for the sound effects EF1 to EF5 are carried out within 1 DAC cycle.

Each of FIGS. 4 and 5(A) to 5(F) shows a conceptual configuration representing a relationship between the mixer 18 and the sound-effect operation portion 19 which are activated in a time-division manner in connection with each of the sound effects EF1 to EF5. In the block diagrams shown by those drawings, numerals MIXI1 to MIXI6 denote pre-stage mixing portions, each of which is provided in a pre-stage of corresponding one of sound effect portions EF1 to EF5; numerals MIXO1 to MIXO5 denote post-stage mixing portions, each of which is provided in a post-stage of each of sound effect portions EF1 to EF5; numerals MIXO7 and MIXO8 denote output-stage mixing portions which are respectively provided in output stages for the left and right channels. Among them, each of the pre-stage mixing portions MIXI2 to MIXI6 and the output-stage mixing portions MIXO7 and MIXO8 has the same configuration of the pre-stage mixing portion MIXI1; hence, the detailed illustration thereof is omitted in FIGS. 5(A) to 5(F).

Figure 4:
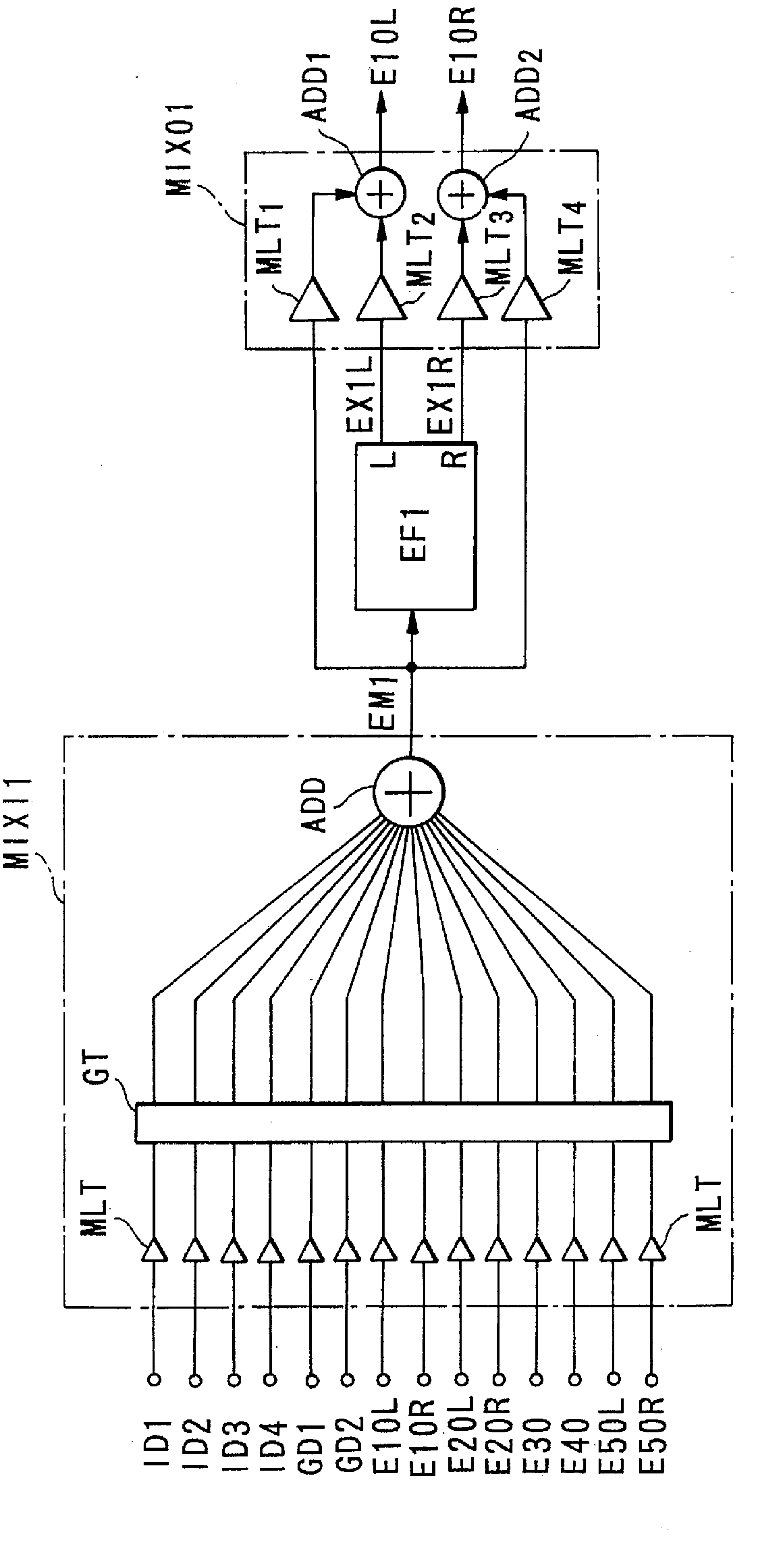
FIG. 4 is a block diagram showing an algorithmic configuration for a sound effect EF1 which is computed by a main portion of the sound effect imparting apparatus in a time-division manner.

In the pre-stage mixing portion MIXI1 shown in FIG. 4, numerals MLT, MLT, . . . denote multipliers each having a multiplication coefficient which is controlled by multiplication coefficient data given from the mixing information supply portion shown in FIG. 2. Each multiplier MLT multiplies each musical tone data by each multiplication coefficient. A numeral GT denotes a gate circuit in which fourteen switches are arranged in parallel. Each switch is controlled to be turned on or off in response to a switching signal corresponding to switch-on/off control data given from the mixing information supply portion 20. A numeral ADD denotes an adder which receives a plurality of musical tone data through the gate circuit GT so as to add them together.

In the post-stage mixing portion MIXO1 shown in FIG. 4, numerals MLT1 to MLT4 denote multipliers each having a multiplication coefficient which is controlled by the multiplication coefficient data given from the mixing information supply portion 20. In FIG. 4, "EM1" denotes mixed data, outputted from the pre-stage mixing portion MIXI1, which is supplied to the sound effect portion EF1. In the sound effect portion EF1, a predetermined sound effect is applied to the mixed data EM1, resulting that the aforementioned operation data EX1L and EX1R are produced in connection with the left-channel sound effect EF1L and right-channel sound effect EF1R. The multiplier MLT1 multiplies the mixed data EM1 by its multiplication coefficient; the multiplier MLT2 multiplies the operation data EX1L by its multiplication coefficient; the multiplier MLT3 multiplies the operation data EX1R by its multiplication coefficient; and the multiplier MLT4 multiplies the mixed data EM1 by its multiplication coefficient. Then, an adder ADD1 adds results of the multiplications respectively performed by the multipliers MLT1 and MLT2, while an adder ADD2 adds results of the multiplications respectively performed by the multipliers MLT3 and MLT4. Incidentally, the other post-stage mixing portions MIXO2 to MIXO5 shown in FIGS. 5(A) to 5(D) are configured as similar to the post-stage mixing portion MIXO1 shown in FIG. 4. The multipliers and one or two adders contained in each of the post-stage mixing portions MIXO2 to MIXO5 are designed to function as similar to the multipliers MLT1 to MLT4 and adders ADD1 and ADD2 provided in the post-stage mixing portion MIXO1. Numerals or symbols used for each of the block circuits shown in FIGS. 5(A) to 5(D) are determined as similar to those of the block circuit shown in FIG. 4.

As described before, maximum four series of musical tone data (i.e., maximum four series of serial data) are outputted from the sound source circuit 13, while two series of external musical tone data (i.e., two series of serial data) are outputted from the A/D converter 16. The above-mentioned serial data are supplied to a serial-to-parallel converter 25 (see FIG. 6), in which those serial data are converted into parallel data. More specifically, the four series of musical tone data are respectively converted into data ID1 to ID4, while the two series of external musical tone data are respectively converted into data GD1 and GD2. Those data ID1 to ID4 and GD1, GD2 are inputted Into the pre-stage mixing portion MIXI1. In addition, other musical tone data E1OL, E1OR, E2OL, E2OR, E3O, E4O, E5OL and E5OR are also inputted into the pre-stage mixing portion MIXI1. The other pre-stage mixing portions MIXI2 to MIXI6 and the output-stage mixing portions MIXO7 and MIXO8 are designed as similar to the above-mentioned pre-stage mixing portion MIXI1.

As shown in FIGS. 4 and 5(A) to 5(D), the data E1OL and E1OR are outputted from the post-stage mixing portion MIXO1; the data E2OL and E2OR are outputted from the post-stage mixing portion MIXO2; the data E3O is outputted from the post-stage mixing portion MIXO3; the data E4O is outputted from the post-stage mixing portion MIXO4; further, the data E5OL and E5OR are outputted from the post-stage mixing portion MIXO5. The pre-stage mixing portions MIXI1 to MIXI6 respectively output the mixed data (i.e., dry musical tone data) EM1, EM2, EM3, EM4, EM5L and EM5R. Herein, the term "dry musical tone data" represents the musical tone data to which the sound effect is not imparted. The mixed data EM1 outputted from MIXI1 is provided for the sound effect EF1; the mixed data EM2 outputted from MIXI2 is provided for the sound effect EF2; the mixed data EM3 outputted from MIXI3 is provided for the sound effect EF3; the mixed data EM4 outputted from MIXI4 is provided for the sound effect EF4; the mixed data EM5L outputted from MIXI5 is provided for the left-channel sound effect EF5L; and the mixed data EM5R outputted from MIXI6 is provided for the right-channel sound effect EF5R. Further, the sound effect portions EF1 to EF5 respectively output the operation data (i.e., wet musical tone data) EX1L, EX1R, EX2L, EX2R, EX3, EX4, EX5L and EX5R. Herein, the operation data EX1L and EX1R are respectively outputted from left-channel and right-channel terminals EF1L and EF1R of the sound effect portion EF1; the operation data EX2L and EX2R are respectively outputted from left-channel and right-channel terminals EF2L and EF2R of the sound effect portion EF2; the operation data EX3 is outputted from the sound effect portion EF3; the operation data EX4 is outputted from the sound effect portion EF4; further, the operation data EX5L and EX5R are respectively outputted from left-channel and right-channel terminals EF5L and EF5R of the sound effect portion EF5. The above-mentioned dry musical tone data and wet musical tone data are well mixed together to achieve a predetermined effect balance in each of the post-stage mixing portions MIXO1 to MIXO5.

The musical tone data E1OL corresponds to the left-channel sound effect EF1L, while the musical tone data E1OR corresponds to the right-channel sound effect EF1R. Similarly, the musical tone data E2OL corresponds to the left-channel sound effect EF2L, while the musical tone data E2OR corresponds to the right-channel sound effect EF2R; the musical tone data E3O corresponds to the sound effect EF3; the musical tone data E4O corresponds to the sound effect EF4; the musical tone data E5OL corresponds to the left-channel sound effect EF5L, while the musical tone data E5OR corresponds to the right-channel sound effect EF5R.

Thus, the aforementioned data ID1 to ID4 and GD1, GD2 are mixed together by a predetermined mixing rate so as to produce the mixed musical tone data. Then, several kinds of sound effects are combined together, so that combined sound effects are imparted to the mixed musical tone data. Incidentally, a mixing ratio by which the data ID1 to ID4, GD1, GD2, E1OL, E1OR, E2OL, E2OR, E3O, E4O, E5OL and E5OR to be supplied to the pre-stage mixing portion can be controlled by use of the mouse 7. In addition, a selection of the sound effects EF1 to EF5 and a combination of them can be also controlled by use of the mouse 7. Incidentally, the CPU 1 works responsive to the operation of the mouse 7. The details of the operation of the mouse 7 and the operation of the CPU 1 will be described later.

Figure 6:
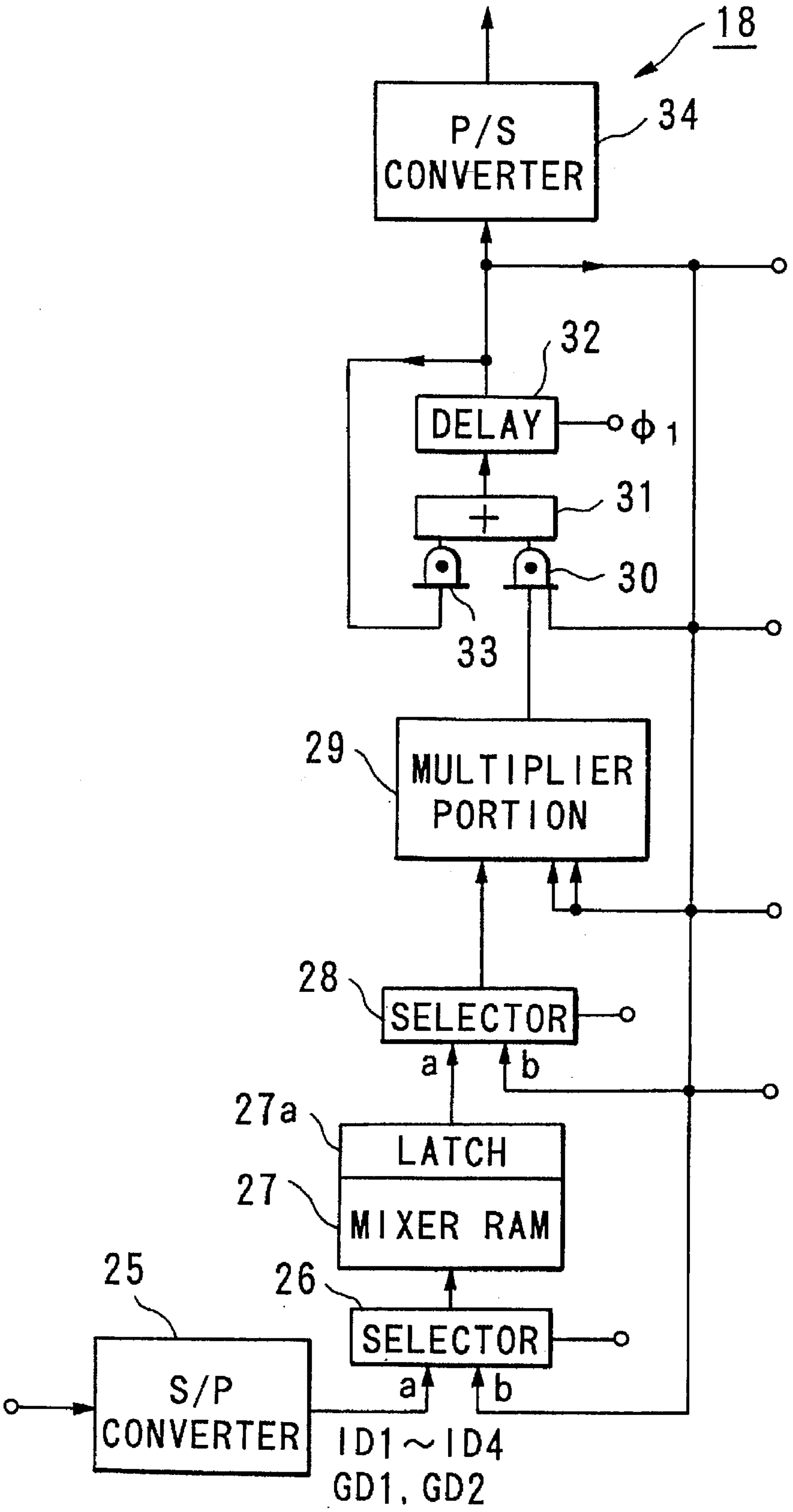
FIG. 6 is a block diagram showing a detailed configuration of a mixer shown in FIG. 2.

FIG. 6 is a block diagram showing a detailed configuration of the mixer 18. This mixer 18 is designed to act upon an operation clock $\phi_1$ which corresponds to a clock $\phi_O$, having a predetermined period (i.e., 1/256 of 1 DAC cycle), generated from a clock generating circuit (not shown). The above operation clock $\phi_1$ is obtained by dividing a frequency of the clock $\phi_O$ by "2". The reason why the period of the operation clock is set longer is to reduce a size of circuitry of a multiplier portion 29. In FIG. 6, the serial-to-parallel converter 25 receives the maximum four series of serial musical tone data, outputted from the sound source circuit 13, as well as the two series of serial external-musical-tone data, outputted from the A/D converter 16, so as to convert them into parallel data, i.e., ID1 to ID4 and GD1, GD2.

A selector 26 has two input terminals "a" and "b". The above-mentioned data ID1 to ID4 and GD1, GD2 are supplied to the input terminal "a" of the selector 26, while the aforementioned musical tone data E1OL, E1OR, E2OL, E2OR, E3O, E4O, E5OL and E5OR to be outputted from a delay circuit 32 are also supplied to the input terminal "b" of the selector 26. In response to the control codes outputted from the effect program memory 22, the selector 26 selects one of the input terminals "a" and "b" so as to eventually output a set of the data applied to the selected terminal.

A numeral 27 denotes a mixer random-access memory (i.e., mixer RAM) which can store fourteen kinds of data, i.e., ID1 to ID4, GD1, GD2, E1OL, E1OR, E2OL, E2OR, E3O, E4O, E5OL and E5OR at address 0 to address 13 respectively as shown in FIG. 7. A numeral **27*a* denotes a latch portion attached with the mixer RAM 27. This latch portion 27*a* is provided to adjust output timings for the data to be read from the mixer RAM 27. In order to do so, the latch portion 27*a* temporarily retains three data which are firstly outputted from the mixer RAM 27**.

A selector 28 provides two input terminals "a" and "b". Herein, the data which are outputted from the mixer RAM 27 through the latch portion **27*a* are supplied to the input terminal "a" of the selector 28, while the musical tone data outputted from the aforementioned sound-effect operation portion 19 is supplied to the input terminal "b" of the selector 28. In accordance with the control codes outputted from the effect program memory 22, one of the input terminals of the selector 28 is selected so that the data applied to the selected terminal is eventually outputted to the multiplier portion 29. The multiplier portion 29 has one or more multiplication coefficients, which are controlled by the multiplication coefficient data outputted from the mixing information supply portion 20 (see FIG. 2). Thus, the multiplier portion 29 multiplies the data outputted from the selector 28 by the multiplication coefficients. This multiplier portion 29 corresponds to the aforementioned multipliers MLT and MLT1 to MLT4 shown in FIGS. 4 and 5(A) to 5(D). The multiplier portion 29 is designed to perform one multiplication in the duration corresponding to two clocks $\phi_1$. As a result, the data supplied to the multiplier portion 29** is eventually delayed by a certain delay time corresponding to four clocks $\phi_O$ in total.

A numeral 30 denotes a gate having two input terminal, in which a first input terminal receives the switch signal corresponding to the switch data outputted from the mixing information supply portion 20, while a second input terminal receives output data of the multiplier portion 29. When the switch signal is set at "1", the gate 30 is turned on so that the output data of the multiplier portion 29 is outputted therefrom. The gate 30 corresponds to the aforementioned gate circuit GT shown in FIG. 4. Moreover, an adder 31, the delay circuit 32 and a gate 33 are assembled together to form an accumulator. Herein, an output of the adder 31 is supplied to the delay circuit 32 in which it is delayed by a certain delay time corresponding to one clock $\phi_1$; and then, a delayed output of the delay circuit is supplied to the gate 33. The accumulator consisting of the above-mentioned circuit elements 31, 32 and 33 corresponds to the aforementioned adders ADD, ADD1 and ADD2 shown in FIGS. 4 and 5(A) to 5(D). A numeral 34 denotes a parallel-to-serial converter which converts parallel musical tone data, outputted from the delay circuit 32, into serial musical tone data. The serial musical tone data are sequentially supplied to the aforementioned sound system 17 shown in FIG. 1.

Figure 8:
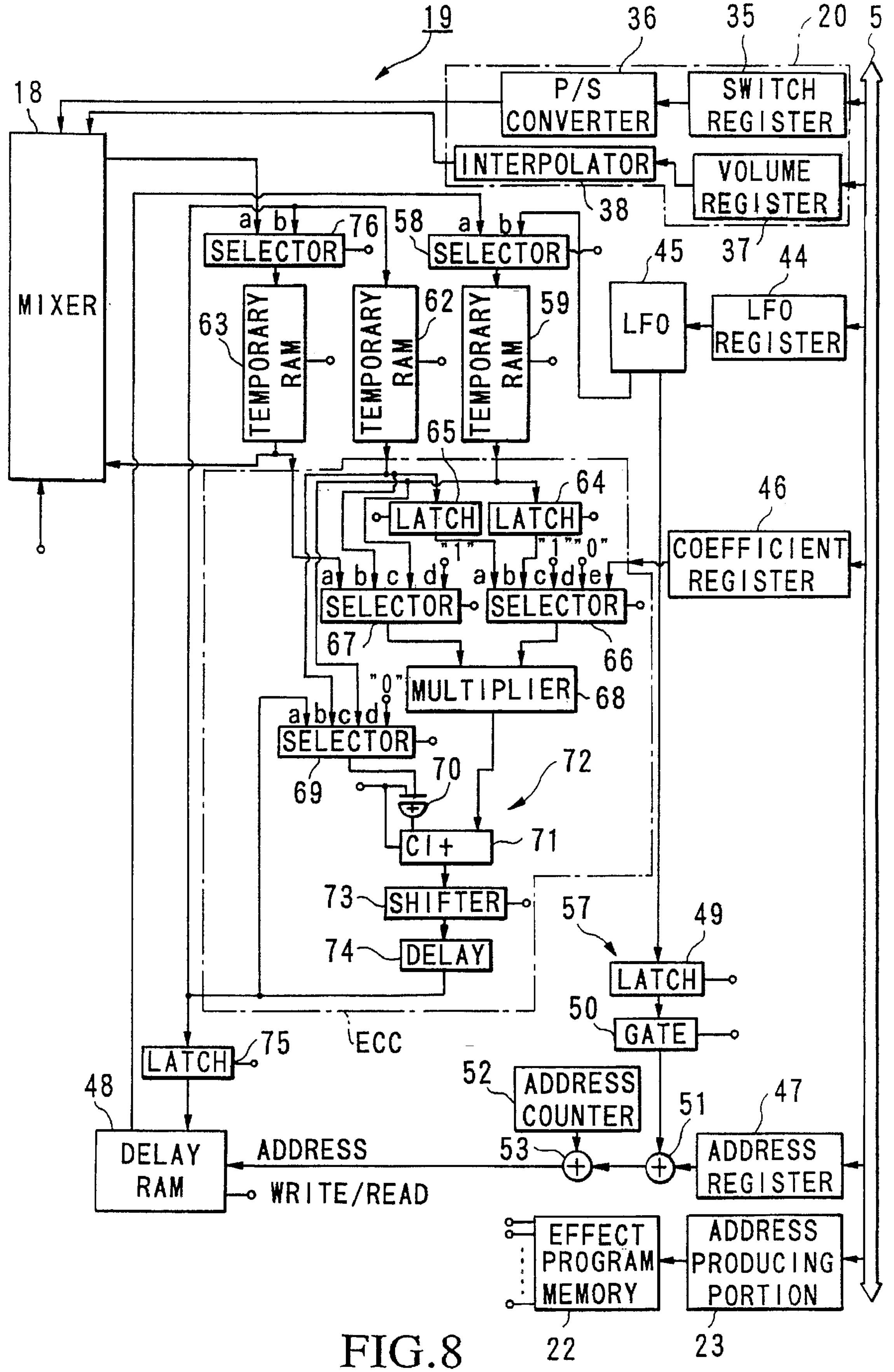
FIG. 8 is a block diagram showing a detailed configuration of a sound-effect operation portion shown in FIG. 2 and its peripheral circuits.

FIG. 8 is a block diagram showing a detailed configuration of the sound-effect operation portion 19 and its peripheral circuits. In FIG. 8, parts identical to those shown in FIGS. 1 and 2 are designated by the same numerals; hence, the detailed description thereof will be omitted. The aforementioned mixing information supply portion 20 consists of a switch register 35, a parallel-to-serial converter 36, a volume register 37 and an interpolator 38. Herein, the switch register 35 stores the switch data controlling the on/off states of the gate 30 (see FIG. 6) provided In the mixer 18, so that the switch register 35 outputs parallel switch data. The parallel switch data are supplied to the parallel-to-serial converter 36 in which they are converted into serial switch signals. The volume register 17 stores the multiplication coefficient data controlling the multiplication coefficients used in the multiplier portion 29 (see FIG. 6) provided in the mixer 18. The interpolator 38 interpolates the multiplication coefficient data outputted from the volume register 37.

The switch register 35 provides eight addresses, i.e., address 0 to address 7 which respectively correspond to the pre-stage mixing portions MIXI1 to MIXI6 and the output-stage mixing portions MIXO7 and MIXO8. At each address, there is provided a storage area which is capable of storing fourteen switch data used for each mixing portion. The CPU 1 designates fourteen switch data, so that the fourteen switch data are transferred to the switch register 35 in which they are stored at the address designated by the CPU 1. In accordance with output timings which are determined responsive to a progress of operational steps to be executed in the sound-effect operation portion 19, the fourteen switch data are sequentially read out from each address of the switch register 35.

The volume register 37 provides a plurality of storage areas each storing each of the multiplication coefficient data which are used in the pre-stage mixing portions MIXI1 to MIXI6, the post-stage mixing portions MIXO1 to MIXO5 and the output-stage mixing portions MIXO7, MIXO8 respectively. Therefore, one multiplication coefficient data transferred from the CPU 1 is stored in each storage area, designated by the CPU 1, in the volume register 37. In accordance with output timings which are determined responsive to a progress of operational steps to be executed in the sound-effect operation portion 19, plural multiplication coefficient data are respectively read out from plural storage areas provided in the volume register 37.

Meanwhile, a low-frequency-oscillator register (hereinafter, simply referred to as a LFO register) 44 stores low-frequency oscillation data (simply referred to as LFO data) which is transferred from the CPU 1. The LFO data is used to control a low-frequency oscillator (i.e., LFO) 45 which controls modulation (representing the vibrato, tremolo and the like) to be applied to the musical tone data. More specifically, the LFO data contains several pieces of information representing a waveform of low-frequency oscillator, a frequency of low-frequency oscillator, a depth of low-frequency oscillation, a phase, a kind of modulation (representing a pitch modulation or an amplitude modulation) and the like. A coefficient register 46 stores data representing the effect balance among the sound effects EF1 to EF5, and it also stores coefficient data representing filter coefficients which are used to impart the sound effects, such as the reverberation effect, to the musical tone data, for example. Those data are transferred from the CPU 1 to the coefficient register 46.

An address register 47 stores delay address data which 1s transferred from the CPU 1. In this case, a delay RAM 43 is externally connected with the sound-effect operation portion 19 in order to control a delay amount applied to the musical tone data when imparting the sound effect (e.g., reverberation effect) to the musical tone data. This delay RAM 48 delays the musical tone data inputted thereto by a predetermined delay amount. The above-mentioned delay address data corresponds to an address of the delay RAM 48.

The above-mentioned LFO register 44, coefficient register 46 and address register 47 are assembled together to form the aforementioned effect parameter supply portion 21 shown in FIG. 2.

Figure 9A:
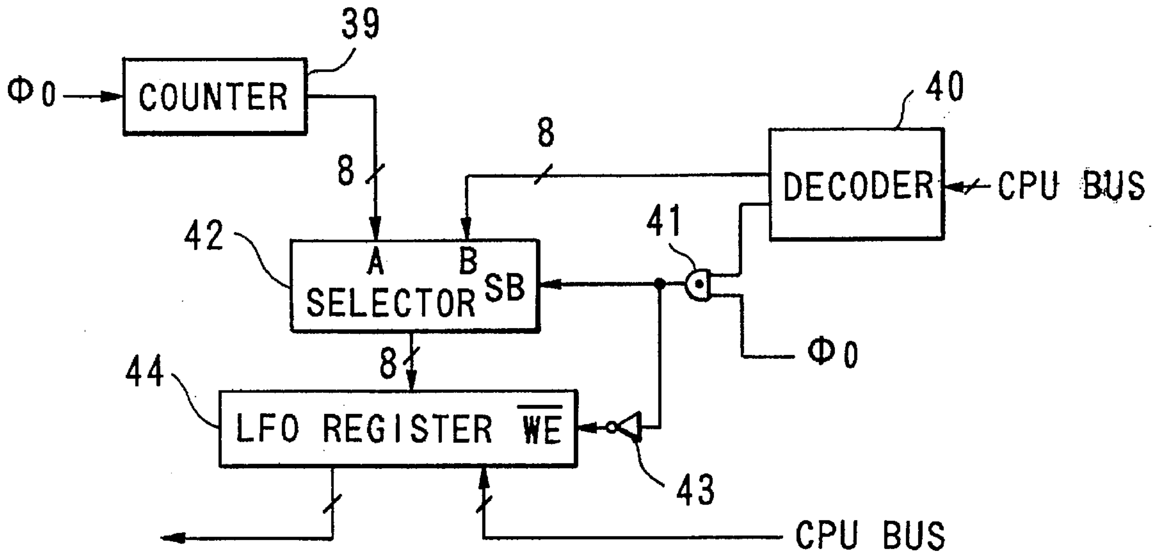
FIG. 9(A) is a block diagram showing peripheral circuits of a LFO register shown in FIG. 8.
Figure 9B:
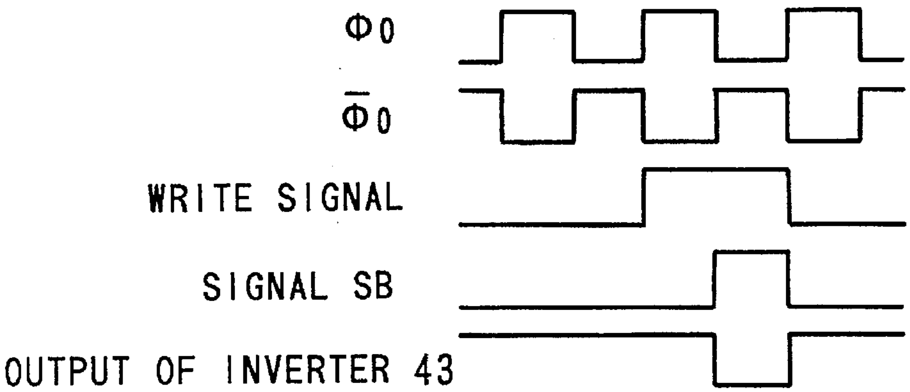
FIG. 9(B) is a timing chart showing operation timings of the circuitry shown in FIG. 9(A)

FIG. 9(A) is a block diagram showing the LFO register 44 and its peripheral circuits in detail, while FIG. 9(B) is a timing chart. In FIG. 9(A), a numeral 89 denotes a counter which counts a number of clocks $\phi_0$, each having a predetermined period, which are generated from a clock generating circuit (not shown). More specifically, the counter 39 counts the number of clocks $\phi_0$ within 1 DAC cycle, so that its count value is changed from "0" to "255". Meanwhile, the CPU 1 supplies certain data, having a predetermined bit length, to a decoder 40 through the CPU bus 5. That data corresponds to the address of the LFO register 44 which is designated by the CPU 1. The decoder 40 decodes the data so as to produce 8-bit address data and a write signal.

A numeral 41 denotes an AND gate having two input terminals, in which a first input terminal receives the write signal, while a second input terminal receives a clock $\overline{\phi}_0$ generated by the clock generating circuit. The phase of the clock $\overline{\phi}_0$ is reverse to that of the aforementioned clock $\phi_0$. A selector 42 has three input terminals, in which an input terminal "A" receives an 8-bit count value outputted from the counter 39; an input terminal "B" receives the 8-bit address data from the decoder 40; and a select terminal "SB" receives an output signal SB of the AND gate 41. When the signal SB is at "1", the selector selectively outputs the 8-bit address data supplied from the decoder 40. A numeral 43 denotes an inverter which inverts the output level of the AND gate 41. An output of the inverter 43 is supplied to a write enable terminal $\overline{WE}$ of the LFO register 44.

The peripheral circuits of the LFO register 44 are configured as described above. Normally, as shown in FIG. 9(B), the LFO data is read out from the address, corresponding to the count value of the counter 39, in the LFO register 44. However, in the case where the LFO data and its address data (representing a write address at which the LFO data is to be written) are transferred from the CPU 1, the LFO data is read from the address of the LFO register 44 corresponding to the count value of the counter 39 in synchronism with a leading-edge timing of the clock $\phi_0$; and then, the LFO data transferred from the CPU 1 is written into the LFO register 44 at the address designated by the CPU 1 in synchronism with a trailing-edge timing of the clock $\phi_0$. Incidentally, peripheral circuits of the coefficient register 46 and address register 47 shown in FIG. 8 are also configured as similar to those of the above-mentioned LFO register 44; and consequently, those registers 46 and 47 would operate as similar to the LFO register 44.

Figure 10A:
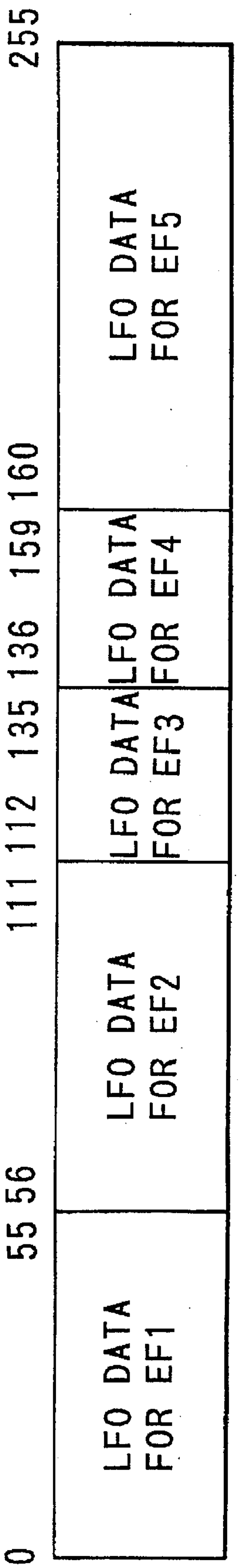
FIG. 10(A) is a storage map of the LFO register.
Figure 10B:
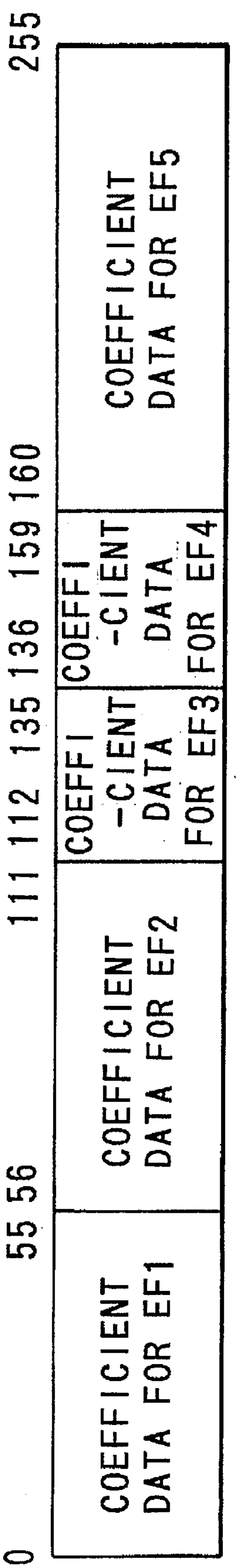
FIG. 10(B) is a storage map of a coefficient register shown in FIG. 8.
Figure 10C:
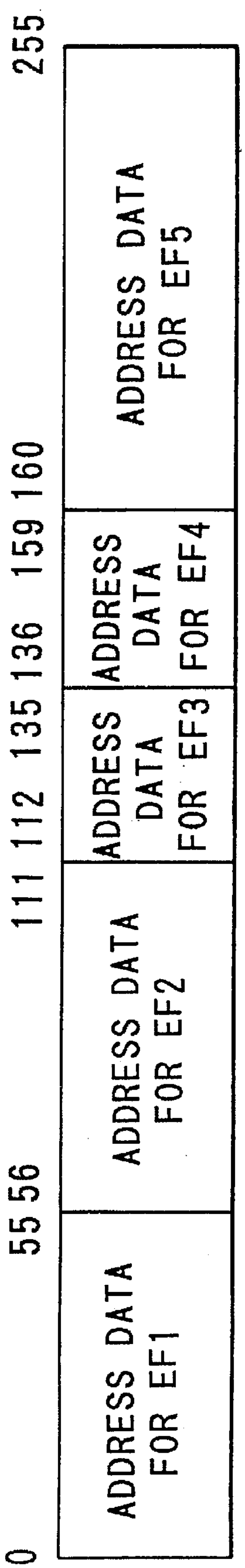
FIG. 10(C) is a storage map of an address register shown in FIG. 8.

FIGS. 10(A), 10(B) and 10(C) are drawings showing storage maps respectively corresponding to the LFO register 44, coefficient register 46 and address register 47. Each of those registers 44, 46 and 47 has two hundreds and fifty six addresses, represented by address 0 to address 255. Each data stored at each address of the register is read out in response to each operational step of the processing of the sound-effect operation portion 19 which is configured by a digital signal processor (i.e., DSP). Incidentally, each address of the register corresponds to each step of the sound-effect operation portion 19 in such a manner that the data stored at address 0 is used for operational step 0 of the sound-effect operation portion 19. Moreover, the CPU 1 manages storage addresses for the data (representing a frequency of LFO 45, a depth of amplitude and the like) to be stored in each of the registers 44, 46 and 47. When being edited by the performer, those data stored in each of the registers 44, 46 and 47 are rewritten under the control of the CPU 1.

Figure 11:
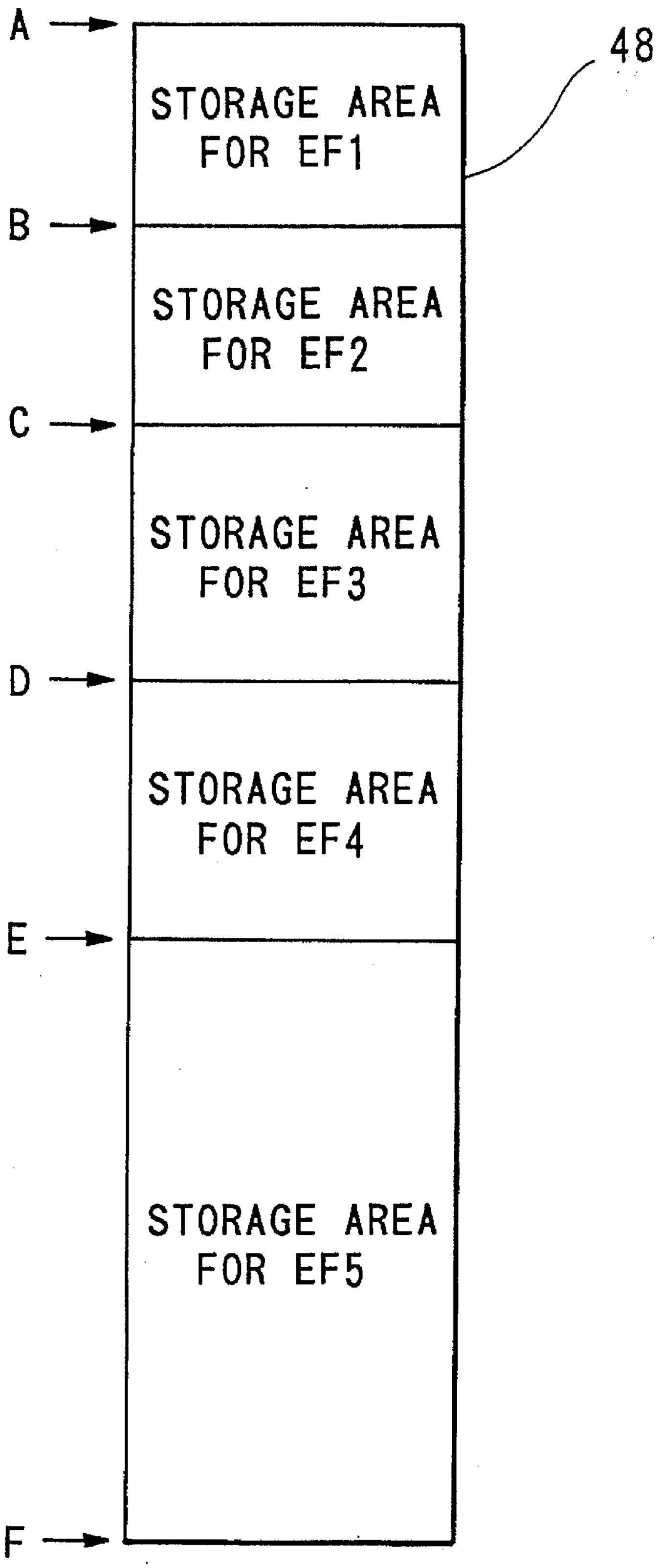
FIG. 11 is a storage map of a delay RAM shown in FIG. 8.

Next, FIG. 11 shows an example of a memory map for the delay RAM 48. In the delay RAM 48, the whole storage area is divided into five areas, wherein a first area defined between address A and address B-1 is provided to delay the data for the sound effect EF1; a second area defined between address B and address C-1 is provided to delay the data for the sound effect EF2; a third area defined between address C and address D-1 is provided to delay the data for the sound effect EF3; a fourth area defined between address D and address E-1 is provided to delay the data for the sound effect EF4; and a fifth area defined between address E and address F is provided to delay the data for the sound effect EF5.

Now, the description will be given back with respect to FIG. 8. In FIG. 8, a numeral 49 denotes a latch circuit which temporarily retains an integral part of the LFO data (simply referred to as integral data) outputted from the low-frequency oscillator 45 in accordance with the control codes of the effect program read from the effect program memory 22. A gate 50 is controlled to be turned on or off in response to the control codes of the effect program read from the effect program memory 22. When the gate 50 is turned on, the integral data retained by the latch circuit 49 is outputted to an adder 51 through the gate 50.

The adder 51 provides two input terminals, in which a first input terminal receives the address data outputted from the address register, while a second input terminal receives the integral data supplied thereto by means of the gate 50. So, the adder 51 adds the address data and the integral data together. A numeral 52 denotes an address counter which counts a number corresponding to the address of the delay RAM 48. A numeral 53 denotes an adder by which a result of the addition performed by the adder 51 is added together with a count value given from the address counter 52.

Figure 12:
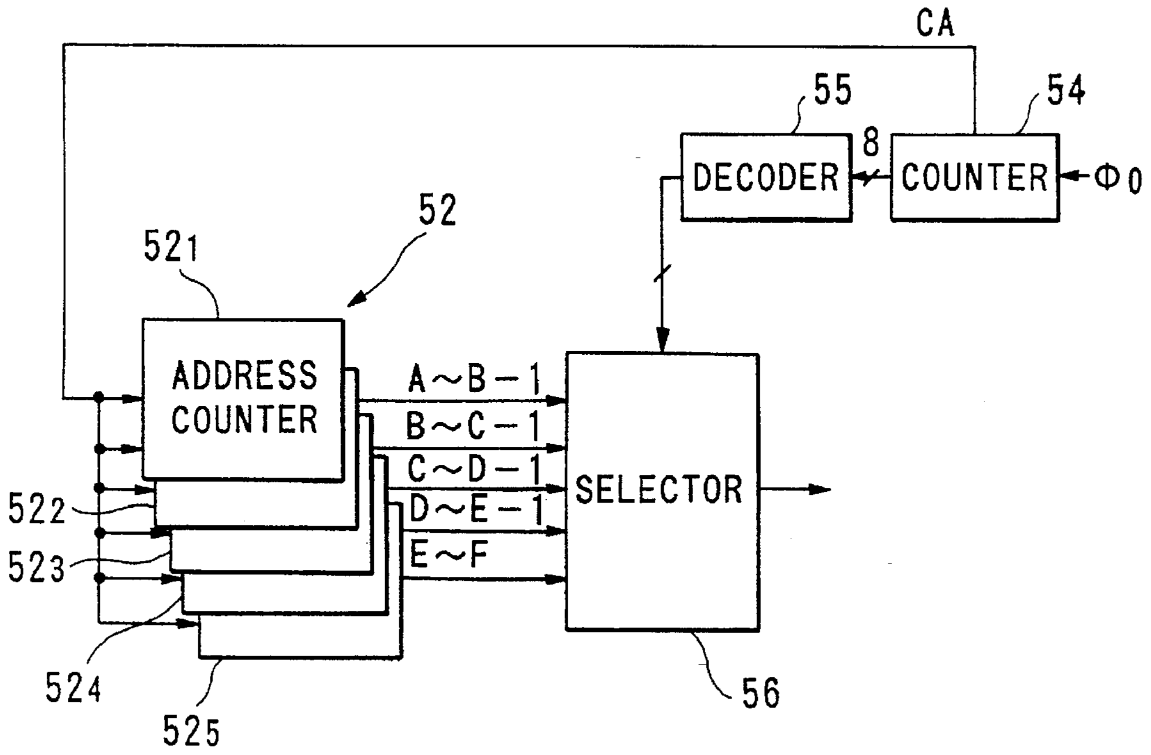
FIG. 12 is a block diagram showing peripheral circuits of an address counter.

FIG. 12 is a block diagram showing a concrete example of the circuit configuration of the address counter 52 and its peripheral circuits. In FIG. 12, numerals $\mathbf{52_1}$ to $\mathbf{52_5}$ denote address counters which respectively correspond to the sound effects EF1 to EF5. Each of those address counters is designed to count down a value of the address of the delay RAM 48 from the last address to the first address in each of the storage areas shown in FIG. 11. Herein, the value of the address is counted down one by one in each DAC cycle. More specifically, the address counter $\mathbf{52_1}$ counts down from address B-1 to address A in connection with the storage area for the sound effect EF1; the address counter $52_2$ counts down from address C-1 to address B in connection with the storage area for the sound effect EF2; the address counter $52_3$ counts down from address D-1 to address C in connection with the storage area for the sound effect EF3; the address counter $52_4$ counts down from address E-1 to address D in connection with the storage area for the sound effect EF4; and the address counter $52_5$ counts down from address F to address E.

A numeral 54 denotes a counter which is configured as similar to the foregoing counter 39 shown in FIG. 9. More specifically, the counter 54 counts the number of clocks $\phi_0$, each of which has the predetermined period and is generated from the clock generating circuit, so that the count value thereof is changed from 0 to 255 within 1 DAC cycle. When the count value reaches 255, the counter 54 outputs a carry-out signal CA, which is supplied to each of the address counters $52_1$ to $52_4$ respectively corresponding to the sound effects EF1 to EF5.

Every time the carry-out signal CA is outputted from the counter 54 by each DAC cycle, each of the address counters counts down its count value by one. When the next carry-out signal CA is outputted after the count values of the address counters $52_1$, $52_2$, $52_3$, $52_4$ and $52_5$ respectively reach their last values A, B, C, D and E, the count values are respectively returned to their first values B-1, C-1, D-1, E-1 and F. Thereafter, every time the carry-out signal CA is supplied, each of the address counters counts down its value by one.

A numeral 55 denotes a decoder which receives an 8-bit count value outputted from the counter 54. This decoder 55 decodes the 8-bit count value into the same decoded value as long as the 8-bit count value belongs to a predetermined range. For example, the decoder 55 outputs a first decoded value when the count value belongs to a first range between 0 and 55; the decoder 55 outputs a second decoded value when the count value belongs to a second range between 56 and 111; the decoder 55 outputs a third decoded value when the count value belongs to a third range between 112 and 135; the decoder 55 outputs a fourth decoded value when the count value belongs to a fourth range between 136 and 159; and the decoder 55 outputs a fifth decoded value when the count value belongs to a fifth range between 160 and 255. In response to each of the above-mentioned five decoded values, a selector 56 selects one of the count values respectively outputted from the address counters $52_1$ to $52_5$.

More specifically, the selector 56 selectively outputs the count value of the address counter $52_1$ when the 8-bit count value outputted from the counter 54 belongs to the aforementioned first range between 0 and 55. Similarly, the count value of the address counter $52_2$ is selectively outputted when the 8-bit count value belongs to the second range between 56 and 111; the count value of the address counter $52_3$ is selectively outputted when the 8-bit count value belongs to the third range between 112 and 135; the count value of the address counter $52_4$ is selectively outputted when the 8-bit count value belongs to the fourth range between 136 and 159; further, the count value of the address counter $52_5$ is selectively outputted when the 8-bit count value belongs to the fifth range between 160 and 255.

As described heretofore, the addresses used in the delay RAM 48 shown in FIG. 8 are generated from a delay address generating portion 57 which is configured by the address register 47, latch circuit 49, gate 50, adders 51, 53, and the address counter 52 and its peripheral circuits 54 to 56. In the present embodiment, read/write operations for the musical tone data in the delay RAM 48 are controlled by the control codes outputted from the effect program memory 22. As a result, the musical tone data is written into the delay RAM 48 at the address designated by the delay address generating portion 57. This musical tone data is delayed by a predetermined delay time, in other words, the sound effect such as the reverberation effect is imparted to the musical tone data. Thereafter, the delayed musical tone data is read out from the designated address of the delay RAM 48.

In FIG. 8, a numeral 58 denotes a selector having two input terminals, in which a first input terminal "a" receives the delayed musical tone data outputted from the delay RAM 48, while a second input terminal "b" receives the LFO data outputted from the low-frequency oscillator 45. In response to the control codes given from the effect program memory 22, either one of input data is selectively outputted from the selector 58.

Incidentally, when the pitch modulation is effected to the musical tone data, a decimal part of the LFO data (simply referred to as decimal data) is supplied to the second input terminal "b" of the selector 58. When the amplitude modulation is effected to the musical tone data, the aforementioned integral data is supplied. A switching between the decimal data and integral data is controlled by special data, representing the kind of the modulation to be effected, included in the LFO data.

A numeral 59 denotes a temporary RAM. At the designated write timing, output data of the selector 58 is written into the temporary RAM at its write address designated by the control codes given from the effect program memory 22. At the designated read timing, the data temporarily stored is read from the temporary RAM at its read address designated by the control codes given from the effect program memory 22.

Figure 13:
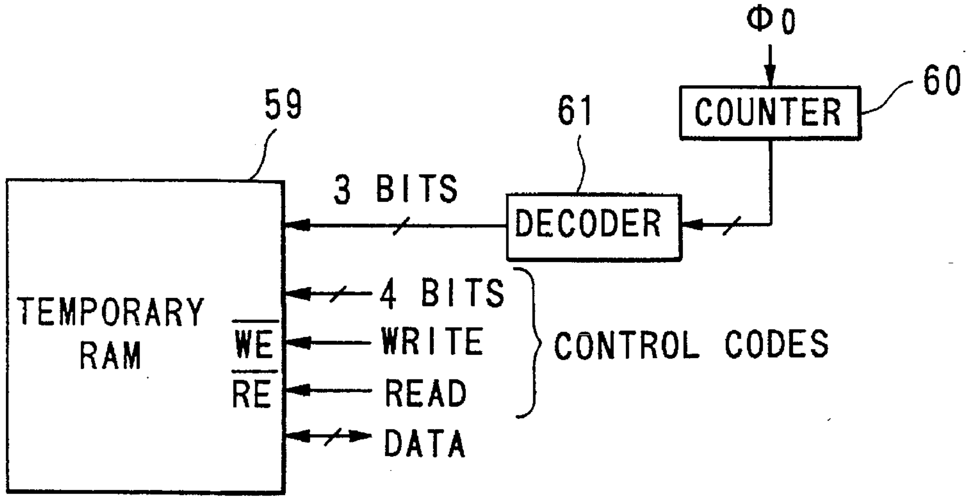
FIG. 13 is a block diagram showing peripheral circuits of a temporary RAM 59 shown in FIG. 8.

FIG. 13 is a block diagram showing the temporary RAM 59 and its peripheral circuits in detail. The whole storage area of the temporary RAM 59 is divided into five areas respectively corresponding to the sound effects EF1 to EF5. A counter 60 is configured as similar to the foregoing counters 39 and 54 shown in FIGS. 9 and 12. More specifically, the counter 60 counts the number of clocks $\phi_0$, each of which has the predetermined period and is generated by the clock generating circuit, so that the count value thereof is changed from 0 to 255 within 1 DAC cycle.

A decoder 61 decodes an 8-bit count value outputted from the counter 60 so as to produce 3-bit data. This 3-bit data is fixed as long as the 8-bit count value belongs to a predetermined range. More specifically, 3-bit data "000" is outputted when the 8-bit count value belongs to the first range between 0 and 55; 3-bit data "001" is outputted when the 8-bit count value belongs to the second range between 56 and 111; 3-bit data "010" is outputted when the 8-bit count value belongs to the third range between 112 and 135; 3-bit data "011" is outputted when the 8-bit count value belongs to the fourth range between 136 and 159; and 3-bit data "100" is outputted when the 8-bit count value belongs to the fifth range between 160 and 255. The 3-bit data outputted from the decoder 61 is used as first three bits (or significant three bits) of 7-bit address data supplied to the temporary RAM 59.

In each of five areas of the temporary RAM 59 respectively corresponding to the sound effects EF1 to EF5, the above-mentioned 3-bit data outputted from the decoder 61 are written into the addresses corresponding to the first three bits, while the other addresses corresponding to remained four bits are designated by a part of the control codes outputted from the effect program memory 22 so that the output data of the selector 58 shown in FIG. 8 are written into those addresses in accordance with a timing at which a write signal, represented by another part of the control codes, is supplied to the temporary RAM 59. On the other hand, in each area of the temporary RAM 59, the first three bits representing the 3-bit data of the decoder 61 are read out from their addresses, while the remained four bits are read out from the addresses designated by a part of the control codes outputted from the effect program memory 22 in accordance with a timing at which a read signal, represented by another part of the control codes, is supplied to the temporary RAM 59. The above-mentioned read/write operations are performed within 1DAC cycle.

As similar to the aforementioned temporary RAM 59 and its peripheral circuits, temporary RAMs 62 and 63 shown in FIG. 8 and their peripheral circuits are configured. Incidentally, a part of the musical tone data read from the temporary RAM 63 is supplied to the foregoing input terminal "b" of the selector 28 shown in FIG. 6.

FIG. 14 shows an example of a storage map of the temporary RAM 63. The temporary RAM 63 receives fourteen kinds of musical tone data from a selector 76 (see FIG. 8). More specifically, the temporary RAM 63 receives the mixed data EM1 inputted to the sound effect portion EF1, operation data EX1L and EX1R outputted from the sound effect portion EF1, mixed data EM2 inputted to the sound effect portion EF1, operation data EX2L and EX2R, mixed data EM3 inputted to the sound effect portion EF3, operation data EX3 outputted from the sound effect portion EF3, mixed data EM4 inputted to the sound effect portion EF4, operation data EX4 outputted from the sound effect portion EF4, mixed data EM5L and EM5R inputted to the sound effect portion EF5, operation data EX5L and EX5R outputted from the sound effect portion EF5, which are shown in FIGS. 4 and 5(A) to 5(D). In this case, five kinds of the 3-bit data outputted from the decoder 61 shown in FIG. 13, i.e., "000", "001", "010", "011" and "100", are used as write addresses for the first three bits in connection with the sound effects EF1 to EF5. Thus, the above-mentioned fourteen kinds of musical tone data are sequentially stored in fourteen addresses of the temporary RAM 63, respectively indicated by "$00_{HEX}$", "$01_{HEX}$", "$02_{HEX}$", "$10_{HEX}$", "$11_{HEX}$", "$12_{HEX}$", "$20_{HEX}$", "$21_{HEX}$", "$30_{HEX}$", "$31_{HEX}$", "$40_{HEX}$", "$41_{HEX}$", "$42_{HEX}$" and "$43_{HEX}$" as shown in FIG. 14.

In FIG. 8, latch circuits 64 and 65 are provided to temporarily store the musical tone data which are respectively read from the temporary RAMs 59 and 62 in accordance with the control codes contained in the effect programs read from the effect program memory 22. A numeral 66 denotes a selector having five input terminals, in which a first input terminal "a" receives the musical tone data outputted from the latch circuit 65; a second input terminal "b" receives the musical tone data outputted from the latch circuit 64; a third input terminal "c" receives a data value "1"; a fourth input terminal "d" receives a data value "0"; and a fifth input terminal "e" receives the coefficient data outputted from the coefficient register 46. In accordance with the control codes outputted from the effect program memory 22, the selector 66 selectively outputs one of five input data thereof.

A selector 67 has four input terminals, in which three input terminals "a", "b" and "c" respectively receive the musical tone data outputted from the temporary RAMs 63, 62 and 59, while a remained input terminal "d" receives a data value "1". In accordance with the control codes outputted from the effect program memory 22, the selector 67 selectively outputs one of four input data thereof. A multiplier 68 performs a multiplication on the output data of the selectors 66 and 67. A selector 69 has four input terminals, in which a first input terminal "a" receives the musical tone data to be outputted from a delay circuit 74; a second input terminal "b" receives the musical tone data outputted from the temporary RAM 62; a third input terminal "c" receives the musical tone data outputted from the temporary RAM 59; and a fourth input terminal "d" receives a data value "0". In accordance with the control codes outputted from the effect program memory 22, the selector 69 selectively outputs one of four input data thereof.

A numeral 70 denotes an exclusive-OR gate having two input terminals, in which a first input terminal receives the data outputted from the selector 69, while a second input terminal receives the control codes outputted from the effect program memory 22. A numeral 71 denotes an adder having three input terminals, in which a first input terminal receives an output of the multiplier 68; a second input terminal receives an output of the exclusive-OR gate 70; and a carry terminal, represented by "CI", receives the control codes which are identical to the control codes supplied to the second input terminal of the exclusive-OR gate 70. The exclusive-OR gate 70 and the adder 71 are assembled together to form an addition/subtraction circuit 72 which performs an addition or a subtraction on the output data of the selector 69 and multiplier 68 In response to the control codes.

A numeral 73 denotes a shifter which shifts the bit positions of the output data of the addition/subtraction circuit 72 by predetermined number of bits in response to the control codes outputted from the effect program memory 22. The delay circuit 74 delays an output of the shifter 73 by a predetermined delay time. A delayed output of the delay circuit 74 is delivered to a latch circuit 75 as well as the temporary RAM 62, the input terminal "a" of the selector 69 and the input terminal "b" of the selector 76.

The above-mentioned circuit elements 64 to 74 configure a sound-effect computation circuit ECC. Thus, the input data is eventually delayed by a delay time corresponding to four clocks $\phi_0$ in the sound-effect computation circuit ECC. In other words, the sound-effect computation circuit ECC has an operation time corresponding to four clocks $\phi_0$.

In response to the control codes outputted from the effect program memory 22, the latch circuit 75 temporarily retains the output data of the delay circuit 74, which is then outputted to the delay RAM 48. The selector 76 has two input terminals, in which a first input terminal "a" receives the musical tone data outputted from the delay circuit 32 provided in the mixer 18 shown in FIG. 6, while a second input terminal "b" receives the output data of the delay circuit 74. In response to the control codes given from the effect program memory 22, the selector 76 selectively outputs one of two input data thereof.

Figure 15:
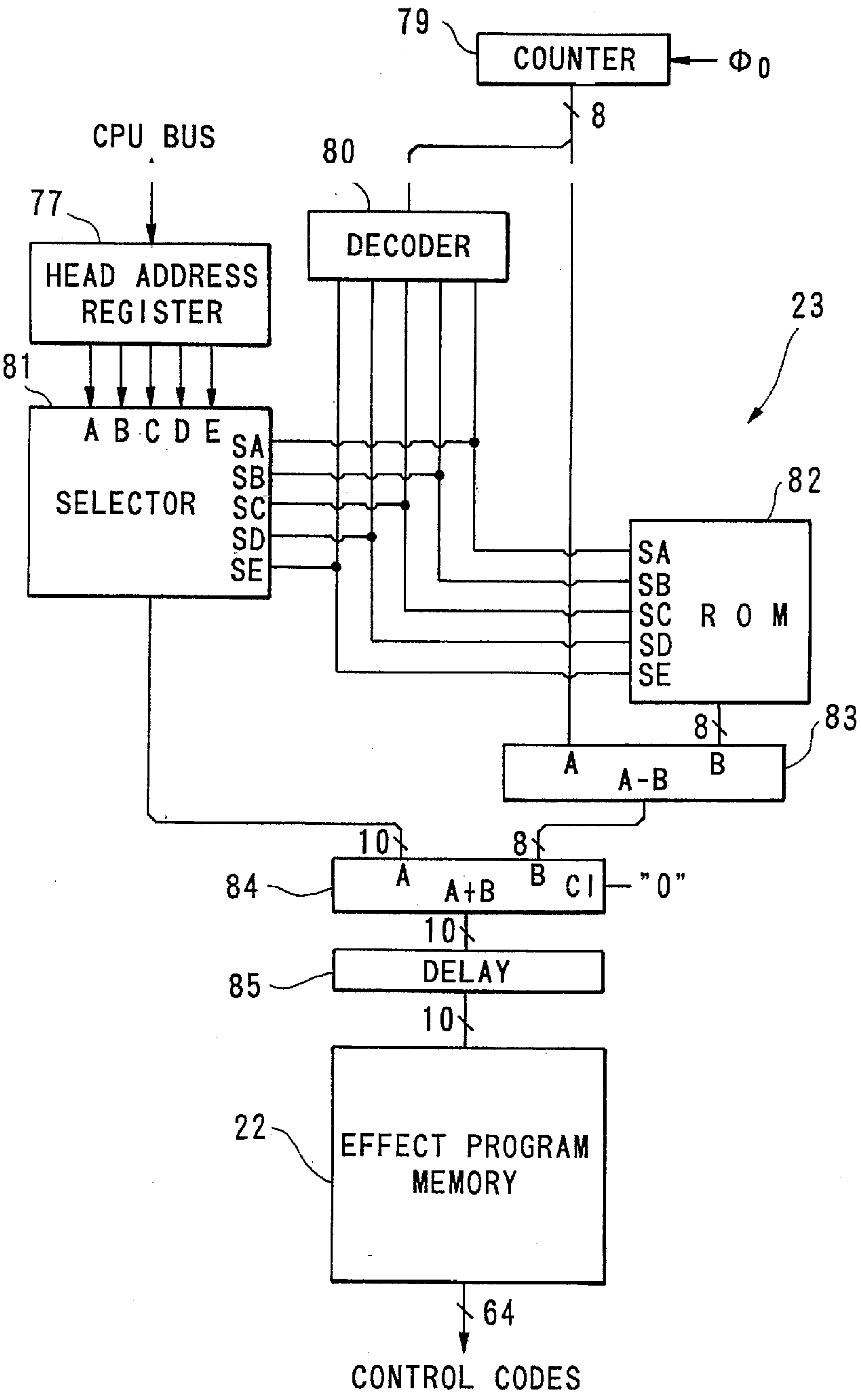
FIG. 15 is a block diagram showing a detailed configuration of an address producing portion shown in FIG. 2 which is connected with an effect program memory.
Figure 16:
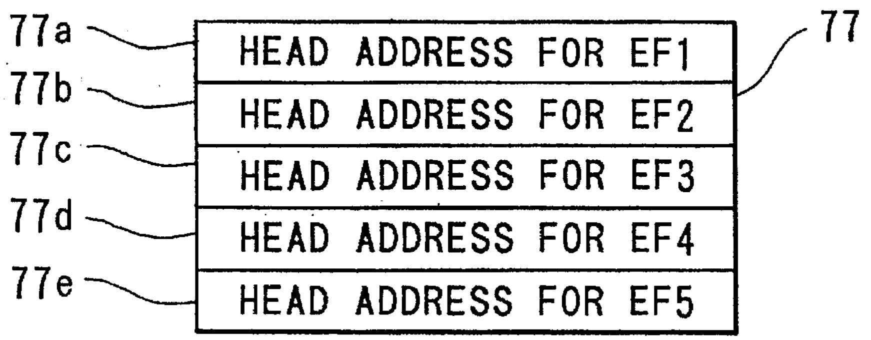
FIG. 16 is a storage map of a head address register shown in FIG. 15.

FIG. 15 is a block diagram showing a detailed configuration of the address producing portion 23 connected with the effect program memory 22. In FIG. 15, a numeral 77 denotes a head address register which is configured as shown in FIG. 16. The head address register 77 receives and stores the head addresses, respectively corresponding to the sound effects EF1 to EF5, which are transferred thereto from the CPU 1 through the CPU bus 5. At those head addresses of the effect program memory 22, the effect programs corresponding to the sound effects EF1 to EF5 designated by the performer are respectively stored. Those head addresses are temporarily stored in areas 77*a* to 77*e* of the head address register 77.

Figure 17:
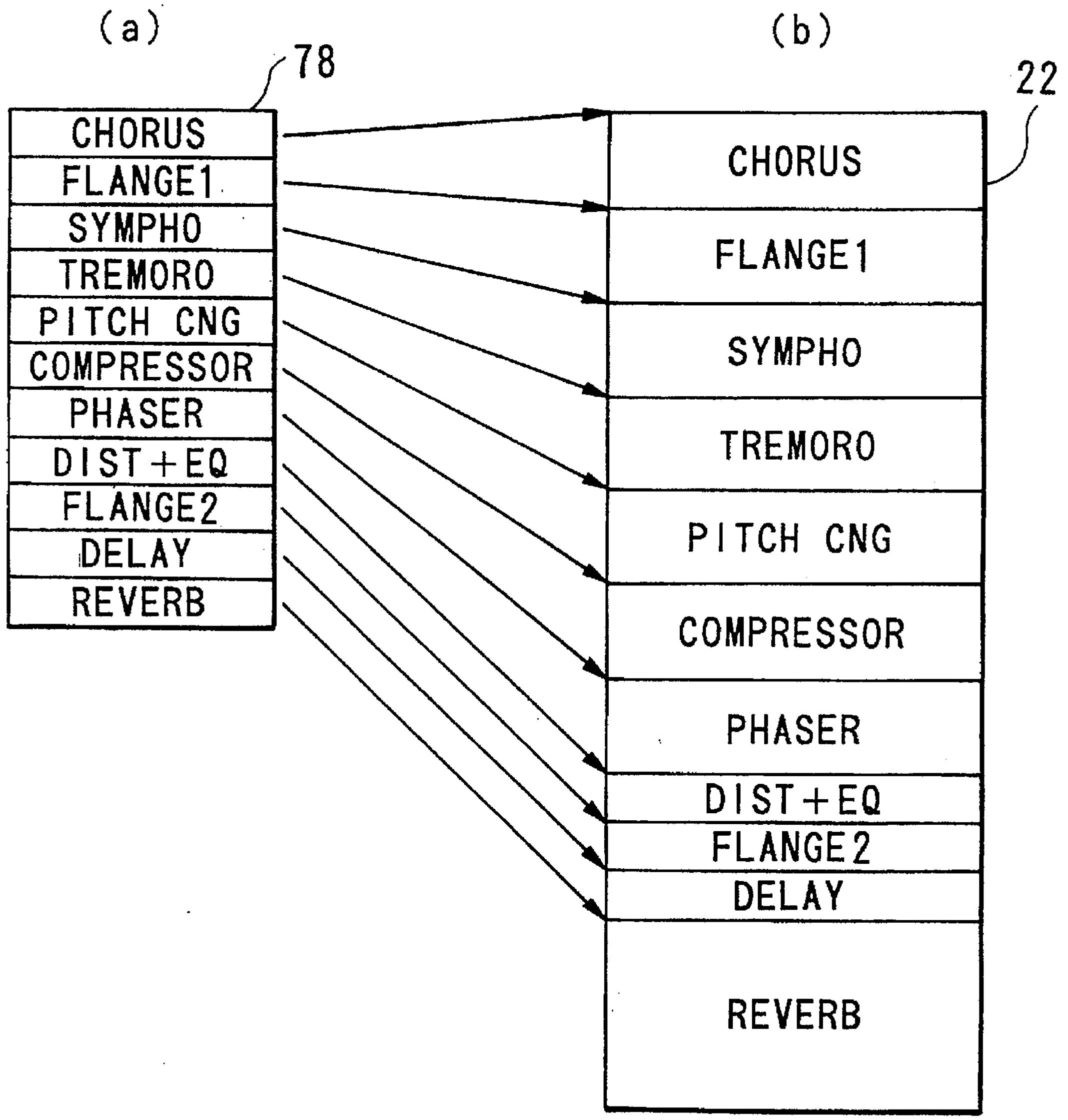
FIG. 17 shows storage maps of the effect program memory and a head address ROM.

In the present embodiment, the effect program memory 22 is designed to store the effect programs respectively corresponding to eleven kinds of sound effects as shown in FIG. 17(*b*). The head addresses (see FIG. 17(*a*)) respectively corresponding to the effect programs are stored in a head address read-only memory (i.e., head address ROM) 78 in advance. Incidentally, each of the head addresses respectively stored in the areas of the head address ROM 78 is represented by an effect number identifying each of the sound effects. For example, the head address ROM 78 forms a part of the ROM 2 shown in FIG. 1.

Therefore, when the performer uses the mouse 7 to select the chorus effect as the sound effect EF1, the CPU 1 reads out the head address for the chorus effect from the head address ROM 78 in response to the effect number corresponding to the chorus effect; and then, the head address is transferred to the sound effect imparting apparatus 14 through the CPU bus 5, so that the head address is temporarily stored in the area 77*a* of the head address register 77.

Meanwhile, a numeral 79 shown in FIG. 15 denotes a counter which counts the number of clocks $\phi_0$, generated from the clock generating circuit, within 1 DAC cycle, so that its count value is changed from 0 to 255. A decoder 80 receives an 8-bit count value from the counter 79. The decoder 80 is designed to output the same decoded value as long as the 8-bit count value belongs to a predetermined range. More specifically, a first decoded value "sa" is outputted when the count value belongs to a first range between 0 and 55; a second decoded value "sb" is outputted when the count value belongs to a second range between 56 and 111; a third decoded value "sc" is outputted when the count value belongs to a third range between 112 and 135; a fourth decoded value "sd" is outputted when the count value belongs to a fourth range between 136 and 159; and a fifth decoded value "se" is outputted when the count value belongs to a fifth range between 160 and 255. Those values "sa" to "se" are respectively supplied to select terminals "SA" to "SE" of a selector 81, while they are also supplied to address input terminals "SA" to "SE" of a ROM 82.

The selector 81 has five input terminals "A" to "E" which respectively receive five head addresses outputted from the head address register 77. When the decoded value "sa" is supplied to the select terminal "SA", the selector 81 selectively outputs the head address corresponding to the sound effect EF1. Similarly, the head address corresponding to the sound effect EF2 is selectively outputted when the decoded value "sb" is supplied to the select terminal "SB"; the head address corresponding to the sound effect EF3 is outputted when the decoded value "sc" is supplied to the select terminal "SC"; the head address corresponding to the sound effect EF4 is outputted when the decoded value "sd" is supplied to the select terminal SD; and the head address corresponding to the sound effect EF5 is outputted when the decoded value "se" is supplied to the select terminal SE.

When the decoded value "sa" is supplied to the address input terminal SA, a data value "0" is outputted from the ROM 82. Similarly, a data value "56" is outputted when the decoded value "sb" is supplied to the address input terminal SB; a data value "112" is outputted when the decoded value "sc" is supplied to the address input terminal SC; a data value "136" is outputted when the decoded value "sd" is supplied to the address input terminal SD; and a data value "160" is outputted when the decoded value "se" is supplied to the address input terminal SE. In the meantime, a numeral 83 denotes a subtracter having two input terminals, in which an input terminal "A" receives the count value outputted from the counter 79, while another input terminal "B" receives an output value of the ROM 82. Thus, the subtracter 83 subtracts the output value of the ROM 82 from the count value of the counter 79.

An adder 84 has two input terminals, in which an input terminal "A" receives the head address corresponding to each of the sound effects EF1 to EF5, while another input terminal "B" receives an output of the subtracter 83. Thus, the adder 84 adds those values together. A delay circuit 85 delays an output of the adder 84 by a predetermined delay time, so that a delayed output thereof is supplied to the effect program memory 22.

Thus, the effect programs corresponding to five sound effects EF1 to EF5 are sequentially read from their head addresses of the effect program memory 22 within 1 DAC cycle. Incidentally, if the performer repeatedly selects the same sound effect by plural times, the same effect program would be repeatedly read out by plural times within 1 DAC cycle.

[C] Operations of Sound Effect Imparting Apparatus

Next, operations of the CPU 1 will be described in detail by referring to flowcharts shown in FIGS. 18, 19 and 20.

Figure 18:
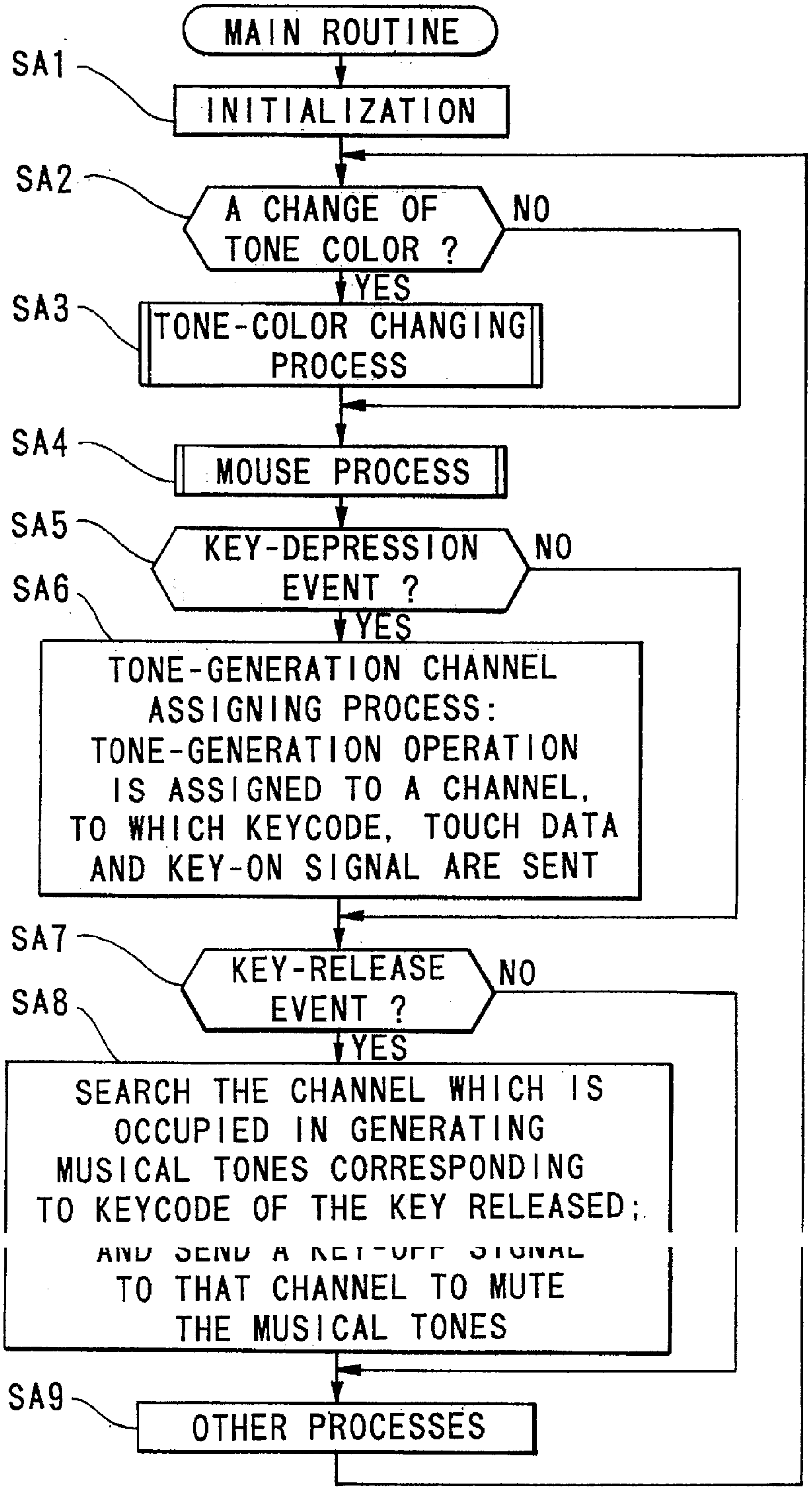
FIG. 18 is a flowchart showing a main routine whose processes are performed by a CPU shown in FIG. 1.

When the power is applied to the electronic musical instrument shown in FIG. 1, the CPU 1 accesses to a main routine shown in FIG. 18, in which the processing thereof proceeds to a first step SA1. In step SA1, an initialization is performed so as to initialize several portions of the instrument. In the initialization process, values stored in the registers provided in the RAM 3 are reset to zero, while initial values are set to the peripheral circuits as their variables. After completing the initialization process, the processing of the CPU 1 proceeds to step SA2.

In step SA2, the CPU 1 judges whether or not any change for the tone color is designated by the performer. When the performer operates one of the tone color switches 9 shown in FIG. 1, the data corresponding to the operated switch is transferred to the CPU 1 through the switch interface 10 and the CPU bus 5. Thus, the CPU 1 can perform the above-mentioned judging process by detecting whether or not the data corresponding to the tone color switch operated by the performer is supplied thereto. If a result of the judgement in step SA2 is "YES", the processing proceeds to step SA3.

In step SA3, a tone-color changing process is performed. According to this tone-color changing process, the tone color data is transferred to the sound source circuit 13, while each of the effect parameters, corresponding to the sound effects EF1 to EF5, which are changed responsive to a change of the tone color is transferred to the sound effect imparting apparatus 14, for example. The details of the tone-color changing process will be described later. When completing the tone-color changing process, the processing proceeds to step SA4.

When the result of the judgement in step SA2 is "NO", indicating that the performer does not change the tone color, the processing jumps to step SA4.

In step SA4, a mouse process is performed. According to the mouse process, the sound effect, designated by the performer, which is used as each of the sound effects EF1 to EF5 is changed in response to an operation of the mouse 7, and the effect parameters which are used for the sound effects EF1 to EF5 are also changed in response to the operations of the mouse 7. The details of the mouse process will be described later. When completing the mouse process, the processing proceeds to step SA5.

In step SA5, the CPU 1 judges whether or not a key-depression event is occurred in the keyboard unit 11. If a result of the judgement is "YES", the processing proceeds to step SA6.

In step SA6, a tone-generation channel assigning process is carried out at first. Herein, it is detected whether or not any one of the tone-generation channels provided in the sound source circuit 13 is an idle channel (which is not occupied in generating the musical tones). If there exist plural idle channels, any one of them is selected as a new tone-generation channel. On the other hand, when all of the channels are occupied in generating the musical tones so that no channel is idling, a certain channel in which an amplitude level of an envelope waveform is the lowest among all of the channels is selected as an idle channel. In this case, a truncate process is performed on that channel at first, and then, the channel is set as the idle channel.

After detecting or selecting the idle channel in accordance with the aforementioned tone-generation channel assigning process, a keycode, touch data and a key-on signal regarding the key-depression event are transferred to the idle channel. Then, the processing proceeds to step SA7.

In step SA7, it is detected whether or not a key-release event is occurred in the keyboard unit 11. If a result of the judgement in step SA7 is "YES"the processing proceeds to step SA8.

In step SA8, the CPU 1 searches the tone-generation channel which corresponds to the keycode of the key released; and then, it is judged whether or not the tone-generation channel is now occupied in generating the musical tones. If so, a key-release process is carried out so that a key-off signal is transferred to the tone-generation channel so as to mute its musical tones. Then, the processing proceeds to step SA9.

On the other hand, when the result of the judgement in step SA7 is "NO", indicating that no key-release event is occurred in the keyboard unit 11, the processing jumps to step SA9.

In step SA9, predetermined processes other than the aforementioned processes are performed. Thereafter, the processing returns back to the aforementioned step SA2. Thus, until the power supply is stopped, the above-mentioned processes of steps SA2 to SA9 are repeatedly performed.

Next, the tone-color changing process to be performed by the CPU 1 will be described in detail by referring to a flowchart shown in FIG. 19.

Figure 19:
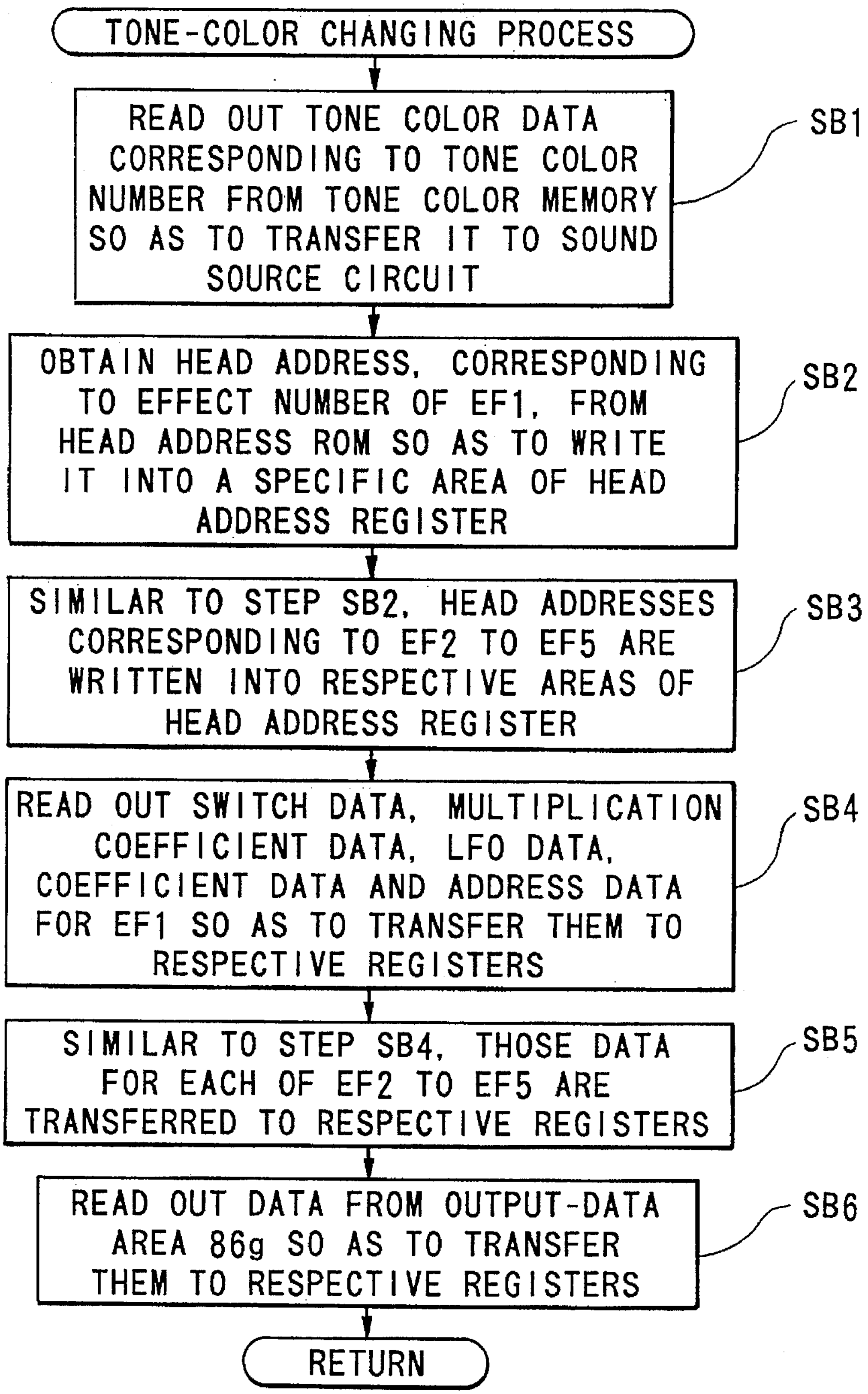
FIG. 19 is a flowchart showing a routine of tone-color changing process.

When the processing of the CPU 1 reaches step SA3 in FIG. 18, a routine of the tone-color changing process as shown in FIG. 19 is activated. At first, the processing proceeds to step SB1. Herein, the CPU 1 searches the tone color data corresponding to a tone color number (i.e., a serial number applied to each of the tone colors preset in the system) which is designated by operating the tone color switch 9 by the performer; and then, the tone color data is read out from a tone-color-data area 86*a* of a tone color memory 86 shown in FIG. 20. The tone color data read from the tone color memory 86 is transferred to the sound source circuit 13. Thereafter, the processing proceeds to step SB2.

The above-mentioned tone color memory 86 forms a part of the RAM 3, and such tone color memory is provided for each of the tone colors. The whole storage area of the tone color memory 86 is divided into seven areas, i.e., the tone-color-data area 86*a*, a data area 86*b* for EF1, a data area 86*c* for EF2, a data area 86*d* for EF3, a data area 86*e* for EF4, a data area 86*f* for EF5 and an output-data area 86*g*. The tone-color-data area 86*a* stores the tone color data and the other data representing the name of the tone color and the like, all of which are transferred to the sound source circuit 13.

In the present embodiment, one musical tone is formed by synthesizing plural sounds. Because, the present embodiment is designed such that plural sounds (e.g., maximum four sounds) can be simultaneously produced in connection with one key-depression event. In this case, the tone-color-data area 86*a* stores all of the tone color data each of which is used to produce each of the sounds forming one musical tone.

Each of the data areas 86*b* to 86*f* has the same configuration. Therefore, each data area stores six kinds of data, i.e., an effect number representing the sound effect selected by the performer, switch data representing on/off states of the gate 30 (see FIG. 6), multiplication coefficient data representing the multiplication coefficients of the multiplier portion 29 (see FIG. 6) provided in the mixer 18, LFO data, coefficient data, and address data consisting of the effect parameters.

Figure 5A:
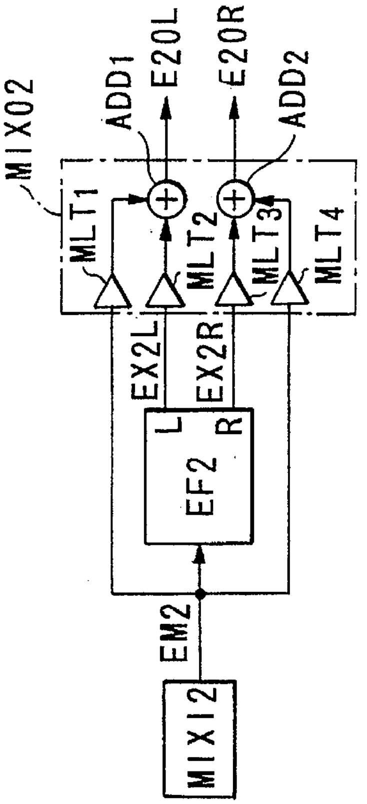
FIGS. 5(A) to 5(D) are block diagrams showing algorithmic configurations for sound effects EF2 to EF5 respectively.
Figure 5B:
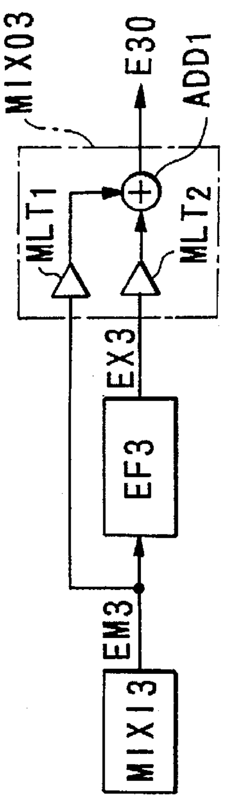
Figure 5C:
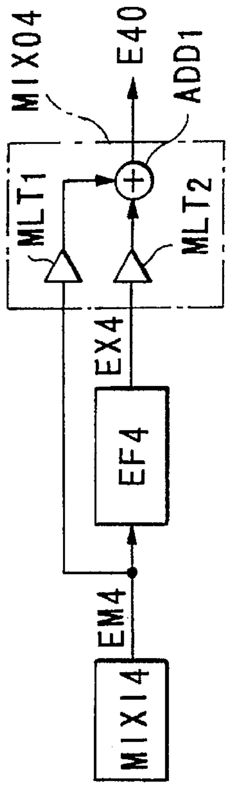
Figure 5D:
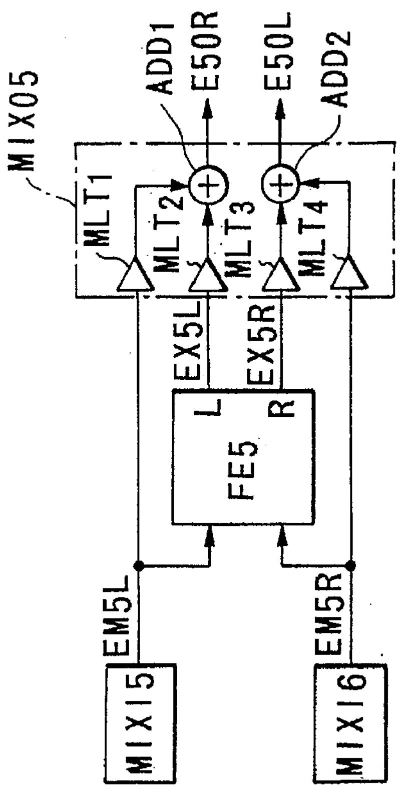
Figure 5E:
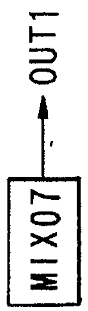
FIGS. 5(E) and 5(F) are block diagrams showing algorithmic configurations regarding outputting operations of the sound effect imparting apparatus.
Figure 5F:
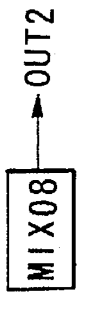

Moreover, the output-data area 86*g* stores multiplication coefficient data and switch data corresponding to the aforementioned output-stage mixing portions MIXO7 and MIXO8 respectively shown in FIGS. 5(E) and 5(F). Incidentally, all of the data stored in the data areas 86*b* to 86*f*, respectively provided for the sound effects EF1 to EF5, and the data stored in the output-data area 86*g* can be changed in accordance with the mouse process, the details of which will be described later.

Figure 20:
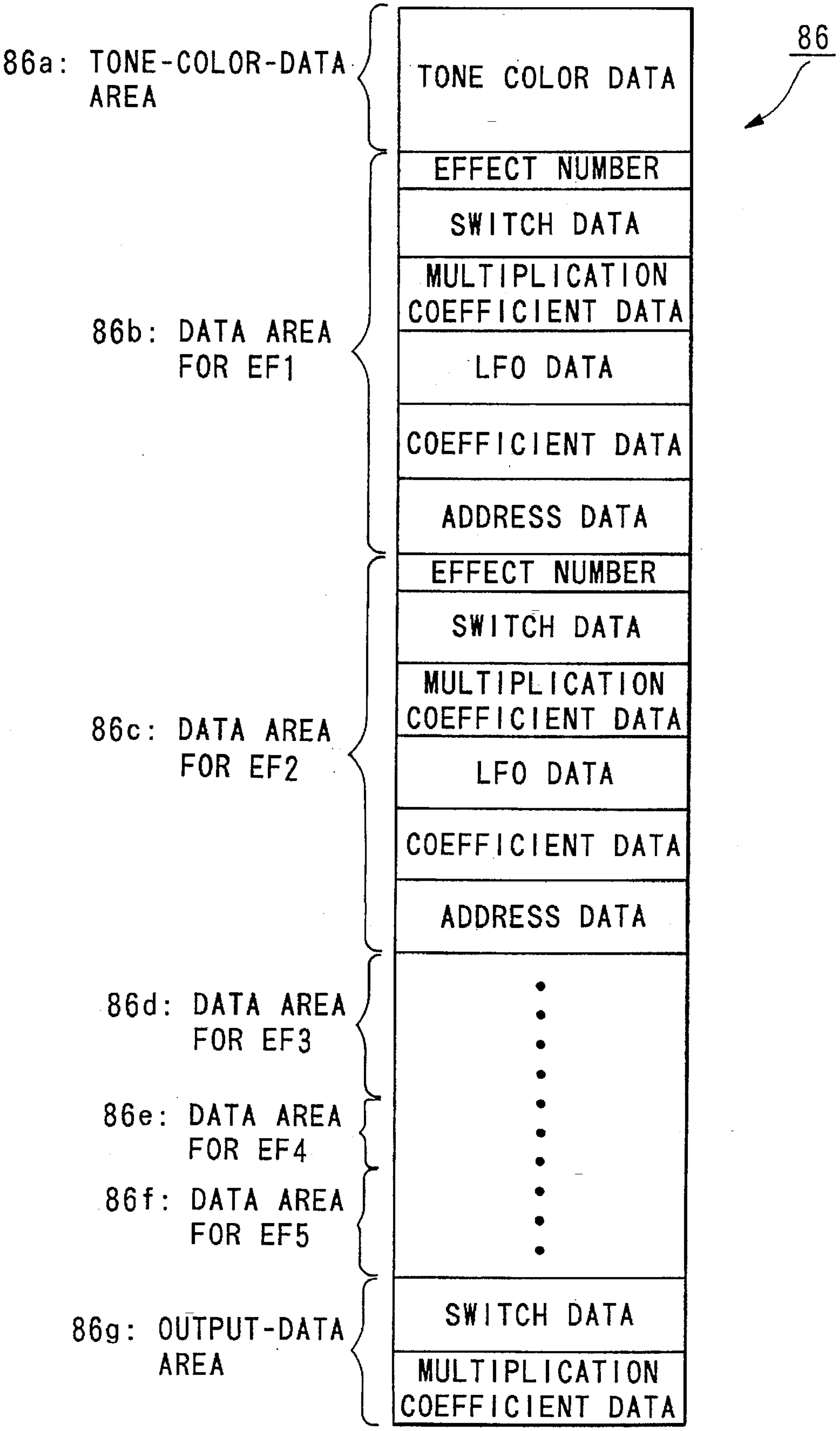
FIG. 20 is a storage map of a tone color memory.

In step SB2, the effect number is read from the data area 86*b* for EF1 provided in the tone color memory 86 shown in FIG. 20; the head address corresponding to the effect program designated by the read effect number is read from the head address ROM 78 shown in FIG. 17(*a*); and then, the head address is written into the area 77*a* of the head address register 77 (see FIG. 16) provided in the address producing portion 23. After completing the process of step SB2, the processing proceeds to step SB3.

In step SB3, the same process of step SB2 is performed with respect to the other sound effects EF2 to EF5. More specifically, the head addresses corresponding to the effect numbers stored in the data areas 86*c* to 86*f* are read from the head address ROM 78 (see FIG. 17(*a*)); and then, those head addresses are respectively written into the areas 77*b* to 77*e* in the head address register 77 shown in FIG. 16. Then, the processing proceeds to step SB4.

In step SB4, the switch data, multiplication coefficient data, LFO data, coefficient data and address data are read from the data area 86*b* for EF1; and then, those data are respectively transferred on the CPU bus 5 to the switch register 35, volume register 37, LFO register 44, coefficient register 46 and address register 47 shown in FIG. 8. Thereafter, the processing proceeds to step SB5.

In step SB5, the same process of step SB4 is performed with respect to the other sound effects EF2 to EF5. More specifically, the switch data, multiplication coefficient data, LFO data, coefficient data and address data are read from the respective data areas 86*c* to 86*f* which are provided for the sound effects EF2 to EF5 respectively; and then, those data are transferred to the registers 35, 37, 44, 46 and 47. Thereafter, the processing proceeds to step SB6.

In step SB6, the switch data and multiplication coefficient data are read from the output-data area 86*g*; and then, they are respectively transferred to the registers 35 and 37 shown in FIG. 8. Thereafter, the processing of the CPU 1 returns back to the foregoing main routine shown in FIG. 18; and then, the processing proceeds to step SA4.

Next, the mouse process to be performed by the CPU 1 will be described in detail by referring to the flowchart shown in FIG. 21.

Figure 21:
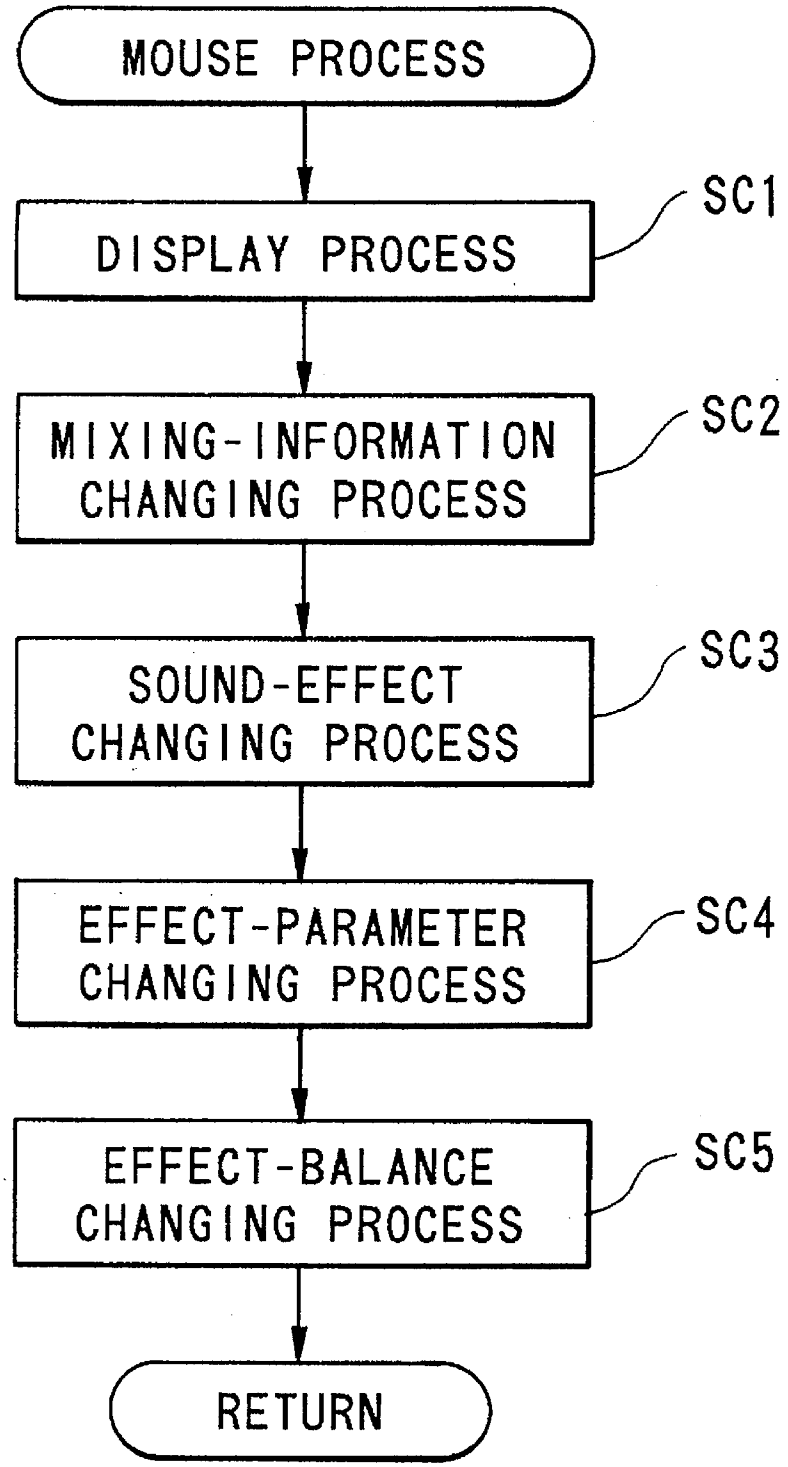
FIG. 21 is a flowchart showing a routine of mouse process.
Figure 22:
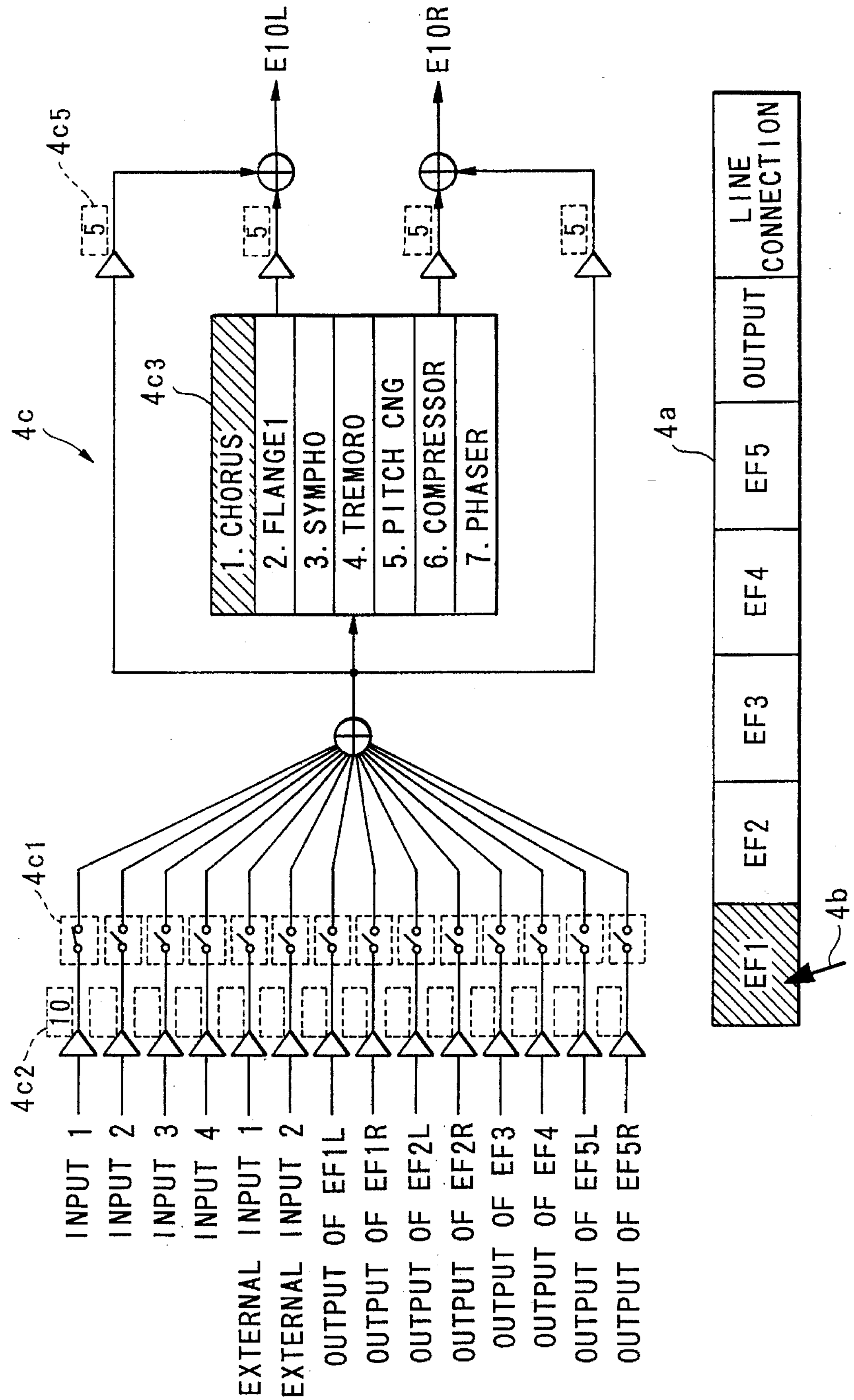
FIG. 22 shows an example of a graphic pattern which is displayed on a display screen of a display unit shown in FIG. 1 in connection with the sound effect EF1.
Figure 28:
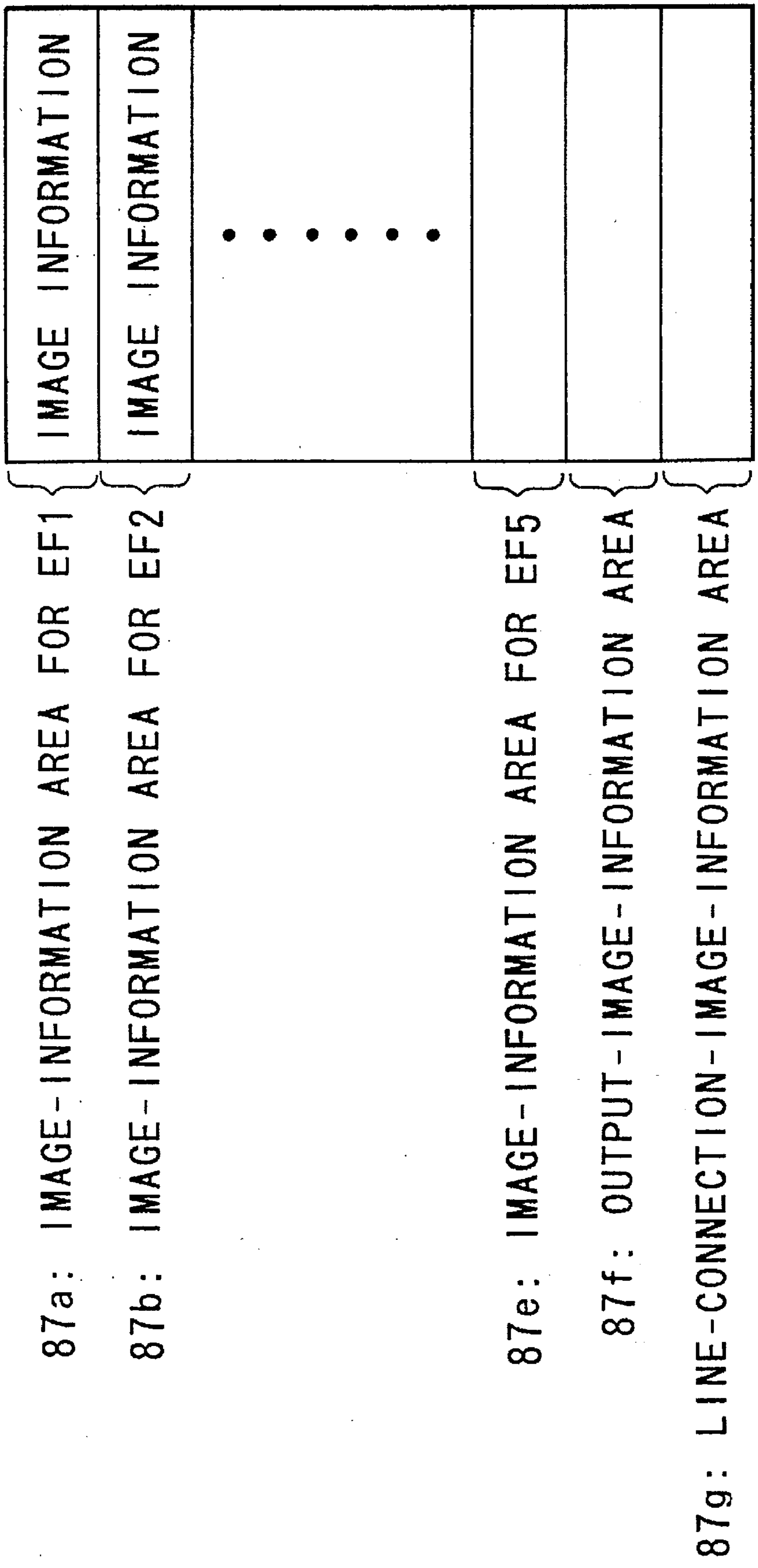
FIG. 28 is a storage map showing specific areas, each storing image information, which are formed in a ROM shown in FIG. 1.

When the processing of the CPU 1 reaches step SA4 shown in FIG. 18, a routine of the mouse process as shown in FIG. 21 is started. At first, the processing proceeds to step SC1, in which a display process is performed. According to the display process, a displayed image which is displayed on the display screen of the display unit 4 is controlled. FIG. 22 shows an example of the displayed image, wherein a numeral 4*a* denotes a display area which is displayed on the display screen at its lower portion; a numeral 4*b* denotes a cursor whose position is controlled by the mouse 7; and a numeral 4*c* denotes a display area which is displayed on the display screen at its upper portion. For instance, when the performer operates the mouse 7 to move the cursor 4*b* and place it on a icon "EF1" in the display area 4*a*, and then, the performer clicks the mouse button, the CPU 1 reads out video information, regarding the pre-stage mixing portion MIXI1, the sound effect portion EF1 and the post-stage mixing portion MIXO1 (see FIG. 4), from an image-information area 87*a* (see FIG. 28) provided in the ROM 2, wherein this image-information area 87*a* is provided for storing image information (or graphic information) regarding the sound effect EF1. Further, the effect number, switch data, multiplication coefficient data, coefficient data and address data are read from the data area 86*b* provided in the tone color memory 86, so that a predetermined graphic pattern as shown in FIG. 22 is displayed at the display area 4*c*.

The above-mentioned image information represents a part of the whole graphic image corresponding to the pre-stage mixing portion MIXI1, the sound effect portion EF1 and the post-stage mixing portion MIXO1. In other words, the image information merely represents a part of the whole graphic image which can be fixedly displayed on the display screen. The other parts are displayed on the basis of the data read from the data area 86*b* provided for the sound effect EF1. As the other parts displayed on the display screen, there are provided a numeric value which is displayed on the right of each multiplier (i.e., MLT, MLT1–MLT4, see FIG. 4), an on/off state of each switch and an enhanced portion on the icon "EF1" (indicating that the sound effect EF1 is now selected), for example.

In FIG. 22, a numeric value "10" (representing the multiplication coefficient "1") is only set for the multiplier MLT, corresponding to the input data ID1 among fourteen kinds of musical tone data, in the pre-stage mixing portion MIX1. Thus, only the input data ID1 is multiplied by the multiplication coefficient "1" in the multiplier MLT, the output of which is transmitted to the sound effect portion EF1 as the mixed data EM1. In the sound effect portion EF1, a chorus effect is imparted to the mixed data EM1, resulting that the aforementioned operation data EX1L and EX1R are produced. Those operation data EX1L and EX1R are supplied to the multipliers MLT2 and MLT3 each having a numeric value "5" (representing a multiplication coefficient "0.5"). Thus, the operation data EX1L and EX1R are multiplied by the same multiplication coefficient "0.5" in the multipliers MLT2 and MLT3, the outputs of which are respectively supplied to the adders ADD1 and ADD2. Then, the adder ADD1 adds together the left-channel components with respect to the mixed data EM1 and the operation data EX1L, while the adder ADD2 adds together the right-channel components with respect to the mixed data EM1 and the operation data EX1R. As a result, the output data E1OL is obtained from the adder ADD1, while the output data E1OR is obtained from the adder ADD2.

Similarly, when the performer operates the mouse 7 to correspondingly move the cursor 4*b* and place it on each of other icons "EF2", "EF3", "EF4", "EF5" and "OUTPUT", the CPU 1 reads out the corresponding image information from each of image-information areas 87*b*, 87*c*, 87*d*, 87*e* and 87*f* provided in the ROM 2. In this case, the image Information for the icon "EF2" represents the pre-stage mixing portion MIXI2, sound effect portion EF2 and post-stage mixing portion MIXO2; the image information for the icon "EF3" represents the pre-stage mixing portion MIXI3, sound effect portion EF3 and post-stage mixing portion MIXO3; the image information for the icon "EF4" represents the pre-stage mixing portion MIXI4, sound effect portion EF4 and post-stage mixing portion MIXO4; the image information for the icon "EF5" represents the pre-stage mixing portions MIXI5 and MIXI6, sound effect portion EF5 and post-stage mixing portion MIXO5; and the image information for the icon "OUTPUT" represents other portions regarding the output operation. Moreover, the effect number, switch data, multiplication coefficient data, coefficient data and address data are read from each of the data areas 86*c*, 86*d*, 86*e* and 86*f*, while the switch data and multiplication coefficient data are read from the output-data area 86*g* provided in the tone color memory 86 shown in FIG. 20. Then, the corresponding graphic pattern is displayed at the display area 4*c* on the display screen of the display unit 4 as shown in each of FIGS. 23 to 27.

Figure 23:
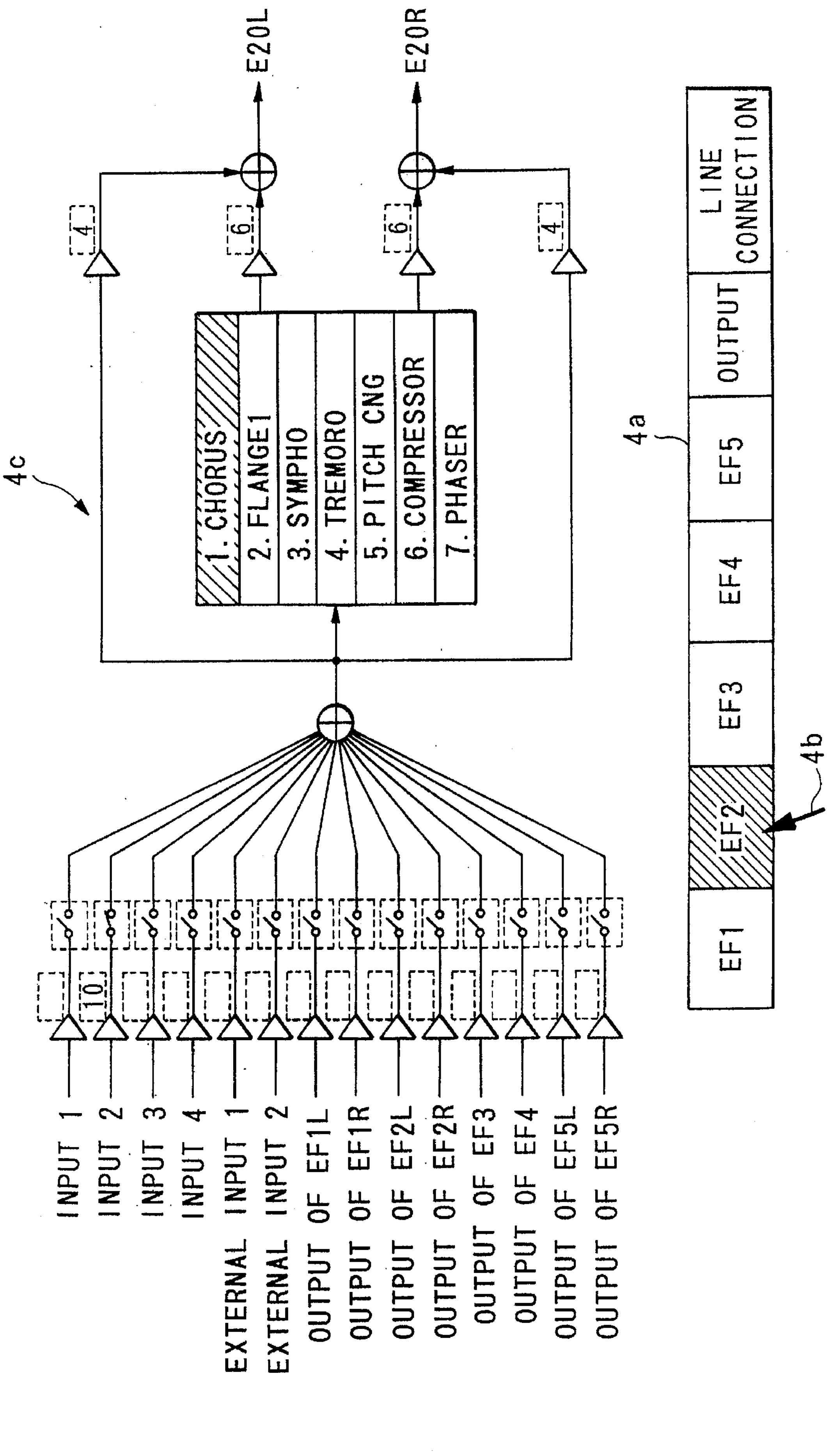
FIG. 23 shows an example of a graphic pattern which is displayed in connection with the sound effect EF2.

As shown in FIGS. 22 and 23, only seven kinds of sound effects containing the chorus effect (represented by "CHORUS") and a phaser effect (represented by "PHASER") can be selected for the sound effects EF1 and EF2 within eleven kinds of sound effects represented by the effect programs stored in the effect program memory 22 as shown in FIG. 17(*b*).

Figure 24:
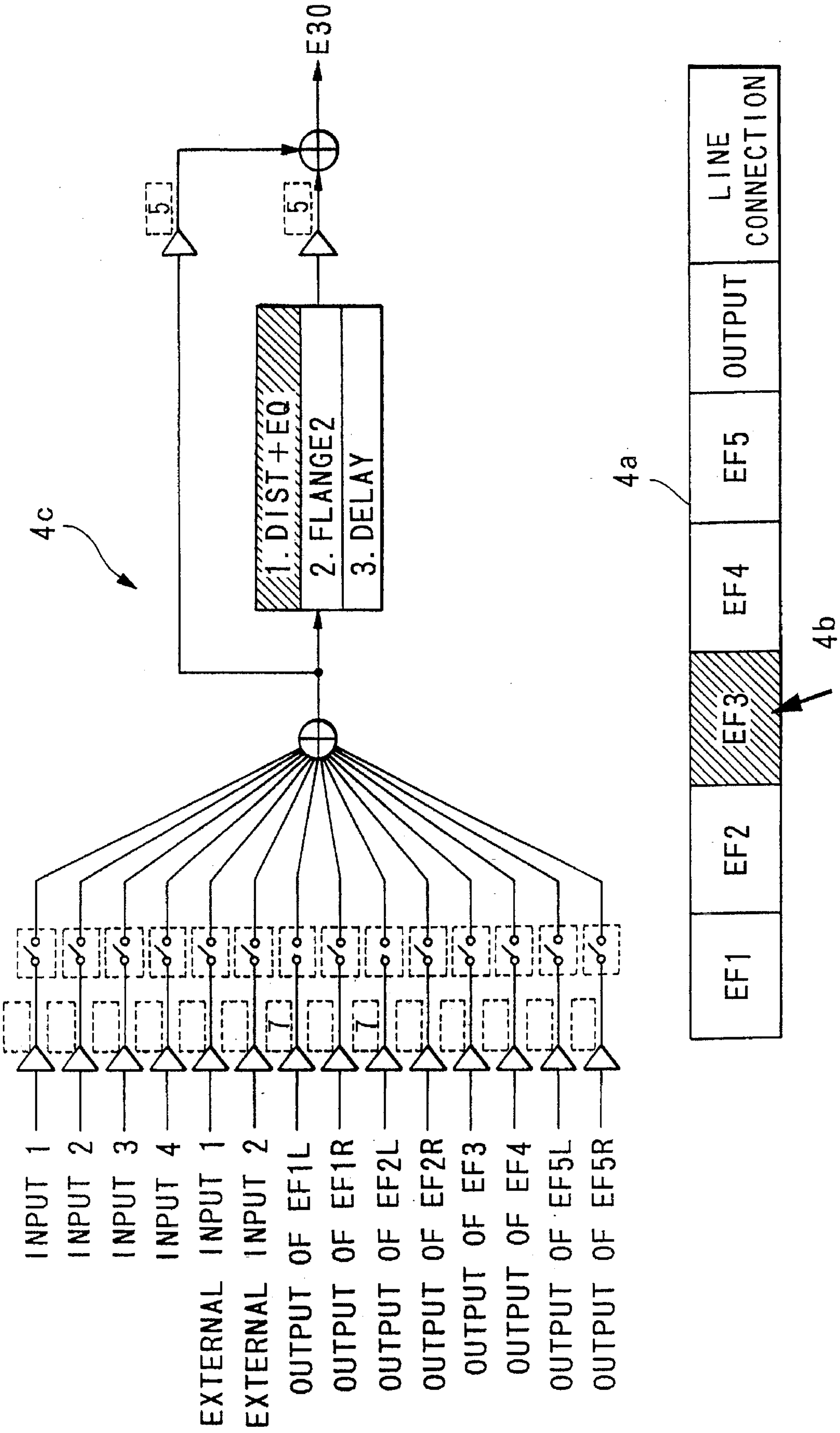
FIG. 24 shows an example of a graphic pattern which 1s displayed in connection with the sound effect EF3.
Figure 25:
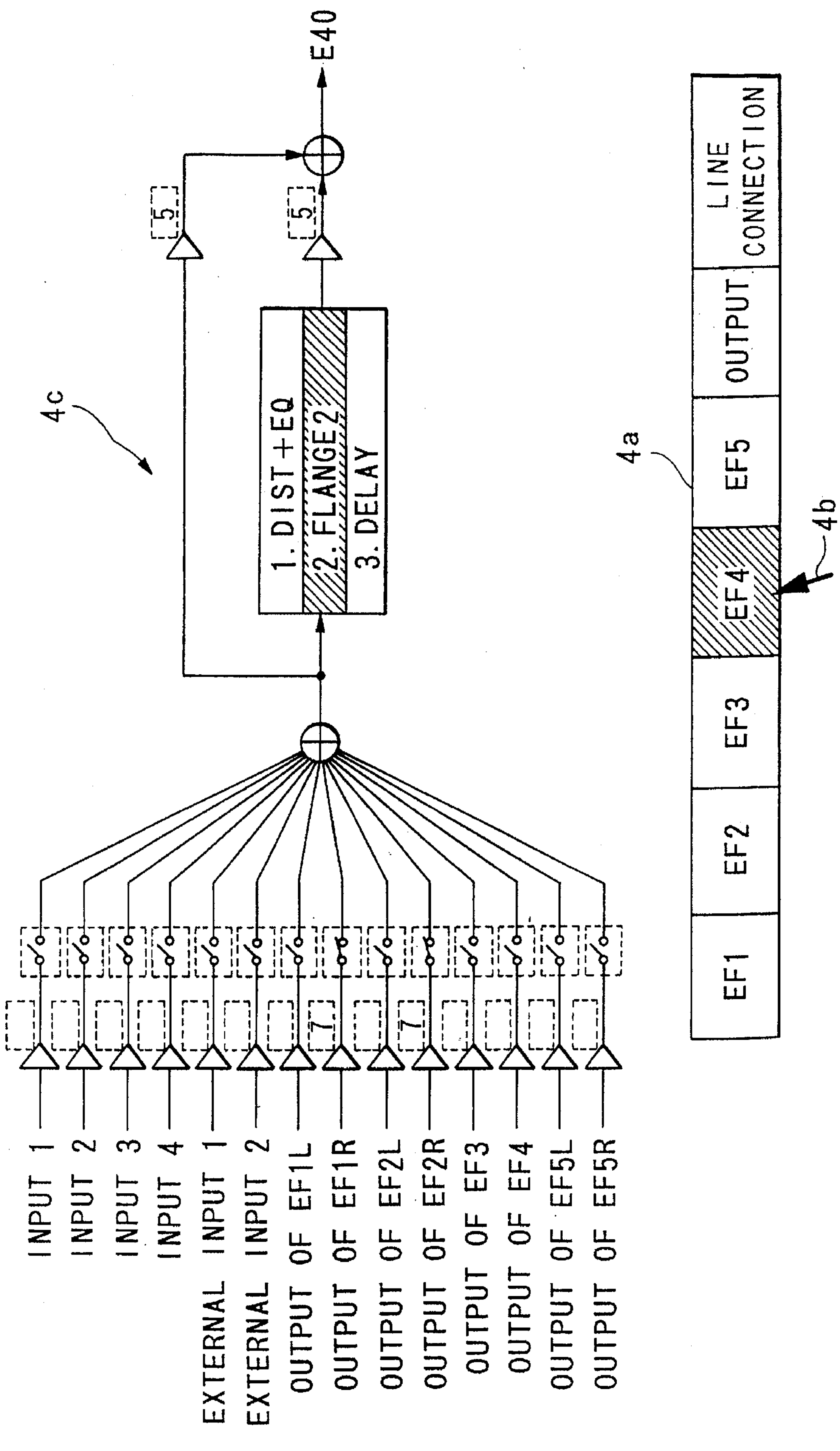
FIG. 25 shows an example of a graphic pattern which is displayed in connection with the sound effect EF4.

As shown in FIGS. 24 and 25, only three kinds of sound effects containing a distortion-with-equalizer effect (represented by "DIST+EQ") and a delay effect (represented by "DELAY") can be selected for the sound effects EF3 and EF4 within the eleven kinds of sound effects preset to the effect program memory 22.

Figure 26:
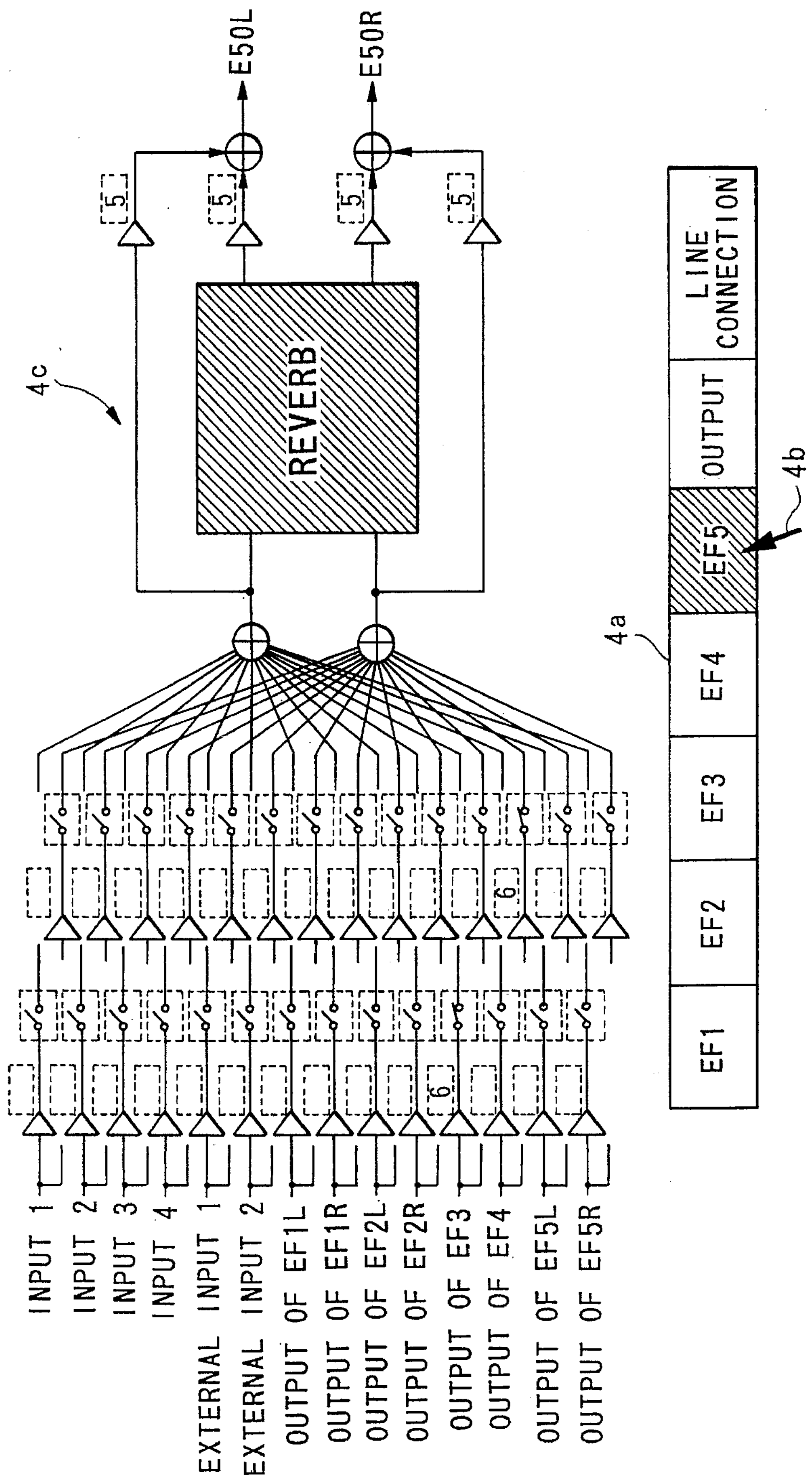
FIG. 26 shows an example of a graphic pattern which is displayed in connection with the sound effect EF5.
Figure 27:
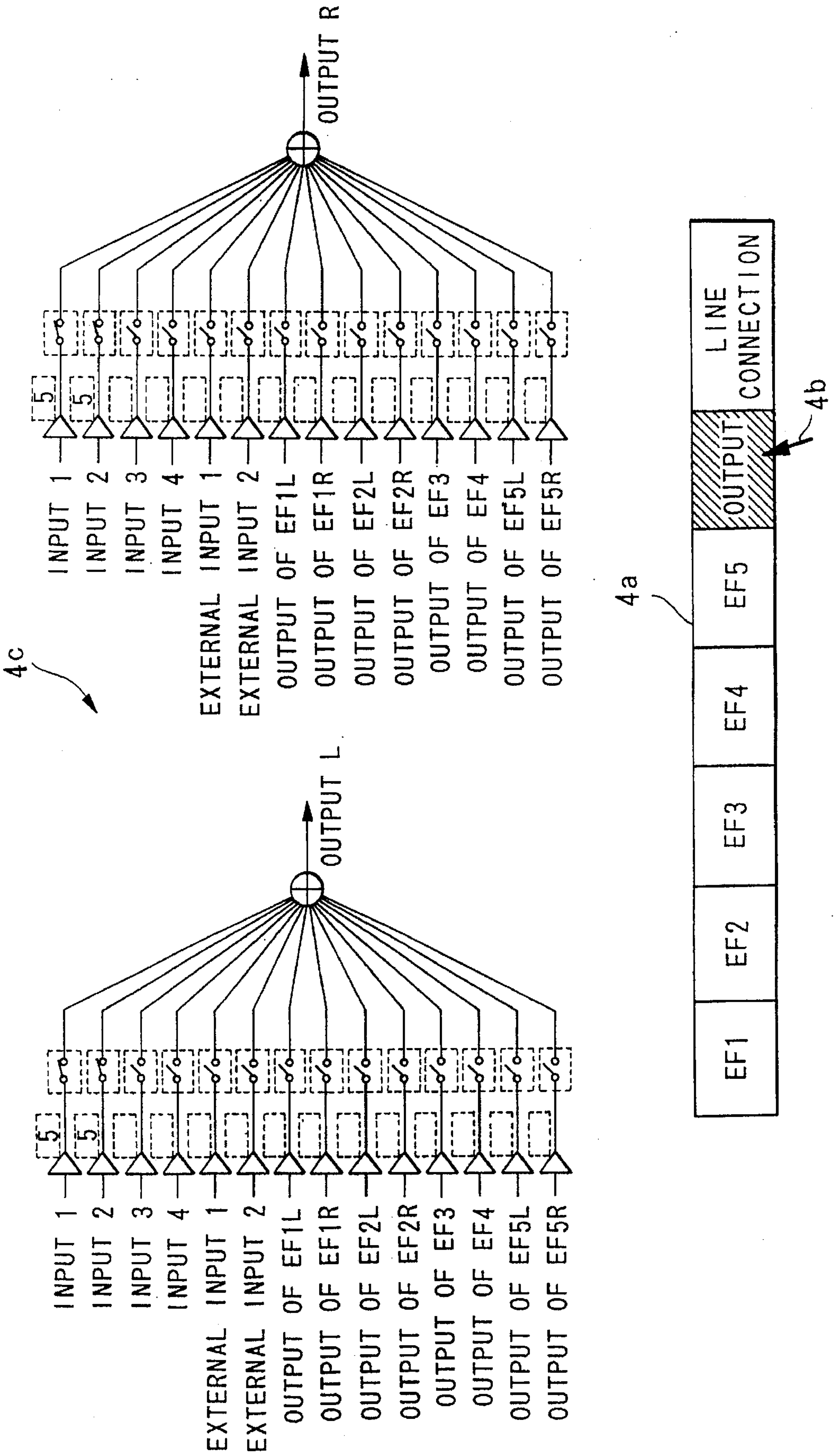
FIG. 27 shows an example of a graphic pattern which is displayed in connection with the output operations of the sound effect imparting apparatus.

Further, as shown in FIG. 26, only the reverberation effect (represented by "REVERB") can be selected for the sound effect EF5 within the eleven kinds of sound effects preset to the effect program memory 22.

As described above, a limited number of sound effects within the eleven kinds of sound effects preset to the effect program memory 22 can be selected for each of the sound effects EF1 to EF5. This is because the size of the effect program applied to each of the sound effects EF1 to EF5 is fixed in the present embodiment.

Meanwhile, when the performer operates the mouse 7 to correspondingly move the cursor and place it on an icon "LINE CONNECTION", and then, the performer clicks the mouse button, the CPU 1 reads out image information regarding the line connection from a line-connection-image-information area 87*g* (see FIG. 28) provided in the ROM 2. Further, the CPU 1 reads out the other data from the tone color memory 86 shown in FIG. 20, i.e., the name of the tone color from the tone-color-data area 86*a*, a pair of the effect number and switch data from each of the data areas 86*b* to 86*f* and the switch data from the output-data area 86*g*. On the basis of the above-mentioned data, a graphic image as shown in FIG. 22 is displayed at the display area 4*c* on the display screen of the display unit 4.

After completing the display process as described heretofore, the processing of the CPU 1 proceeds to step SC2 shown in FIG. 21.

In step SC2, a mixing-information changing process is carried out. In the mixing-information changing process, the mixing information containing the switch data and multiplication coefficient data is changed, so that an image corresponding to the mixing information changed is displayed by the display unit 4. For example, in order to impart the sound effect EF1 to the input data ID1 which is outputted from the sound source circuit 13 and then supplied to the mixer 18 of the sound effect imparting apparatus 14, the performer operates the mouse 7 to correspondingly move the cursor and place it on a pictorial display area **4*c*1 provided on the display screen (see FIG. 22), and then, the performer clicks the mouse button. In this case, the CPU 1 rewrites the switch data, corresponding to the above pictorial display area 4*c*1, which is stored in the data area 86*b* of the tone color memory 86 shown in FIG. 20, while the CPU 1 also changes the image of the pictorial display area 4*c*l. Further, the switch data rewritten by the CPU 1 is transferred to the sound-effect operation portion 19 (see FIG. 19), so that the switch data is written at its corresponding address in the switch register 35 provided in the mixing information supply portion 20**.

In the above-mentioned case, the switch data, which is stored in the data area **86*b* of the tone color memory 86 and which also corresponds to the input data ID1 supplied to the gate circuit GT provided in the pre-stage mixing portion MIXI1 (see FIG. 4), is changed from a switch-off state to a switch-on state. Thus, a switch-off image which is displayed at the pictorial display area 4*c*1 is changed to a switch-on image. Further, a numeric value corresponding to the multiplication coefficient of the multiplier MLT, corresponding to the input data ID1, provided in the pre-stage mixing portion MIXI1 is displayed at a numeric display area 4*c*2 which is arranged on the left of the pictorial display area 4*c*1 in the display screen of the display unit 4. Then, the changed switch data is transferred to the sound-effect operation portion 19 (see FIG. 8), so that it is written at its corresponding address in the switch register 35 under operations of the aforementioned circuit elements 39 to 42 shown in FIG. 9**.

When increasing the multiplication coefficient of the multiplier MLT, corresponding to the input data ID1, provided In the pre-stage mixing portion MIXI1 by one, the performer operates the mouse 7 so as to correspondingly move the cursor and place it on a right-half portion of the numeric display area **4*c*2 , and then, the performer clicks the mouse button once. Thus, the CPU 1 increments the multiplication coefficient data, stored in the data area 86*b* of the tone color memory 86 (see FIG. 20), by "1", so that a numeric value displayed is correspondingly increased by "1". Further, the multiplication coefficient data incremented by the CPU 1 is transferred to the sound-effect operation portion 19 (see FIG. 8), so that it is written at Its corresponding address in the volume register 37 provided in the mixing information supply portion 20**.

In contrast, when decreasing the multiplication coefficient of the multiplier MLT, corresponding to the input data ID1 regarding the sound effect EF1, provided in the pre-stage mixing portion MIXI1 by one, the performer operates the mouse 7 to correspondingly move the cursor **4*b* and place it on a left-half portion of the numeric display area 4*c*2** , and then, the performer clicks the mouse button once.

In the present embodiment, each of numeric values "0" to "10" can be selected as the multiplication coefficient of the multiplier MLT. Thus, in order to obtain the desired multiplication coefficient, the performer operates the mouse 7 to correspondingly move the cursor **4*b* and place it on the right-half portion or left-half portion of the numeric display area 4*c*2 on the display screen of the display unit 4**, and then, the performer clicks the mouse button by plural times.

In the meantime, the performer can select a series of operations in which the input data ID1 and ID2 outputted from the sound source circuit 13 are mixed together by the mixer 18; and then, the sound effect EF1 is applied to the mixed data in the sound effect imparting apparatus 14. Such operations can be changed to another series of operations in which the sound effect EF1 is imparted to the input data ID1 only. In this case, the performer operates the mouse 7 to move the cursor **4*b* and place it on the pictorial display area corresponding to the input data ID2 shown in FIG. 22, and then, the performer clicks the mouse button. Thus, under the operations of the CPU 1, the switch data, which is stored in the data area 86*b* of the tone color memory 86 (see FIG. 20) and which also corresponds to the input data ID2 supplied to the gate circuit GT of the pre-stage mixing portion MIXI1, is changed from a switch-on state to a switch-off state; and consequently, a switch-on image of the pictorial display area is changed to a switch-off image, while erasing a numeric value which is displayed at the numeric display area as the multiplication coefficient of the multiplier MLT, corresponding to the input data ID2, provided in the pre-stage mixing portion MIXI1. Then, the switch data changed by the CPU 1 is transferred to the sound-effect operation portion 19 as shown in FIG. 8. Thus, the switch data changed is written at its corresponding address in the switch register 35 under the operations of the circuit elements 39 to 42 shown in FIG. 9**.

Incidentally, the operations similar to the above-mentioned operations regarding the sound effect EF1 are also performed with respect to each of the other sound effects EF2 to EF5; hence, the detailed description thereof will be omitted.

When completing the mixing-information changing process as described heretofore, the processing of the CPU 1 proceeds to step SC3 shown in FIG. 21.

In step SC3, the CPU 1 performs a sound-effect changing process, by which the kind of the sound effect to be employed as each of the sound effects EF1 to EF5 is changed so that the changed sound effect is displayed by the display unit 4. According to the sound-effect changing process, it is possible to change the kind of the sound effect EF1 from the chorus effect (represented by "CHORUS" in FIG. 22) to a flange-1 effect (represented by "FLANGE1"), for example. In this case, the performer operates the mouse 7 to move the cursor **4*b* and place it on an icon "2. FLANGE1" displayed at the sound-effect display area 4*c*3 (see FIG. 22) on the display screen of the display unit 4, and then, the performer clicks the mouse button once. Thus, the CPU 1 writes the effect number for the flange-1 effect, representing the changed sound effect, into the data area 86*b* of the tone color memory 86 shown in FIG. 20. By use of the effect number, the CPU 1 refers to the head address ROM (see FIG. 17**(*a*)) so as to read out the corresponding head address. This head address is transferred to the sound effect imparting apparatus 14, in which it is written into the area **77*a* of the head address register 77 (see FIG. 16) provided in the address producing portion 23**.

Figure 30:
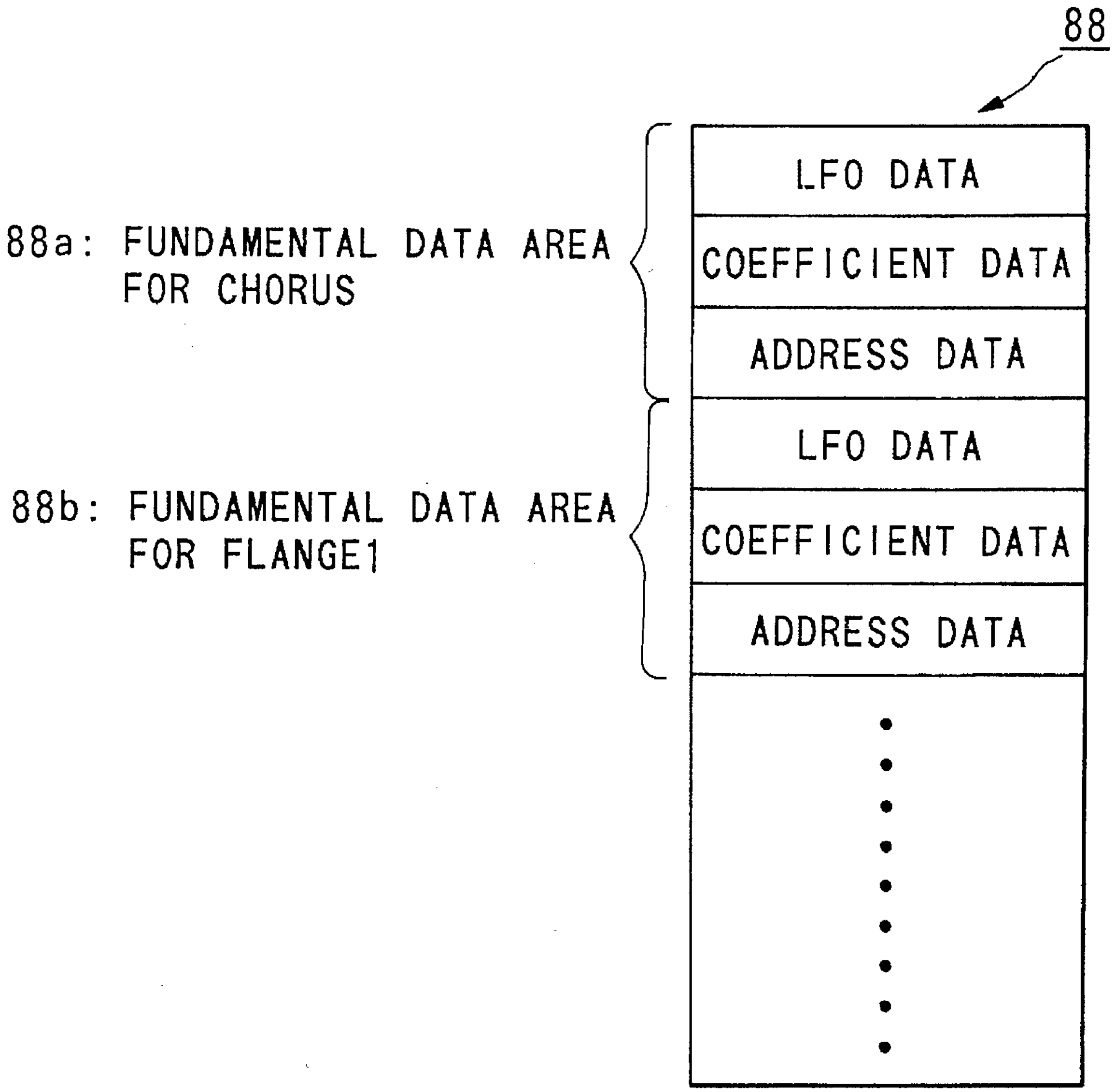
FIG. 30 shows a storage map of a fundamental data ROM.

Moreover, the CPU 1 accesses to an area **88*b* of a fundamental data ROM 88 (see FIG. 30) which forms a part of the ROM 2. This area 88*b* is provided for the flange-1 effect, and it stores fundamental data (i.e., default values) of the LFO data, coefficient data and address data in connection with the flange-1 effect. Those fundamental data read from the area 88*b* of the fundamental data ROM 88 are written into the data area 86*b* of the tone color memory 86 (see FIG. 20), while the CPU 1 changes the corresponding images displayed by the display unit 4. In other words, the CPU 1 stops enhancing the Icon "1. CHORUS" so as to enhance another icon "2**. FLANGE1".

Furthermore, the CPU 1 transfers the fundamental data of the LFO data, coefficient data and address data to the sound-effect operation portion 19 shown in FIG. 8, in which those data are respectively written at their corresponding addresses of the LFO register 44, coefficient register 46 and address register 47.

Incidentally, the operations as similar to the above-mentioned operations regarding the sound effect EF1 are performed with respect to each of the other sound effects EF2 to EF5; hence, the detailed description thereof will be omitted.

After completing the sound-effect changing process described heretofore, the processing of the CPU 1 proceeds to step SC4 shown in FIG. 21.

Figure 31:
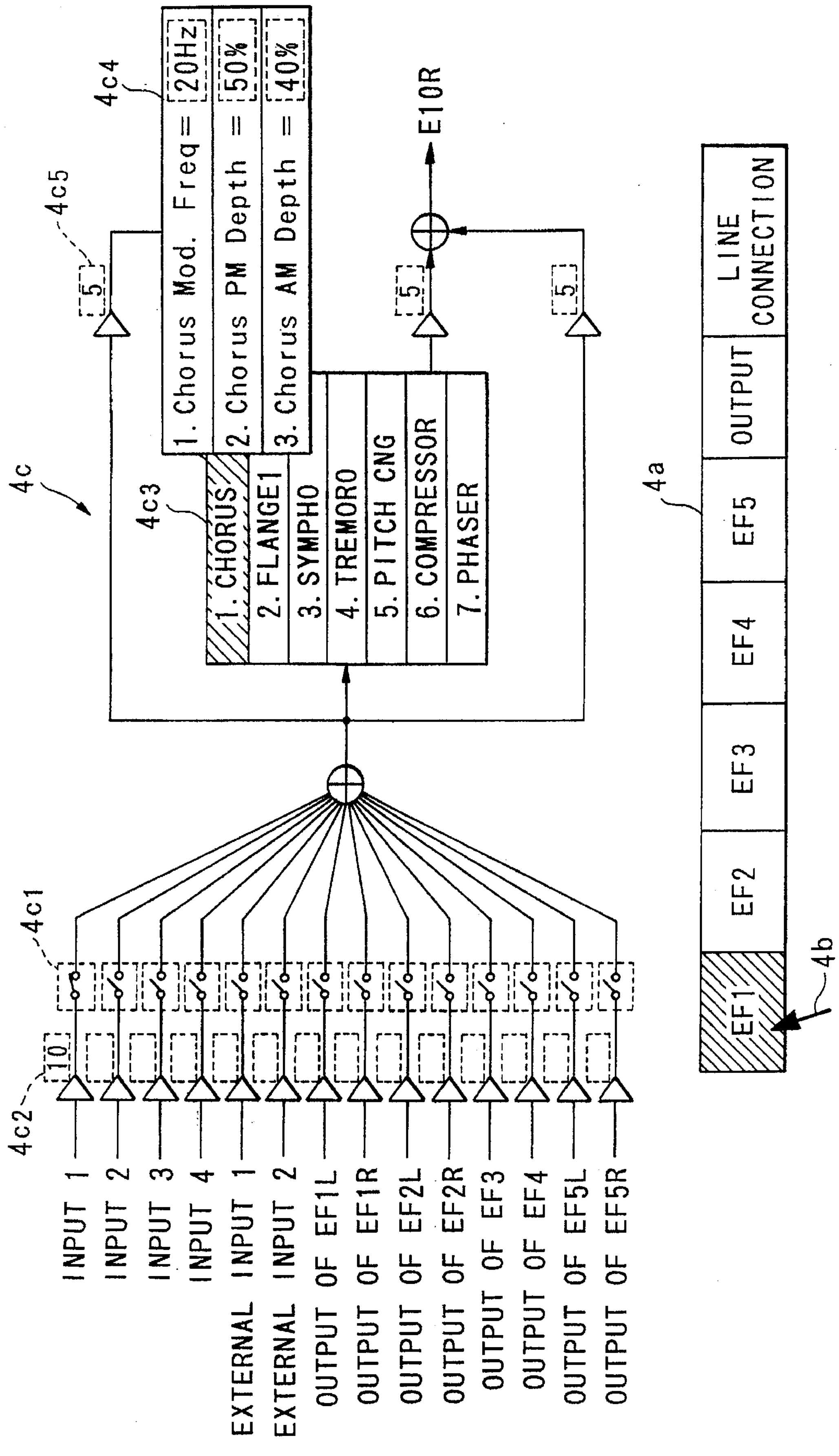
FIG. 31 shows a graphic pattern which is used to change effect parameters with respect to the sound effect EF1.

In step SC4, the CPU 1 performs an effect-parameter changing process, by which the effect parameters used for each of the sound effects EF1 to EF5 are changed, so that the changed effect parameters are displayed by the display unit 4. According to the effect-parameter changing process, it is possible to change several kinds of effect parameters used for the chorus effect selected as the sound effect EF1, for example. In order to do so, the performer operates the mouse 7 to move the cursor 4*b* and place it on the icon "1. CHORUS" displayed in the sound-effect display area 4*c*3 (see FIG. 22) on the display screen of the display unit 4, and then, the performer clicks the mouse button twice. Thus, the CPU 1 reads out the corresponding image information from the ROM 2, while the CPU 1 also reads out the LFO data, coefficient data and address data from the data area 86*b* of the tone color memory 86 shown in FIG. 20. Then, the CPU 1 works to display a window area in proximity to the icon "1. CHORUS" in the sound-effect display area 4*c*3 as shown in FIG. 31. This area displays current values of three effect parameters in connection with the chorus effect.

In an example shown in FIG. 31, a chorus-modulation frequency (represented by "Chorus Mod. Freq") is set at 20 Hz; a chorus-pitch-modulation depth (represented by "Chorus PM Depth") is set at 50%; and a chorus-amplitude-modulation depth (represented by "Chorus AM Depth") is set at 40%.

In order to change the chorus-modulation frequency, the performer operates the mouse 7 to move the cursor 4*b* and place it on a window area 4*c*4 which is arranged at a right portion of a display area in which characters "1. Chorus Mod. Freq=" are displayed, and then, the performer clicks the mouse button by plural times. In response to the clicking operations of the mouse button, the CPU 1 changes the displayed frequency value so as to display predetermined frequency values, e.g., 20 Hz, 40 Hz, 60 Hz, . . . at the window area 4*c*4 in turn. In response to the chorus modulation frequency changed, the CPU 1 changes the effect parameters, i.e., LFO data, coefficient data and address data which are stored in the data area 86*b* of the tone color memory 86 (see FIG. 20). Further, the LFO data, coefficient data and address data which are changed by the CPU 1 are transferred to the sound-effect operation portion 19 (see FIG. 8), in which those data are respectively written at their corresponding addresses of the LFO register 44, coefficient register 46 and address register 47.

Incidentally, the operations as similar to the above-mentioned operations regarding the sound effect EF1 are performed with respect to each of the other sound effects EF2 to EF5. More specifically, the performer moves the cursor 4*b* and place it on the enhance portion of the display area 4*c*3, and then, the performer clicks the mouse button twice; and consequently, the effect parameters corresponding to the enhanced portion are displayed on the display screen, so that the performer can arbitrarily change each of the values of the effect parameters.

After completing the effect-parameter changing process described heretofore, the processing of the CPU 21 proceeds to step SC5 shown in FIG. 21.

In step SC5, the CPU 1 performs an effect-balance changing process, by which an effect balance applied between the foregoing operation data and mixed data with respect to each of the sound effects EF1 to EF5 is changed, so that the changed effect balance is displayed by the display unit 4. For example, a ratio by which the mixed data EM1 is contained in the output data E1OL in connection with the sound effect EF1 can be changed by the performer. In order to raise such ratio, the performer operates the mouse 7 to move the cursor 4*b* and place it on a left half portion of a numeric display area 4*c*5, and then, the performer clicks the mouse button by plural times. Thus, the CPU 1 changes the coefficient data stored in the data area 86*b* of the tone color memory 86 shown in FIG. 20, while the CPU 1 also changes the corresponding images displayed by the display unit 4. Then, the CPU 1 transfers the changed coefficient data to the sound-effect operation portion 19 (see FIG. 8), in which it is written at its corresponding address of the coefficient register 46.

Incidentally, a method of changing the coefficient data is similar to the aforementioned method of increasing or decreasing the multiplication coefficient of the multiplier MLT, corresponding to the input data ID1, which is provided in the pre-stage mixing portion MIXI1 in connection with the sound effect EF1; hence, the detailed description thereof will be omitted.

Moreover, the operations as similar to the above-mentioned operations regarding the sound effect EF1 are performed with respect to each of the sound effects EF2 to EF5; hence, the detailed description thereof will be omitted.

After completing the effect-balance changing process described heretofore, the processing of the CPU 1 returns back to the aforementioned main routine, in which the processing proceeds to step SA5.

Next, the operation timings of the mixer 18 and sound-effect operation portion 19 will be described in detail by referring to timing charts shown in FIGS. 3, 32 and 33. FIG. 3(*a*) shows the count values outputted from the counter 79 shown in FIG. 15, while FIG. 3(*b*) shows input timings at which the effect programs are inputted into the sound-effect operation portion 19. As shown in FIG. 15, the effect programs respectively corresponding to the sound effects EF1 to EF5 which are selected by the performer are sequentially read out from the head addresses of the effect program memory 22, which are respectively stored in the areas 77*a* to 77*e* of the head address register 77; and then, those effect programs are inputted into the sound-effect operation portion 19 at the input timings shown in FIG. 3(*b*). The above-mentioned reading operations and inputting operations are completely carried out within 1 DAC cycle.

FIG. 3(*c*) indicates input timings at which the aforementioned mixed data EM1, EM2, EM3, EM4, EM5L and EM5R given from the temporary RAM 63 (see FIG. 8) are respectively inputted into the sound-effect computation circuit ECC. As shown in FIG. 3(*c*), each of the mixed data EM1 to EM4 is inputted into the sound-effect computation circuit ECC at a first operational step of each of the sound effects EF1 to EF4, while the mixed data EM5L and EM5R are sequentially inputted into the sound-effect computation circuit ECC at first two operational steps of the sound effect EF5.

FIG. 3(*d*) indicates input timings at which the operation data EX1L, EX1R, EX2L, EX2R, EX3, EX4, EX5L and EX5R given from the sound-effect computation circuit ECC are respectively inputted into the temporary RAM 63. As shown in FIG. 3(*d*), each of those data is inputted into the temporary RAM 63 at a certain operational step which is delayed behind the first operational step of each of the sound effects EF1 to EF5 by a delay time corresponding to four clocks $\phi_0$. In FIG. 3(*d*), a symbol "D" denotes a delay time corresponding to one clock $\phi_0$. The reason why the input timing of the operation data is delayed behind the input timing of the mixed data by the delay time corresponding to four clocks $\phi_0$ is that the sound-effect computation circuit ECC requires the computation time corresponding to four clocks $\phi_0$.

FIG. 3(*e*) shows the control codes to be supplied to the selector 76 shown in FIG. 8. When each control code is set at "1" level, the selector 76 selectively outputs the data supplied to its input terminal "a". As described before, the mixed data EM1, EM2, EM3, EM4, EM5L and EM5R outputted from the delay circuit 32 (see FIG. 6) of the mixer 18 are supplied to the input terminal "a" of the selector 76, so that each of those data is selectively outputted when the control code is set at "1" level. FIG. 3(*f*) shows input timings at which the mixed data outputted from the selector 76 are respectively inputted into the temporary RAM 63. Incidentally, a timing at which each of the mixed data is produced will be described later.

FIG. 3(*g*) shows input timings at which the musical tone data outputted from the delay circuit 32 shown in FIG. 6 are inputted to the parallel-to-serial converter 34 provided in the mixer 18, wherein those musical tone data are eventually outputted toward the external device and the like. In other words, those input timings shown in FIG. 3(*g*) indicate output timings of the output-stage mixing portions MIXO7 and MIXO8 shown in FIG. 5(E) and 5(F).

FIG. 3(*h*) shows the control code which is supplied to the selector 28 shown in FIG. 8. When the control code is set at "1" level, the selector 28 selectively outputs the data supplied to its input terminal "b". More specifically, the aforementioned operation data EX1L, EX1R, EX2L, EX2R, EX3, EX4, EX5L and EX5R read from the temporary RAM 63 shown in FIG. 8 are selectively outputted from the selector 28 when the control code is at "1" level.

On the other hand, when the control code supplied to the selector 28 is set at "0" level, the selector 28 selectively outputs the data supplied to its input terminal "a". More specifically, the aforementioned input data ID1 to ID4, external input data GD1, GD2, output data E1OL, E1OR, E2OL, E2OR, E3O, E4O, E5OL and E5OR outputted from the mixer RAM 27 or latch circuit 27*a* are selectively outputted from the selector 28 when the control code is set at "0" level.

Incidentally, when both of the control codes respectively shown in FIGS. 3(*e*) and 3(*h*) are set at "0" level, the sound-effect computation circuit ECC can write the data into the temporary RAM 63 or read the data from the temporary RAM 63.

FIG. 3(*i*) shows input timings at which the data are inputted into the multiplier portion 29 provided in the mixer 18. In FIG. 3(*i*), periods of time represented by symbols "MIXI1" to "MIXI6", "MIXO7" and "MIXO8" indicate input timings corresponding to the aforementioned pre-stage mixing portions MIXI1 to MIXI6 and the output-stage mixing portions MIXO7 and MIXO8 respectively shown in FIGS. 4, 5(A) to 5(F). Incidentally, a period of time represented by a term "EFFECT WAVEFORM MIXED" shown in FIG. 3(*i*) indicates input timings corresponding to the post-stage mixing portions MIXO1 to MIXO5 respectively shown in FIGS. 4 and 5(A) to 5(D). Further, a mixing operation corresponding to each of the pre-stage mixing portions MIXI1 to MIXI6 and output-stage mixing portions MIXO7 and MIXO8 is carried out in a period of time corresponding to twenty-eight clocks $\phi_0$, while an operation of mixing the effect waveforms is carried out in a period of time corresponding to thirty-two clocks $\phi_0$. As described before, the operation clock of the mixer 18 is represented by "$\phi_1$"; however, in the timing charts shown in FIGS. 3, 32 and 33, a numeric value representing the number of clocks $\phi_1$ (i.e., 0, 2, 4, . . . ) is indicated by the timing of the clock $\phi_0$ in order to simplify the illustration of each timing chart.

Figure 32:
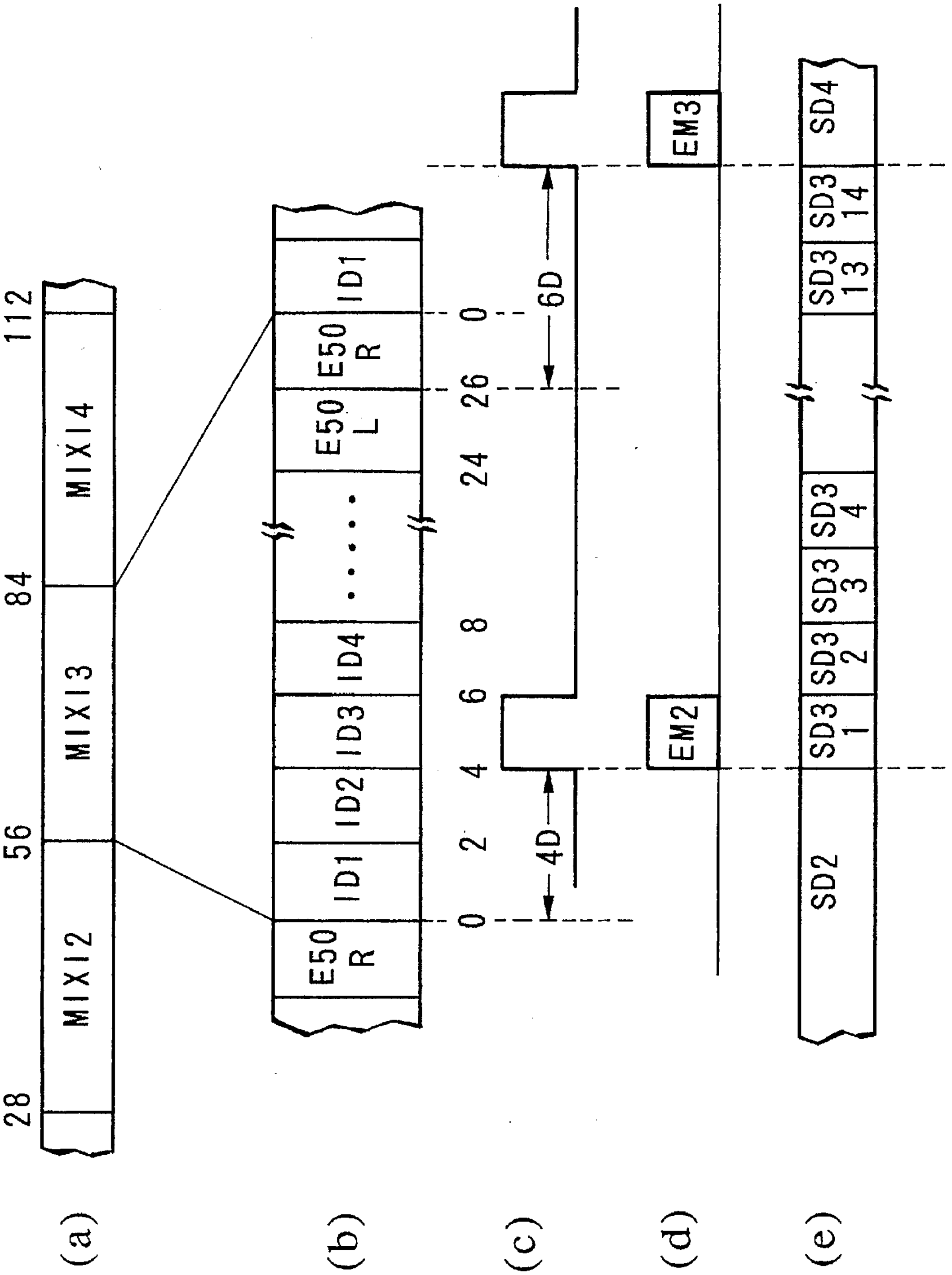
FIGS. 32 and 33 are timing charts each showing several kinds of operation timings at which mixing operations and/or computation are sequentially carried out.

FIG. 32 shows input timings corresponding to the pre-stage mixing portion MIXI3. Herein, FIG. 32(*a*) shows a part of FIG. 3(*i*), while FIG. 32(*b*) indicates read-out timings for the data which are respectively read from the mixer RAM 27. As shown in FIG. 32(*b*), the data stored in the mixer RAM 27 are sequentially read out in an order of the addresses shown in FIG. 7.

FIG. 32(*c*) indicates a clear signal which is provided to clear the gate 33 shown in FIG. 6. The reason why a leading-edge timing of the clear signal is delayed behind the first operational step (represented by a numeric value "0") of the mixing operation corresponding to the pre-stage mixing portion MIXI3 by a certain period of time corresponding to four clocks $\phi_0$ is that the operation time of the multiplier portion 29 is set equal to four clocks $\phi_0$. As described before, the mixing operation of the aforementioned pre-stage mixing portion MIXI2 results in a production of the mixed data EM2 to be supplied to the sound effect portion EF2. At the leading-edge timing of the clear signal, the mixed data EM2 is stored at the predetermined address of the temporary RAM 63 provided in the sound-effect operation portion 19 as shown in FIG. 32(*d*). Similarly, at the next leading-edge timing of the clear signal which is delayed behind the first operational step of the mixing operation of the pre-stage mixing portion MIXI4 by four clocks $\phi_0$, the mixed data EM3 outputted from the pre-stage mixing portion MIXI3 is stored at the predetermined address of the temporary RAM 63 provided in the sound-effect operation portion 19 as shown in FIG. 32(*d*). In order to store the mixed data in the temporary RAM 63 at the above-mentioned timing, the control code (see FIG. 3(*e*)) supplied to the selector 76 is set at "1" level at a timing which is delayed behind a start timing of each mixing operation (represented by "MIX1" etc. in FIG. 3(*i*)) by "6D–2D", while each mixed data outputted from the selector 76 is inputted into the temporary RAM 63 at a timing (see FIG. 3(*f*)) which is delayed behind the start timing of each mixing operation by "6D–2D".

FIG. 32(*e*) shows timings at which the switch data stored in the switch register 35 provided in the sound-effect operation portion 19 shown in FIG. 8 are converted into serial switch signals SD by the parallel-to-serial converter 36 so that they are sequentially supplied to the gate 30 provided in the mixer 18 shown in FIG. 6. The reason why there provided fourteen switch signals SD3 in FIG. 32(*e*) is that the maximum fourteen kinds of musical tone data can be inputted into the mixer 18. Within the fourteen kinds of musical tone data, a certain number of the musical tone data are designated by the performer in order to perform the mixing operations, so that the corresponding switch signals SD3 are only set at "1" level. In other words, the remained musical tone data are not subjected to mixing operations, so that the corresponding switch signals SD3 are remained at "0" level.

Figure 33:
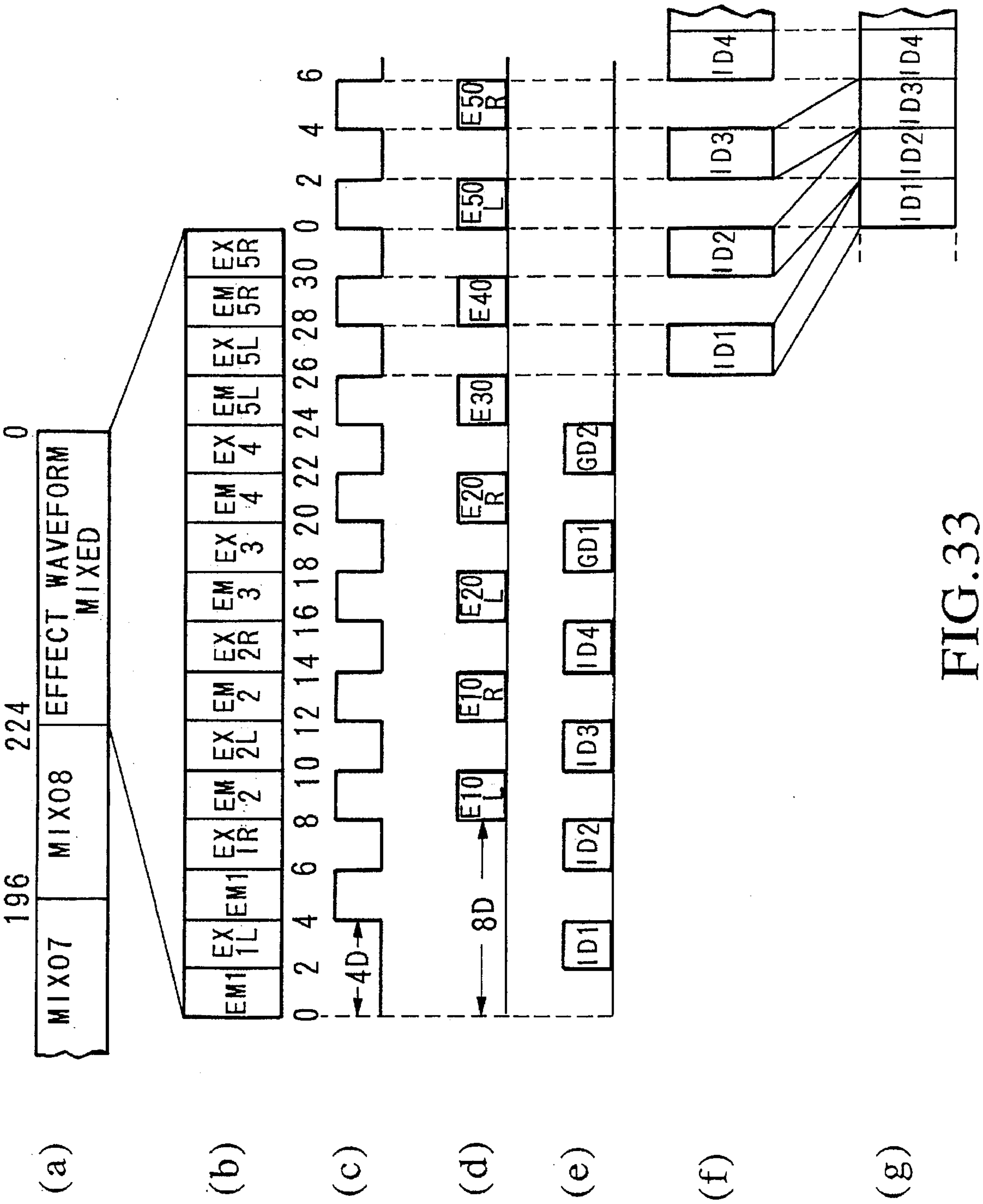

FIG. 33 shows input timings corresponding to the post-stage mixing portions MIXO1 to MIXO5 shown in FIGS. 4 and 5(A) to 5(D). FIG. 33(*a*) indicates a part of FIG. 3(*i*), while FIG. 33(*b*) indicates read-out timings at which the data are sequentially read from the temporary RAM 63 provided in the sound-effect operation portion 19 shown in FIG. 8. As shown in FIG. 33(*b*), the data stored in the temporary RAM 63 are sequentially read out in a predetermined order, by which the mixed data EM1, operation data EX1L, mixed data EM1, operation data EX1R, . . . are sequentially read out. In other words, the dry musical tone data and the wet musical tone data are alternatively read out from the temporary RAM 63.

FIG. 33(*c*) Indicates a clear signal which clears the gate 33 shown in FIG. 6. On the basis of the same reason which has been described in conjunction with FIG. 32(*c*), a leading-edge timing of the clear signal shown in FIG. 33(*c*) is delayed behind the first operational step of the mixing operation by four clocks $\phi_0$. The reason why the level of the clear signal is alternatively changed between "1" and "0" is to carry out a mixing operation on a pair of the dry musical tone data and wet musical tone data, and then, to clear the result of the mixing operation.

FIG. 33(*d*) shows write timings at which the output data of the post-stage mixing portions are sequentially written into the mixer RAM 27 provided In the mixer 18 shown in FIG. 6. In this case, due to the complicated operations to be performed by the multiplier portion 29 and the accumulator consisting of the circuits elements 30 to 33, the write timing of the output data E1OL is delayed behind the first operational step of the mixing operation by eight clocks $\phi_0$. More specifically, the mixed data EM1 outputted from the pre-stage mixing portion MIXI1 (see FIG. 4) is multiplied by the predetermined multiplication coefficient by the multiplier portion 29; and then, the corresponding operation data EX1L outputted from the sound effect portion EF1 is further multiplied by the predetermined multiplication coefficient by the multiplier portion 29; thereafter, those data are accumulated by the accumulator.

FIG. 33(*e*) shows write timings at which the data are written into the mixer RAM 27 provided in the mixer 18 shown in FIG. 6 in a certain DAC cycle, while FIG. 33(*f*) shows read-out timings at which the fourteen kinds of input data, containing the input data ID1, ID2, ID3, . . . , used in the pre-stage mixing portion are sequentially read from the mixer RAM 27. Among those data, the first three data ID1, ID2 and ID3 are read from the mixer RAM 27 and are set in the latch circuit 27*a* in advance during the last duration of the current DAC cycle and the first duration of the next DAC cycle. This is because only three data can be read from the mixer RAM 27 in the next DAC cycle. More specifically, in the next DAC cycle as shown in FIG. 33(*d*), the output data EF5OL is written into the mixer RAM 27 in the duration corresponding to the first two clocks $\phi_0$; and then, the output data EF5OR is written into the mixer RAM 27 during the duration between a fourth-clock timing and a sixth-clock timing, resulting that a limited number of the input data, i.e., only three input data ID1, ID2 and ID3, can be read from the mixer RAM 27 in the next DAC cycle. FIG. 33(*g*) shows output timings at which the data are sequentially outputted from the selector 28 shown in FIG. 6 in the next DAC cycle. As shown in FIG. 33(*g*), only three input data ID1, ID2 and ID3 are read from the latch circuit 27*a*, while the other data are read from the mixer RAM 27. Thus, the mixing operation of the pre-stage mixing portion MIXI1 can be performed at the timing which is similar to the operation timing of the mixing operation corresponding to the pre-stage mixing portion MIXI3 as shown in FIG. 32.

As described heretofore, on the basis of the switch data stored in the switch register 35 and the multiplication coefficient data stored in the volume register 37, the mixer 18 performs the mixing operations on the input data ID1 through the output data E5OR, stored in the mixer RAM 27, thus producing the mixed data EM1 to EM5R during the duration between operational-step 0 to operational-step 167 (see FIG. 3). Then, those data are written into the temporary RAM 63 at the timings shown in FIG. 3(*f*).

Further, on the basis of the switch data stored in the switch register 35 and the multiplication coefficient data stored in the volume register 37, the mixer performs the mixing operations on the input data ID1 through the output data E5OR stored in the mixer RAM 27, thus producing the output data OUT1 and OUT2 during the duration between operational-step 168 and operational-step 223 (see FIG. 3). Those data are outputted to the sound system 17 at the timings as shown in FIG. 3(*g*).

In the duration between operational-step 224 and operational-step 255, the mixer 18 performs the mixing operations on the mixed data EM1 to EM5R and the operation data EX1L to EX5R stored in the temporary RAM 63 so as to produce the output data E1OL to E5OR on the basis of the multiplication coefficient data stored in the volume register 37. Those data are written into the mixer RAM 27 at the timings as shown in FIG. 3(*d*). Incidentally, during the operational step (see FIG. 33(*e*)) in which the above-mentioned output data E1OL to E5OR are not written into the mixer RAM 27, the aforementioned input data ID1 through the external input data GD2 are written into the mixer RAM 27.

As shown in FIG. 3(*c*), the mixed data EM1 to EM5R stored in the temporary RAM 63 are inputted into the sound-effect computation circuit ECC and the delay RAM 48 at the first operational step (or first and second operational steps) of the mixing operations corresponding to the sound effects EF1 to EF5. Those data EM1 to EM5R inputted into the sound-effect computation circuit ECC and the delay RAM 48 are subjected to computations and delay operations, so that they are converted into the operation data EX1L to EX5R, which are written into the temporary RAM 63 at the timings as shown in FIG. 3(*d*).

Figure 34:
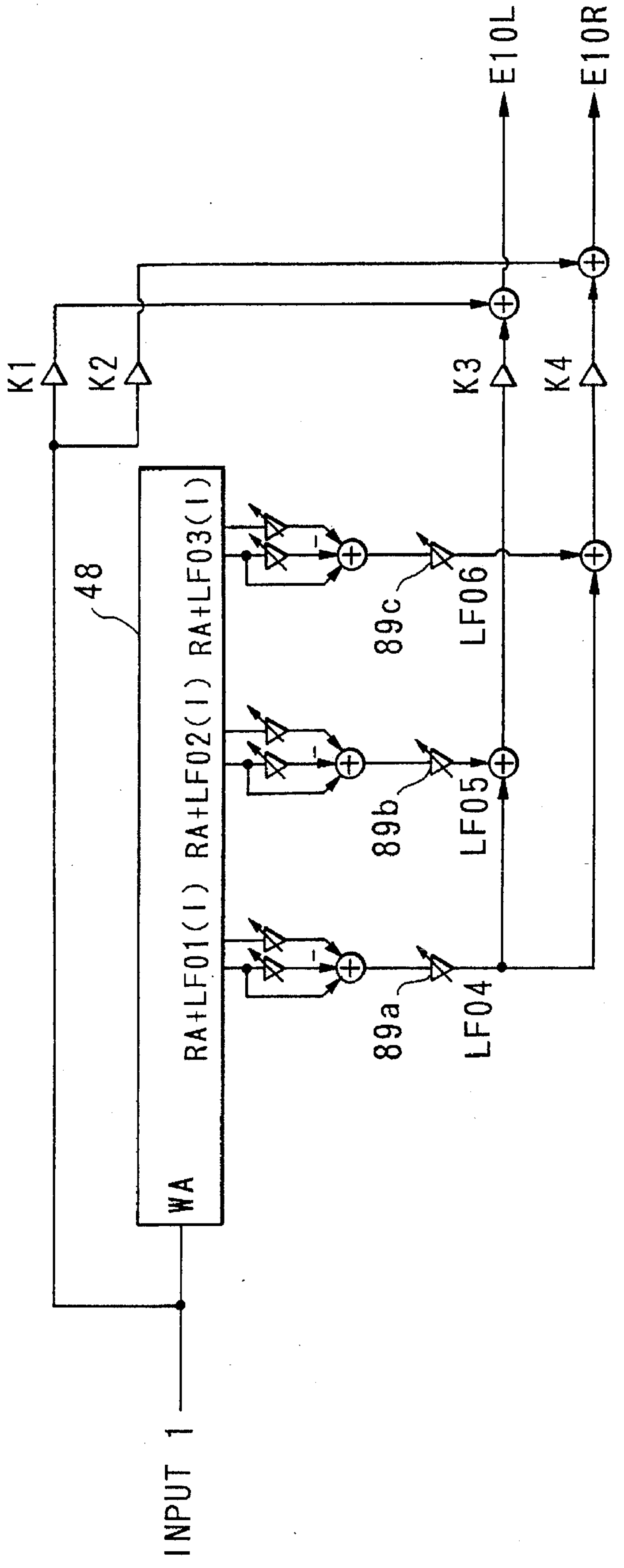
FIG. 34 is a block diagram showing a configuration of a chorus-effect imparting portion.
Figure 35A:
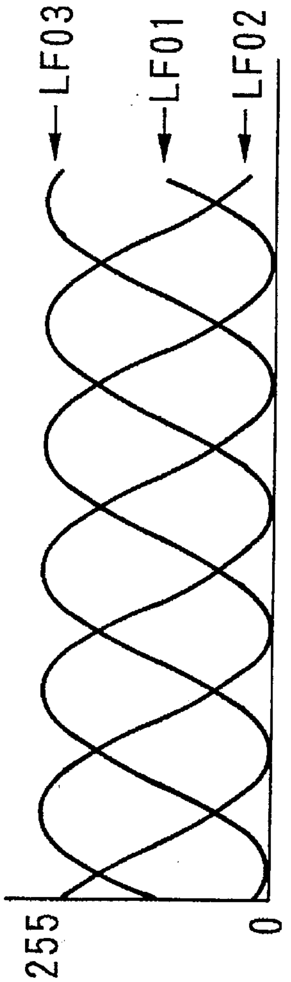
FIGS. 35(A) and 35(B) are graphs showing examples of low-frequency-oscillation waveforms.
Figure 35B:
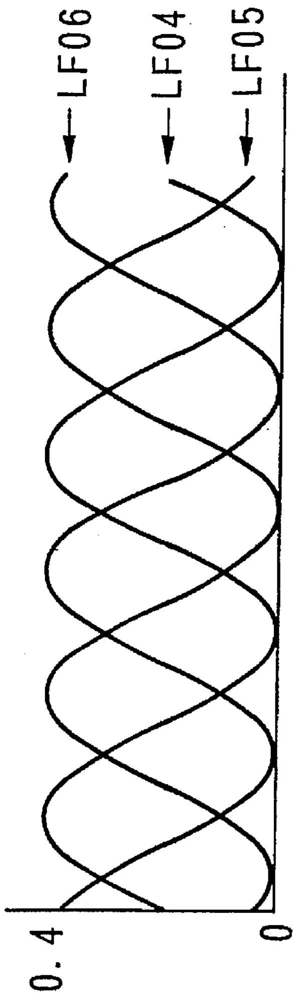

Next, FIG. 34 shows an example of a chorus-effect imparting portion which works to impart the chorus effect to the musical tone data, displayed by the display unit 4 as shown in FIG. 22, in cooperation with the mixer (see FIG. 6), sound-effect operation portion 19 and delay RAM 48 (see FIG. 8). In the delay RAM 48 shown in FIG. 34, terms "RA+LFO1(I)", "RA+LFO2(I)" and "RA+LFO3(I)" indicate read-out addresses. These read-out addresses also indicate that the data to be read out is modulated in response to three LFO waveforms LFO1 to LFO3 as shown in FIG. 35(A), in other words, the pitch modulation is performed responsive to those waveforms. Each of multiplication coefficients applied to multipliers 89*a* to 89*c* is altered responsive to each of LFO waveforms LFO4 to LFO6 shown in FIG. 35(B). In other words, the data respectively inputted into the multipliers 89*a* to 89*c* are subjected to amplitude modulation.

Figure 37:
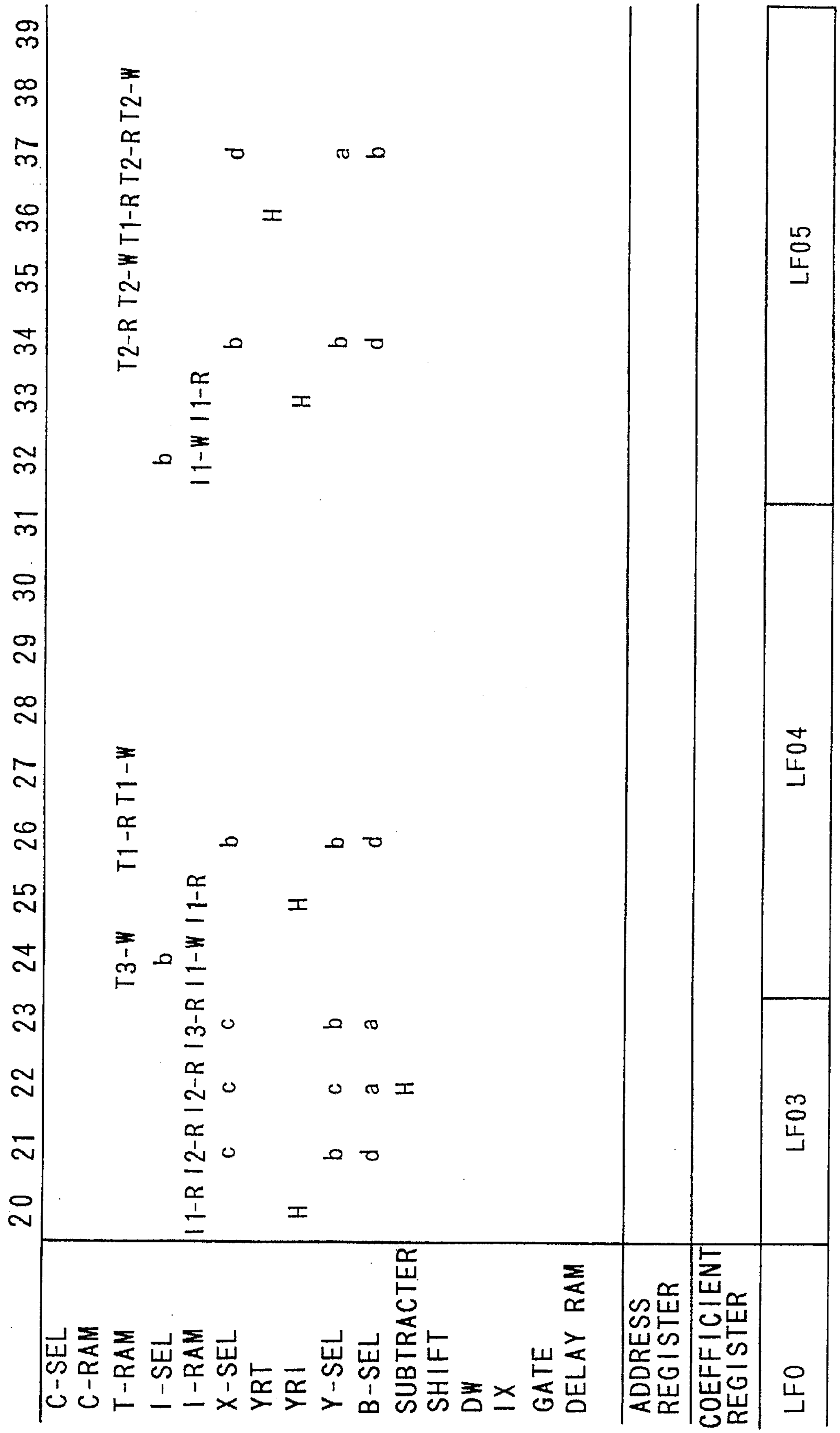

The above-mentioned chorus-effect imparting portion shown in FIG. 34 functions to impart the chorus effect to the musical tone data In accordance with effect programs, the examples of which are shown in FIGS. 36 to 38. In the aforementioned sound effect portion EF1, the sound-effect imparting operation is carried out during the duration between operational-step 0 to operational-step 55. In FIGS. 86 to 38, a term "C-SEL" corresponds to the selector 76 shown in FIG. 8; terms "C-RAM" and "T-RAM" respectively correspond to the temporary RAMs 63 and 62 shown in FIG. 8; a term "I-SEL" corresponds to the selector 58 shown in FIG. 8; and a term "I-RAM" corresponds to the temporary RAM 59 shown in FIG. 8.

Further, a term "X-SEL" corresponds to the selector 67 shown in FIG. 8; terms "YRT" and "YRI" respectively correspond to the latch circuits 65 and 64 shown in FIG. 8; terms "Y-SEL" and "B-SEL" respectively correspond to the selectors 66 and 69 shown in FIG. 8; and a term "subtracter" corresponds to the subtracter 72 shown in FIG. 8. In a row of "subtracter" shown in FIGS. 36 to 38, a letter "H" represents an operational step at which the subtraction is performed, while the addition is performed at the other operational steps. Moreover, a term "SHIFT" corresponds to the shifter 73 shown in FIG. 8; a term "DW" corresponds to the latch circuit 75 shown in FIG. 8; a term "IX" corresponds to the latch circuit 49; a term "GATE" corresponds to the gate 50 shown in FIG. 8; a term "DELAY RAM" corresponds to the delay RAM 48 shown in FIG. 8.

In a row of "ADDRESS REGISTER" shown in FIG. 36, a value "0" is written at a third operational step. This means that a data value "0" is outputted as the address data in the third operational step. In a row of "COEFFICIENT REGISTER" shown in FIG. 38, a term "K1" is written at a forty-seventh operational step. This means that coefficient data K1 is outputted at the forty-seventh operational step. In a row of "LFO DATA" shown in FIG. 36, a term "LFO1" is written from operational step 0 to operational step 7. This means that the aforementioned LFO waveform LFO1 is outputted as the LFO data.

Next, processings of the effect programs will be simply described by referring to FIGS. 8 and 36.

At operational step 0, the input terminal "a" of the selector 76 (see "C-SEL" in FIG. 36) is selected, so that the data outputted from the mixer 18 is written into the temporary RAM 63 (see "C-RAM" in FIG. 36).

At operational step 1, the data is read from a register C1 of the temporary RAM 63 (see "C-RAM"), while the input terminal "a" of the selector 67 (see "X-SEL") is selected, so that the read data is supplied to the second input terminal of the multiplier 68. On the other hand, the input terminal "c" of the selector 66 (see "Y-SEL") is selected, so that the data value "1" is supplied to the first input terminal of the multiplier 68. Thus, the above-mentioned data is multiplied by the data value "1" in the multiplier 68, whose result of multiplication is added with a data value "0" by the adder 71. In short, the musical tone data which is obtained in operational step 0 is directly outputted in operational step 1.

At operational step 2, a result of the addition performed by the adder 71 is delayed by the delay circuit 74; and then, the delayed data is temporarily stored in the latch circuit 75 (see "DW"). At the same time, the input terminal "b" of the selector 58 (see "I-SEL") is selected, so that the aforementioned decimal data of the LFO waveform LFO1, outputted from the LFO 45, is written into a register I1 of the temporary RAM 59 (see "I-RAM"). On the other hand, the aforementioned integral data of the LFO waveform LFO1, outputted from the LFO 45, is temporarily retained by the latch circuit 49 (see "IX").

At operational step 3, the data which is temporarily retained by the latch circuit 75 (see "DW") is written into the delay RAM 48 at its address 0.

Thereafter, the predetermined processings are performed until operational step 55, so that the chorus effect is eventually imparted to the musical tone data (in this case, the input data ID1).

According to the present embodiment as described heretofore, the sound source circuit 13 is configured such that a plurality of musical tone data, each of which is capable of representing one sound through four sounds, are provided for each of plural tone colors, and those musical tone data are stored in the tone-color data area 86*a* of the tone color memory 86, while each of the tone colors can be arbitrarily selected by the performer; further, the musical tone data outputted from plural tone-generation channels are supplied to the sound effect imparting apparatus 14 as the input data ID1 to ID4 in response to the tone color selected by the performer. Thus, in the sound effect imparting apparatus 14, a plurality of sound effects can be freely imparted to the input data ID1 to ID4 and the external input data GD1 and GD2 in response to the operations of the mouse 7. In this case, a desired line connection among plural sound effects can be arbitrarily determined, while a desired effect balance can be arbitrarily selected. In short, it is possible to raise a degree of freedom in the sound-effect imparting operation.

[D] Modifications

In the embodiment described before, the head address ROM 77 is referred by the CPU 1 when the sound effect which is designated by the performer in connection with each of the sound effects EF1 to EF5 is changed. However, the present invention is not limited to that embodiment. For example, the sound-effect operation portion 19 can be re-designed such that the head address is computed for each of the sound effects on the basis of the effect number and the like.

In the embodiment, all of the sound effect portions EF1 to EF5 are used when imparting the sound effects to the musical tone data. However, even when a part of the sound effect portions EF1 to EF5 is only used, the sound effect imparting apparatus 14 according to the embodiment can work well.

In the embodiment, a plurality of musical tone data are outputted from a plurality of tone-generation channels of the sound source circuit 13, so that those musical tone data are supplied to the sound effect imparting apparatus 14 as the input data ID1 to ID4 in response to their tone colors. The embodiment can be re-designed such that the performer can arbitrarily select one of the tone colors so as to supply the corresponding musical tone data to the sound effect imparting apparatus 14. Or, one musical tone data is divided into plural pieces each having a predetermined frequency band by use of filters, so that each piece of musical tone data is inputted into the sound effect imparting apparatus as its one input data.

Moreover, in the embodiment, the size of the program used for each of the sound effects EF1 to EF5 is fixed, while a limited number of sound effects are provided for each of the sound effects EF1 to EF5. For example, seven kinds of sound effects, containing the chorus effect and phaser effect, are provided for the sound effect EF1, so that the other sound effects cannot be selected for the sound effect EF1. The present invention is not limited to such system design. In other words, the size of the program used for each of the sound effects EF1 to EF5 is not fixed, so that any of desired sound effects can be used for each of the sound effects EF1 to EF5. For example, the reverberation effect is used for the sound effect EF1, while the chorus effect is used as the sound effect EF5.

Since the program size is fixed in the embodiment, the decoded value outputted from each of the decoder 55 (see FIG. 12), decoder 61 (see FIG. 13) and decoder 80 (see FIG. 15) must be determined responsive to the same fixed range of the count values as described before. However, in order to embody the above-mentioned arbitrary selection of the sound effects, the embodiment should be re-designed such that the range of the count values which is used to output the decoded value from each decoder can be changed in response to the program size arbitrarily selected for each sound effect. In the case of the decoder 55, the same decoded value is outputted as long as the 8-bit count value of the counter 54 belongs to each of the five ranges, i.e., the first range between 0 and 55, the second range between 56 and 111, the third range between 112 and 135, the fourth range between 136 and 159 and the fifth range between 160 and 255. However, when the reverberation effect is selected for the sound effect EF1, the decoder 55 is re-designed to output the same decoded value until the 8-bit count value of the counter 54 reaches "95".

Figure 29:
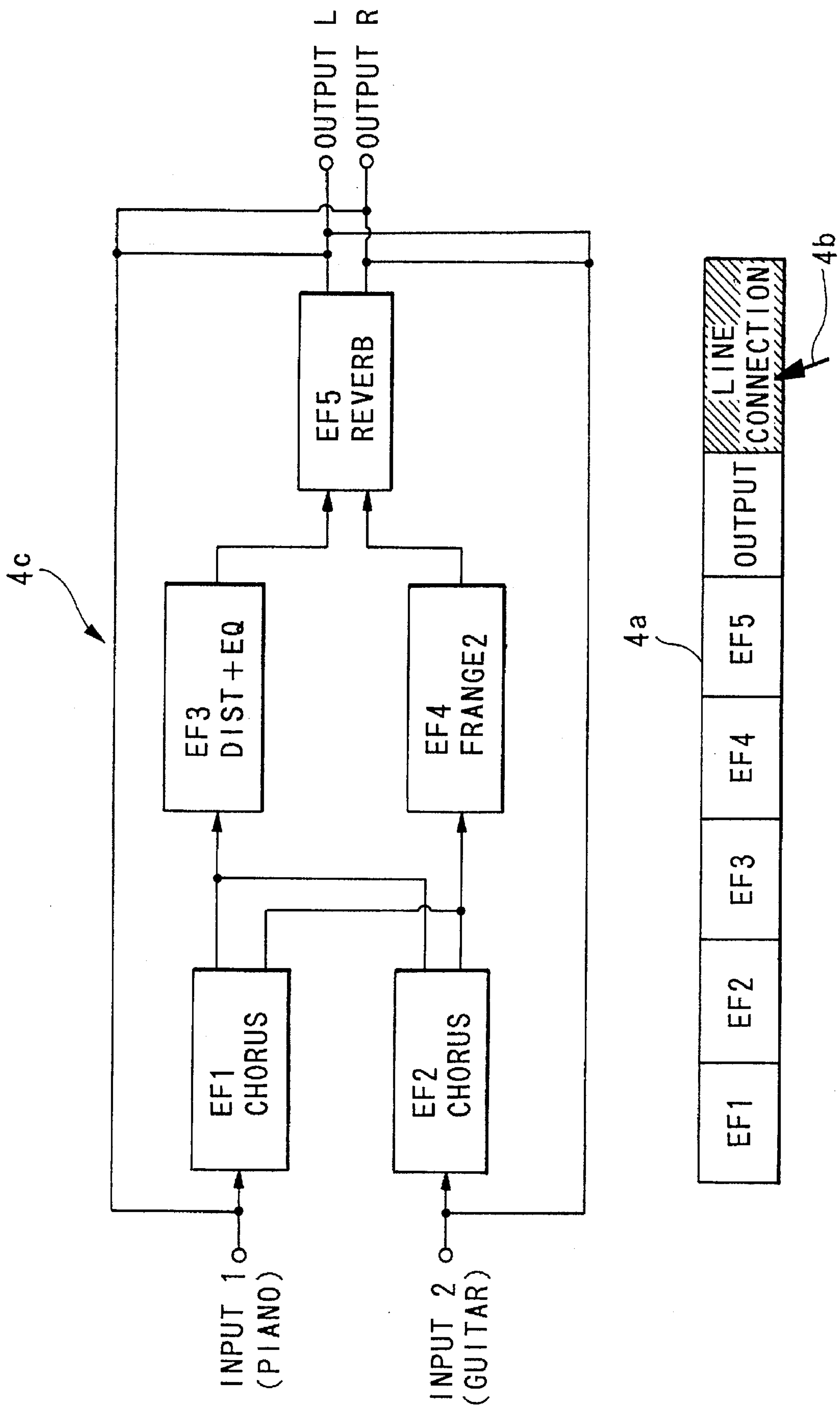
FIG. 29 shows an example of a graphic pattern which is used to conceptually display a line connection among predetermined sound effects selected in the sound effect imparting apparatus.

In the description of the embodiment, an operation of changing the line connection among the sound effects EF1 to EF5 is not described. However, such operation can be performed by editing the line connection, as shown in FIG. 29, by use of the mouse 7. More specifically, the line connection among the sound effects EF1 to EF5 can be changed by rewriting the switch data respectively stored in the tone color memory 86 and switch register 35 in response to the editing operation which is performed by use of the mouse 7.

Lastly, this Invention may be practiced or embodied in still other ways without departing from the spirit or essential character thereof as described heretofore. Therefore, the preferred embodiment described herein is illustrative and not restrictive, the scope of the invention being indicated by the appended claims and all variations which come within the meaning of the claims are intended to be embraced therein.

What is claimed is:

1. A sound effect imparting apparatus comprising:

program storing means for storing a plurality of programs each corresponding to each of sound effects to be imparted to musical tone data;

a plurality of program executing means for sequentially executing said programs so as to impart the sound effects to input data supplied thereto;

a plurality of mixing means, each of which is provided for each of said plurality of program executing means, said mixing means mixing said musical tone data, supplied from an external device, with designated one or designated some of a plurality of output data which are respectively outputted from said plurality of program executing means, thus producing mixed data, which is supplied to said program executing means as its input data; and mixing control means for designating one or some of said plurality of output data so that the designated one or designated some of said plurality of output data are supplied to each of said mixing means.

2. A sound effect imparting apparatus as defined in claim 1 further comprising:

a plurality of sound-effect selecting means for selecting a plurality of sound effects so that said programs corresponding to selected sound effects are read from said program storing means.

3. A sound effect imparting apparatus as defined in claim 2 further comprising:

an address designating means for designating an address for each of said programs corresponding to the selected sound effects, so that each of said programs corresponding to the selected sound effects is read from said program storing means at the address designated by said address designating means.

4. A sound effect imparting apparatus comprising:

program storing means for storing a plurality of programs each corresponding to each of sound effects to be imparted to musical tone data;

a plurality of program selecting means, each of which selects at least one of said plurality of programs stored in said program storing means by designating its address, so that a selected program is read from a selected address of said program storing means;

parameter supplying means for selectively outputting at least one of parameters in response to said program selected by said program selecting means; and a plurality of program executing means, each of which executes said program read from said program storing means so as to impart its corresponding sound effect to said musical tone data on the basis of the parameter supplied from said parameter supplying means, wherein at least two of said plurality of program selecting means can select the same program, while said parameter supplying means selectively outputs different parameters in response to said program selected by said at least two of said plurality of program selecting means respectively, and the selected same program is read from the same address of said program storing means whenever the same program is executed by one of the at least two of said plurality of program selecting means.

5. A sound effect imparting apparatus comprising:

a memory for storing a plurality of effect programs each corresponding to each of sound effects to be imparted to musical tones;

a plurality of pre-stage mixing portions for mixing input data thereof, containing musical tone data given from an external device, so as to produce mixed data;

a plurality of sound-effect imparting portions, each of which imparts a desired sound effect to said mixed data by carrying out arithmetic operations and/or logical operations in accordance with designated one of said effect programs, thus producing operation data;

a plurality of post-stage mixing portions, each of which mixes said mixed data and said operation data together so as to produce output data, said output data being supplied to each of said plurality of pre-stage mixing portions as its input data, whereby musical tones to which the sound effects are imparted are produced on the basis of said output data.

6. A sound effect imparting apparatus comprising:

program storing means for storing a plurality of programs each corresponding to each of sound effects to be imparted to musical tone data;

a plurality of program executing means for sequentially executing said programs so as to impart the sound effects to input data supplied thereto;

a plurality of mixing means, each of which is provided for each of said plurality of program executing means, said mixing means mixing said musical tone data, supplied from an external device, with designated one or designated some of a plurality of output data which are respectively outputted from said plurality of program executing means, thus producing mixed data, which is supplied to said program executing means as its input data;

line-connection setting means for setting a line connection representing a relationship among the sound effects which are respectively and sequentially imparted to said musical tone data; and mixing control means for designating one or some of said plurality of output data on the basis of said line connection set by said line-connection setting means, so that the designated one or designated some of said plurality of output data are supplied to each of said mixing means.

7. A sound effect imparting apparatus as defined in claim 6 further providing a display means which displays a graphic pattern corresponding to said line connection set by said line-connection setting means.

8. A sound effect imparting apparatus as defined in claim 1 or 6 wherein said program executing means and said mixing means work in a time-division manner in synchronism with each other.

9. A sound effect imparting apparatus comprising:

musical tone generating means for generating musical tone data;

a program memory for storing a plurality of programs each of which corresponds to one of a plurality of sound effects capable of being imparted to musical tone data;

a program executer for executing at least one of the plurality of the programs so as to impart at least one sound effect, corresponding to the at least one of the plurality of programs, to musical tone data supplied thereto to provide effect-imparted musical tone data;

input means for inputting audio input data from an external device; and a mixer, connected to the program executer and the input means, for selectively mixing the generated musical tone data from the musical tone generating means, the effect-imparted musical tone data from the program executer, and the audio input data inputted by the input means and providing a mixed result, wherein the program executer receives the mixed result as the musical tone data supplied thereto.

10. A sound effect imparting apparatus as defined in claim 9 further comprising:

a sound-effect selector that selects at least one of the plurality of sound effects so that at least one program corresponding to the selected at least one sound effect is read from the program memory.

11. A sound effect imparting apparatus as defined in claim 10 further comprising:

an address designator that designates an address for the at least one program corresponding to the selected at least one sound effect, so that the at least one program is read from the program memory at the address designated by the address designator.

12. A sound effect imparting apparatus comprising:

musical tone generating means for generating musical tone data;

a program memory for storing a plurality of programs each of which corresponds to one of a plurality of sound effects capable of being imparted to musical tone data;

a plurality of program executers for executing at least one of the plurality of the programs so as to impart at least one sound effect, corresponding to the respective executed one of the plurality of programs, to musical tone data supplied thereto to provide effect-imparted musical tone data;

sound input means for inputting sound input data from an external device; and a controller, connected to the plurality of program executers and the sound input means, for providing at least one of the plurality of program executers with the sound input data from the sound input means, the generated musical tone data from the musical tone generating means and the effect-imparted musical tone data as the musical tone data supplied thereto.

13. A sound effect imparting apparatus as defined in claim 12 further comprising:

a musical tone data provider that provides musical tone data;

a mixer that mixes musical tone data provided by the musical tone data provider and the musical tone input data inputted by the input and that provides at least one of the plurality of program executers with the mixed result as musical tone data; and a generator that generates musical tone signals based on the mixed result provided by the mixer.

14. A sound effect imparting apparatus as defined in claim 13 wherein the mixer mixes musical tone data having a sound effect imparted by a program executer, the musical tone data provided by the musical tone data provider and the musical tone input data inputted by the input and provides at least one of the plurality of program executers with the mixed result as musical tone data supplied thereto.

15. A sound effect imparting apparatus comprising:

program memory that stores a plurality of programs each of which corresponds to one of a plurality of sound effects capable of being imparted to musical tone data;

a plurality of program executers each of which is able to execute one of the plurality of programs so as to impart a sound effect, corresponding to the one program, to musical tone data supplied thereto and is able to output the musical tone data having the imparted sound effect;

a plurality of mixers connectable to the plurality of program executers, each of which mixes musical tone data with at least one of the musical tone data outputted by the plurality of program executers, wherein the mixed result is supplied to the plurality of program executers as the musical tone data;

line-connection setting device that sets a line connection representing a relationship among the sound effects which the plurality of program executers impart to musical tone data; and mixing controller that designates at least one of the musical tone data outputted by the plurality of program executers on the basis of the line connection set by the line-connection setting device, so that the designated at least one of the musical tone data are supplied to the plurality of mixers.

16. A sound effect imparting apparatus as defined in claim 15 further comprising:

a display which displays a graphic pattern corresponding to the line connection set by the line-connection setting device.

17. A sound effect imparting apparatus as defined in claim 15 wherein the plurality of program executers and the plurality of mixers each work in a time division manner in synchronization with each other.

18. A sound effect imparting apparatus as defined in claim 15 further comprising:

an input that inputs musical tone input data from an external device, wherein the mixing controller controls the plurality of mixers so that the musical tone input data is mixed with the musical tone data outputted by the plurality of program executers and the mixed result is supplied to at least one of the plurality of program executers.

19. A sound effect imparting apparatus comprising:

musical tone generating means for generating a musical tone signal;

effect imparting means for imparting an effect to a musical tone signal supplied thereto to provide an effect-imparted musical tone signal;

external sound signal supplying means for supplying an external sound signal indicative of an external sound; and mixer means for mixing the generated musical tone signal, the effect-imparted musical tone signal and the external sound signal in a selective manner to provide the effect imparting means with mixed signals as the musical tone signal supplied thereto.

20. A sound effect imparting apparatus as defined in claim 19, further comprising:

a program memory for storing a plurality of programs each of which corresponds to one of a plurality of sound effects capable of being imparted to musical tone data;

a sound-effect selector for selecting at least one of the plurality of sound effects so that at least one program of said plurality of programs corresponding to the selected at least one sound effect is read from the program memory.

21. A sound effect imparting apparatus as defined in claim 20, further comprising:

a plurality of program executers each of which executes one of the plurality of programs so as to impart a sound effect, corresponding to the respective program, to an output of said mixer means.

22. A sound effect imparting apparatus as defined in claim 21, wherein said output of said mixer means comprises a musical tone signal to be converted to a musical tone.

* * * * *